(12) United States Patent
Huang et al.

(10) Patent No.: US 11,847,964 B2
(45) Date of Patent: Dec. 19, 2023

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yao Huang, Beijing (CN); Weiyun Huang, Beijing (CN); Yue Long, Beijing (CN); Yudiao Cheng, Beijing (CN)

(73) Assignees: CHENGDU 03;BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/789,007

(22) PCT Filed: Mar. 12, 2021

(86) PCT No.: PCT/CN2021/080494
§ 371 (c)(1),
(2) Date: Jun. 24, 2022

(87) PCT Pub. No.: WO2022/068152
PCT Pub. Date: Apr. 7, 2022

(65) Prior Publication Data
US 2023/0051046 A1 Feb. 16, 2023

(30) Foreign Application Priority Data
Sep. 30, 2020 (WO) ................ PCT/CN2020/119673

(51) Int. Cl.
*G09G 3/3225* (2016.01)
*G09G 3/3275* (2016.01)
(Continued)

(52) U.S. Cl.
CPC ......... *G09G 3/3225* (2013.01); *G09G 3/3233* (2013.01); *G09G 3/3275* (2013.01);
(Continued)

(58) Field of Classification Search
CPC ......... G09G 3/3225; G09G 2300/0452; G09G 2300/0426; G09G 2300/0413;
(Continued)

(56) References Cited

U.S. PATENT DOCUMENTS 10,733,931 B2 * 8/2020 Jung ..................... H10K 59/00
10,756,136 B1 8/2020 Ma et al.
(Continued)

FOREIGN PATENT DOCUMENTS

CN 107610635 A 1/2018
CN 107610645 A 1/2018
(Continued)

OTHER PUBLICATIONS

Non-final Office Action for related U.S. Appl. No. 17/609,878, dated Apr. 11, 2023.
(Continued)

*Primary Examiner* — Koosha Sharifi-Tafreshi
(74) *Attorney, Agent, or Firm* — Leason Ellis LLP

(57) ABSTRACT

Provided are a display panel and a display device. The display panel includes: a base substrate; light-emitting elements including groups of light-emitting elements, at least one group of light-emitting elements including first-region light-emitting elements and second-region light-emitting elements; pixel circuits including groups of pixel circuits, at least one group of pixel circuits including first-type pixel circuits and second-type pixel circuits, at least one second-type pixel circuit is connected with at least one second-region light-emitting element through a conductive line, first light-emitting elements are connected with first pixel circuits
(Continued)

through first conductive lines, in the at least one group of light-emitting elements and the at least one group of pixel circuits, first pixel circuits connected with first light-emitting elements are closer to the second display region than each of second pixel circuits connected with second light-emitting elements.

20 Claims, 28 Drawing Sheets

(51) Int. Cl.
    *H10K 50/86*     (2023.01)
    *H10K 59/65*     (2023.01)
    *H10K 59/121*     (2023.01)
    *H10K 59/131*     (2023.01)
    *H10K 71/00*     (2023.01)
    *G09G 3/3233*     (2016.01)
    *H10K 59/12*     (2023.01)
    *H10K 59/35*     (2023.01)

(52) U.S. Cl.
    CPC ......... *H10K 50/865* (2023.02); *H10K 59/121* (2023.02); *H10K 59/1213* (2023.02); *H10K 59/1216* (2023.02); *H10K 59/131* (2023.02); *H10K 59/65* (2023.02); *H10K 71/00* (2023.02); *G09G 2300/0413* (2013.01); *G09G 2300/0426* (2013.01); *G09G 2300/0819* (2013.01); *G09G 2300/0842* (2013.01); *G09G 2310/0272* (2013.01); *G09G 2310/08* (2013.01); *H10K 59/1201* (2023.02); *H10K 59/353* (2023.02)

(58) Field of Classification Search
    CPC ... G09G 2300/0443; G09G 2300/0439; G09G 2300/0447; G09G 2340/0407; H10K 59/121; H10K 59/65; H04N 23/55; H04N 7/144; G06F 1/1686; H04M 1/0264
    See application file for complete search history.

(56) References Cited

U.S. PATENT DOCUMENTS

| | | | |
|---|---|---|---|
| 10,854,124 B2 | 12/2020 | Yang et al. | |
| 11,074,856 B2 | 7/2021 | Zhao et al. | |
| 11,114,032 B2 | 9/2021 | Bian | |
| 11,183,544 B2 | 11/2021 | Zhang | |
| 11,227,538 B2 | 1/2022 | Yang et al. | |
| 2009/0179838 A1 | 7/2009 | Yamashita et al. | |
| 2019/0004354 A1 | 1/2019 | Hsiao | |
| 2020/0052048 A1* | 2/2020 | Kuo | G06F 1/1605 |
| 2021/0090501 A1 | 3/2021 | Wu et al. | |
| 2021/0351255 A1 | 11/2021 | Chang et al. | |
| 2022/0069047 A1 | 3/2022 | Yang et al. | |
| 2022/0093038 A1 | 3/2022 | Yang et al. | |
| 2022/0093682 A1 | 3/2022 | Chang et al. | |
| 2022/0189394 A1 | 6/2022 | Yang | |
| 2022/0199710 A1 | 6/2022 | Xu et al. | |
| 2022/0285470 A1 | 9/2022 | Qiu et al. | |
| 2022/0293692 A1 | 9/2022 | Xu et al. | |

FOREIGN PATENT DOCUMENTS

| | | |
|---|---|---|
| CN | 108365123 A | 8/2018 |
| CN | 109904214 A | 6/2019 |
| CN | 109950288 A | 6/2019 |
| CN | 110061014 A | 7/2019 |
| CN | 110232892 A | 9/2019 |
| CN | 110265455 A | 9/2019 |
| CN | 110459175 A | 11/2019 |
| CN | 110767681 A | 2/2020 |
| CN | 110874990 A | 3/2020 |
| CN | 110890026 A | 3/2020 |
| CN | 110969982 A | 4/2020 |
| CN | 111180494 A | 5/2020 |
| CN | 210515985 U | 5/2020 |
| CN | 111261677 A | 6/2020 |
| CN | 111261684 A | 6/2020 |
| CN | 111402743 A | 7/2020 |
| CN | 111446282 A | 7/2020 |
| CN | 111508377 A | 8/2020 |
| CN | 111710276 A | 9/2020 |
| CN | 111725287 A | 9/2020 |
| CN | 111785761 A | 10/2020 |
| CN | 111916486 A | 11/2020 |
| CN | 112186021 A | 1/2021 |
| CN | 112542121 A | 3/2021 |
| CN | 113053981 A | 6/2021 |
| CN | 113517324 A | 10/2021 |
| EP | 3 176 772 A1 | 6/2017 |
| JP | 2020038758 A | 3/2020 |
| WO | 2021/147987 A1 | 7/2021 |

OTHER PUBLICATIONS

Non-final Office Action for related U.S. Appl. No. 17/433,292, dated Feb. 17, 2023.

* cited by examiner

DISPLAY PANEL AND DISPLAY DEVICE

CROSS-REFERENCE TO RELATED APPLICATIONS

This patent application is a U.S. National Phase Entry of International Application No. PCT/CN2021/080494 filed on Mar. 12, 2021, which claims priority to the PCT Patent Application No. PCT/CN2020/119673 filed on Sep. 30, 2020, the disclosure of which are incorporated herein by reference in their entirety as part of the embodiment of the present disclosure.

TECHNICAL FIELD

At least one embodiment of the present disclosure relates to a display panel and a display device.

BACKGROUND

With the continuous development of display technology, active-matrix organic light-emitting diode (AMOLED) display technology has been more and more used in mobile phones, tablet computers, digital cameras and other display devices due to its advantages such as self-luminescence, wide viewing angle, high contrast, low power consumption, and high response speed, and the like.

An under-screen camera technology is a brand-new technology proposed to increase the screen-to-body ratio of a display device.

SUMMARY

At least one embodiment of the present disclosure provides a display panel and a display device.

At least one embodiment of the present disclosure provides a display panel, including: a base substrate, having a first display region and a second display region, the first display region being located on at least one side of the second display region; a plurality of light-emitting elements, located in the first display region and the second display region, the plurality of light-emitting elements including a plurality of groups of light-emitting elements, light-emitting elements in each group of the plurality of groups of light-emitting elements being arranged in a first direction, the plurality of groups of light-emitting elements being arranged in a second direction, at least one group of the plurality of groups of light-emitting elements including a plurality of first-region light-emitting elements and a plurality of second-region light-emitting elements, the plurality of first-region light-emitting elements being located in the first display region, and the plurality of second-region light-emitting elements being located in the second display region; a plurality of pixel circuits, located in the first display region, the plurality of pixel circuits including a plurality of groups of pixel circuits, pixel circuits in each group of the plurality of groups of pixel circuits being arranged in the first direction, the plurality of groups of pixel circuits being arranged in the second direction, at least one group of the plurality of groups of pixel circuits including a plurality of first-type pixel circuits and a plurality of second-type pixel circuits, and the plurality of second-type pixel circuits being distributed at intervals among the plurality of first-type pixel circuits; at least one first-type pixel circuit among the plurality of first-type pixel circuits is connected with at least one first-region light-emitting element among the plurality of first-region light-emitting elements, an orthographic projection of the at least one first-type pixel circuit on the base substrate at least partially overlaps with an orthographic projection of the at least one first-region light-emitting element on the base substrate, and at least one second-type pixel circuit among the plurality of second-type pixel circuits is connected with at least one second-region light-emitting element among the plurality of second-region light-emitting elements through a conductive line, the plurality of second-region light-emitting elements include a plurality of first light-emitting elements and a plurality of second light-emitting elements, the first light-emitting element is configured to emit light of a first color, and the second light-emitting element is configured to emit light of a second color, the plurality of second-type pixel circuits include a plurality of first pixel circuits and a plurality of second pixel circuits, the conductive line includes a plurality of first conductive lines and a plurality of second conductive lines, the plurality of first light-emitting elements are connected with the plurality of first pixel circuits through the plurality of first conductive lines, and the plurality of second light-emitting elements are connected with the plurality of second pixel circuits through the plurality of second conductive lines, in the at least one group of light-emitting elements and the at least one group of pixel circuits, the plurality of first pixel circuits connected with the plurality of first light-emitting elements are closer to the second display region than each of the plurality of second pixel circuits connected with the plurality of second light-emitting elements.

For example, in the at least one group of light-emitting elements and the at least one group of pixel circuits, no other second-type pixel circuit is provided between two first pixel circuits connected with two adjacent first conductive lines.

For example, one end of the conductive line is connected with the second-region light-emitting element, and the other end of the conductive line is connected with the second-type pixel circuit through a connecting element.

For example, in the at least one group of light-emitting elements and the at least one group of pixel circuits, at least one of the plurality of first-type pixel circuits is arranged between two adjacent second-type pixel circuits.

For example, in the at least one group of light-emitting elements and the at least one group of pixel circuits, the plurality of first pixel circuits connected with the plurality of first light-emitting elements are arranged at intervals among the plurality of first-type pixel circuits, and the plurality of second pixel circuits connected with the plurality of second conductive lines are arranged at intervals among the plurality of first-type pixel circuits.

For example, an orthographic projection of a portion extending in the first direction of one first conductive line of the plurality of first conductive lines on the base substrate at least partially overlaps with an orthographic projection of a portion extending in the first direction of another first conductive line located in a different layer from the first conductive line on the base substrate, or an orthographic projection of a portion extending in the first direction of one first conductive line of the plurality of first conductive lines on the base substrate at least partially overlaps with an orthographic projection of a portion extending in the first direction of one fourth conductive line of the plurality of fourth conductive lines located in a different layer from the first conductive line on the base substrate.

For example, the plurality of second-region light-emitting elements further include a plurality of third light-emitting elements, each of the plurality of third light-emitting elements is configured to emit light of a third color, the plurality of second-type pixel circuits further include a plurality of third pixel circuits, the conductive line further includes a plurality of third conductive lines, and the plurality of third light-emitting elements are connected with the plurality of third pixel circuits through the plurality of third conductive lines, in the at least one group of light-emitting elements and the at least one group of pixel circuits, the plurality of first pixel circuits connected with the plurality of first conductive lines are closer to the second display region than each of the plurality of third pixel circuits connected with the plurality of third conductive lines.

For example, in the at least one group of light-emitting elements and the at least one group of pixel circuits, the plurality of second pixel circuits connected with the plurality of second conductive lines and the plurality of third pixel circuits connected with the plurality of third conductive lines are alternately arranged.

For example, the plurality of second-region light-emitting elements further include a plurality of fourth light-emitting elements, each of the plurality of fourth light-emitting elements are configured to emit light of a fourth color, the plurality of second-type pixel circuits further include a plurality of fourth pixel circuits, the conductive line further includes a plurality of fourth conductive lines, and the plurality of fourth light-emitting elements are connected with the plurality of fourth pixel circuits through the plurality of fourth conductive lines, in the at least one group of light-emitting elements and the at least one group of pixel circuits, the plurality of fourth pixel circuits connected with the plurality of fourth conductive lines are closer to the second display region than each of the plurality of second pixel circuits connected with the plurality of second conductive lines.

For example, the plurality of fourth pixel circuits connected with the plurality of fourth conductive lines and the plurality of first pixel circuits connected with the plurality of first conductive lines are alternately arranged.

For example, an orthographic projection of a portion extending in the first direction of one second conductive line of the plurality of second conductive lines on the base substrate at least partially overlaps with an orthographic projection of a portion extending in the first direction of one third conductive line of the plurality of third conductive lines located in a different layer from the second conductive line on the base substrate.

For example, at least one group of the plurality of groups of light-emitting elements includes a first sub-group of light-emitting elements, a second sub-group of light-emitting elements, and a third sub-group of light-emitting elements that are sequentially arranged in the first direction, at least one group of the plurality of groups of pixel circuits includes a first sub-group of pixel circuits to a seventh sub-group of pixel circuits that are sequentially arranged in the first direction, and the seventh sub-group of pixel circuits is closer to the second display region than the first sub-group of pixel circuits; the conductive lines connected with the first sub-group of light-emitting elements are located in a third pattern layer, the conductive lines connected with the second sub-group of light-emitting elements are located in a second pattern layer, the conductive lines connected with the third sub-group of light-emitting elements include the conductive line located in a first pattern layer and also includes the conductive line formed in segments, and the conductive line formed in segments includes a first conductive portion located in the first pattern layer and a second conductive portion located in the second pattern layer, the second light-emitting element and the third light-emitting element that are in the first sub-group of light-emitting elements are connected with the second sub-group of pixel circuits, the second light-emitting element and the third light-emitting element that are in the second sub-group of light-emitting elements are connected with the first sub-group of pixel circuits, the second light-emitting element and the third light-emitting element that are in the third sub-group of light-emitting elements and close to the second sub-group of light-emitting elements are connected with the fourth sub-group of pixel circuits, the second light-emitting element and the third light-emitting element that are in the third sub-group of light-emitting elements and away from the second sub-group of light-emitting elements are connected with the fifth sub-group of pixel circuits, the first light-emitting element and the fourth light-emitting element that are in the first sub-group of light-emitting elements are connected with the seventh sub-group of pixel circuits, the first light-emitting element and the fourth light-emitting element that are in the second sub-group of light-emitting elements are connected with the sixth sub-group of pixel circuits, and the first light-emitting element and the fourth light-emitting element that are in the third sub-group of light-emitting elements are connected with the third sub-group of pixel circuits.

For example, an orthographic projection of a portion extending in the first direction of the second conductive line on the base substrate at least partially overlaps with an orthographic projection of a portion extending in the first direction of the third conductive line located in a different layer from the second conductive line on the base substrate.

For example, a portion extending in the first direction of the conductive line connected with the second sub-group of light-emitting elements does not overlap with a portion extending in the first direction of other conductive line.

For example, a portion extending in the first direction of the conductive line connected with the second sub-group of pixel circuits overlaps with a portion extending in the first direction of the conductive line connected with the fourth sub-group of pixel circuits, a portion extending in the first direction of the conductive line connected with the first sub-group of pixel circuits does not overlap with a portion extending in the first direction of the conductive line connected with the second sub-group of pixel circuits, and does not overlap with a portion extending in the first direction of the conductive line connected with the fourth sub-group of pixel circuits.

For example, the fourth light-emitting element and the first light-emitting element are configured to emit light of a same color.

For example, the fourth light-emitting element and the first light-emitting element are configured to emit green light, one of the second light-emitting element and the third light-emitting element is configured to emit red light, and the other of the second light-emitting element and the third light-emitting element is configured to emit blue light.

For example, at least one selected from the group consisting of one of the plurality of first conductive lines, one of the plurality of second conductive lines, one of the plurality of third conductive lines, and one of the plurality of fourth conductive lines is one integral conductive line, or is conductive portions located in different layers.

For example, at least one selected from the group consisting of the first conductive line, the second conductive line, the third conductive line, and the fourth conductive line is made of a transparent conductive material.

For example, the second display region has a symmetrical shape, and has a first symmetry axis extending in the first direction and a second symmetry axis extending in the second direction, and a plurality of conductive lines are provided, and the plurality of conductive lines are symmetrical with respect to the first symmetry axis and are symmetrical with respect to the second symmetry axis.

For example, the plurality of second-region light-emitting elements are symmetrical with respect to the first symmetry axis and are symmetrical with respect to the second symmetry axis.

For example, the first display region includes an auxiliary region, the plurality of second-type pixel circuits are located in the auxiliary region, an area of the auxiliary region is less than an area of a region of the first display region excluding the auxiliary region.

For example, a size of the first-type pixel circuit in the first direction is less than a size of the first-region light-emitting element in the first direction.

For example, in the auxiliary region, an orthographic projection of the conductive line on the base substrate partially overlaps with an orthographic projection of the first-type pixel circuit on the base substrate.

For example, a light emission area of the first-region light-emitting element is greater than a light emission area of the second-region light-emitting element, the second display region includes a light-transmitting region, a resolution of the first display region is the same as a resolution of the second display region, and a density of the plurality of first-region light-emitting elements is the same as a density of the plurality of second-region light-emitting elements.

For example, the pixel circuit includes a driving transistor and a reset transistor, the display panel further includes a reset control signal line, a gate electrode of the reset transistor is connected with the reset control signal line, a first electrode of the reset transistor is connected with an initialization signal line, a second electrode of the reset transistor is connected with a first electrode of the light-emitting element, the initialization signal line is configured to supply a constant voltage, and the constant voltage is greater than or equal to −2 V.

At least one embodiment of the present disclosure further provides a display device, including any one of the display panels as described above.

For example, the display device further includes a photosensitive sensor, the photosensitive sensor is located on a side of the display panel.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not construed as any limitation to the present disclosure.

DETAILED DESCRIPTION

Figure 1A:
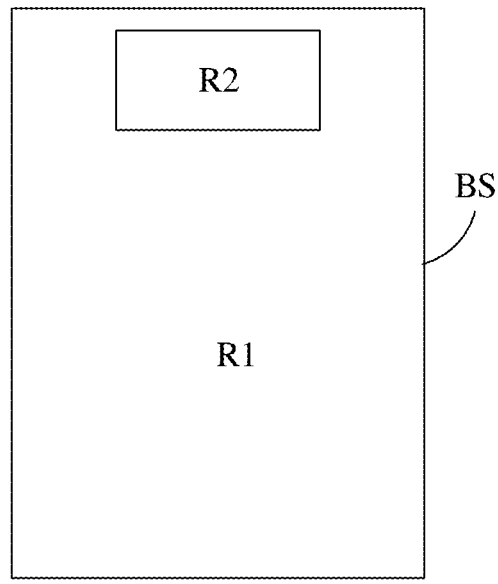
FIG. 1A is a schematic structural diagram of a display panel provided by an embodiment of the present disclosure.

In order to make objectives, technical details, and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

With development of a display technology, the existing notch screen or waterdrop screen design gradually cannot meet users' demand for a high screen-to-body ratio of a display panel, and a series of display panels having a light-transmitting display region have emerged as times require. In such type of display panel, a device such as a photosensitive sensor (e.g., a camera) may be provided in the light-transmitting display region; because there is no need to punch a hole, it is possible to realize a true full screen under the premise of ensuring practicability of the display panel.

In a related art, a display panel with an under-screen camera generally includes a first display region for normal display and a second display region for providing a camera. The second display region generally includes: a plurality of light-emitting elements and a plurality of pixel circuits. Each pixel circuit is connected with a light-emitting element and used to drive the light-emitting element to emit light, and the pixel circuit and the light-emitting element connected with each other overlap with each other in a direction perpendicular to the display panel.

Because the second display region in the related art is further provided with pixel circuits, light transmittance of the second display region is poor, and accordingly, a display effect of the display panel is poor.

FIG. 1A is a schematic structural diagram of a display panel provided by an embodiment of the present disclosure.

Figure 1B:
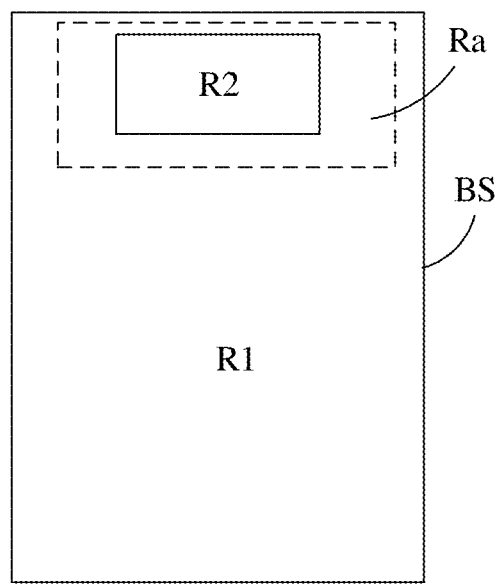
FIG. 1B is a schematic structural diagram of a display panel provided by an embodiment of the present disclosure.

FIG. 1B is a schematic structural diagram of a display panel provided by an embodiment of the present disclosure. As illustrated in FIG. 1A and FIG. 1B, the display panel may include: a base substrate BS. The display panel includes a first display region R1 and a second display region R2; and the first display region R1 may be located on at least one side of the second display region R2. For example, in some embodiments, the first display region R1 surrounds the second display region R2. That is, the second display region R2 may be surrounded by the first display region RE The second display region R2 may also be arranged in other positions; and the arrangement position of the second display region R2 may be determined as needed. For example, the second display region R2 may be located in a top middle position of the base substrate BS, or may also be located in an upper left corner position or an upper right corner position of the base substrate BS. For example, a device such as a photosensitive sensor (e.g., a camera) is provided in the second display region R2 of the display panel. For example, the second display region R2 is a light-transmitting display region; and the first display region R1 is a display region. For example, the first display region R1 is opaque and only used for display. FIG. 1B illustrates that the first display region R1 includes an auxiliary region Ra.

Figure 2:
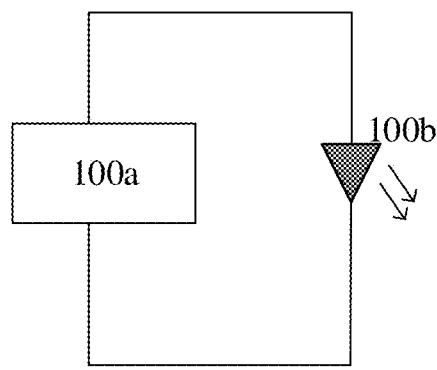
FIG. 2 is a schematic diagram of a pixel unit of a display panel provided by an embodiment of the present disclosure.

FIG. 2 is a schematic diagram of a pixel unit of a display panel provided by an embodiment of the present disclosure. The display panel includes a pixel unit 100; and the pixel unit 100 is located on a base substrate. As illustrated in FIG. 2, the pixel unit 100 includes a pixel circuit 100a and a light-emitting element 100b; and the pixel circuit 100a is configured to drive the light-emitting element 100b. For example, the pixel circuit 100a is configured to supply a driving current to drive the light-emitting element 100b to emit light. For example, the light-emitting element 100b is an Organic Light-Emitting Diode (OLED); and the light-emitting element 100b emits red light, green light, blue light, or white light, etc., under the driving of a pixel circuit 100a corresponding thereto. A light-emitting color of the light-emitting element 100b may be determined as needed.

In order to increase light transmittance of the second display region R2, the second display region R2 may be provided with only light-emitting elements, while the pixel circuits for driving the light-emitting elements of the second display region R2 may be provided in the first display region RE That is, the light transmittance of the second display region R2 is increased by separately arranging the light-emitting element and the pixel circuit. That is, the second display region R2 is not provided with the pixel circuit 100a.

Figure 3:
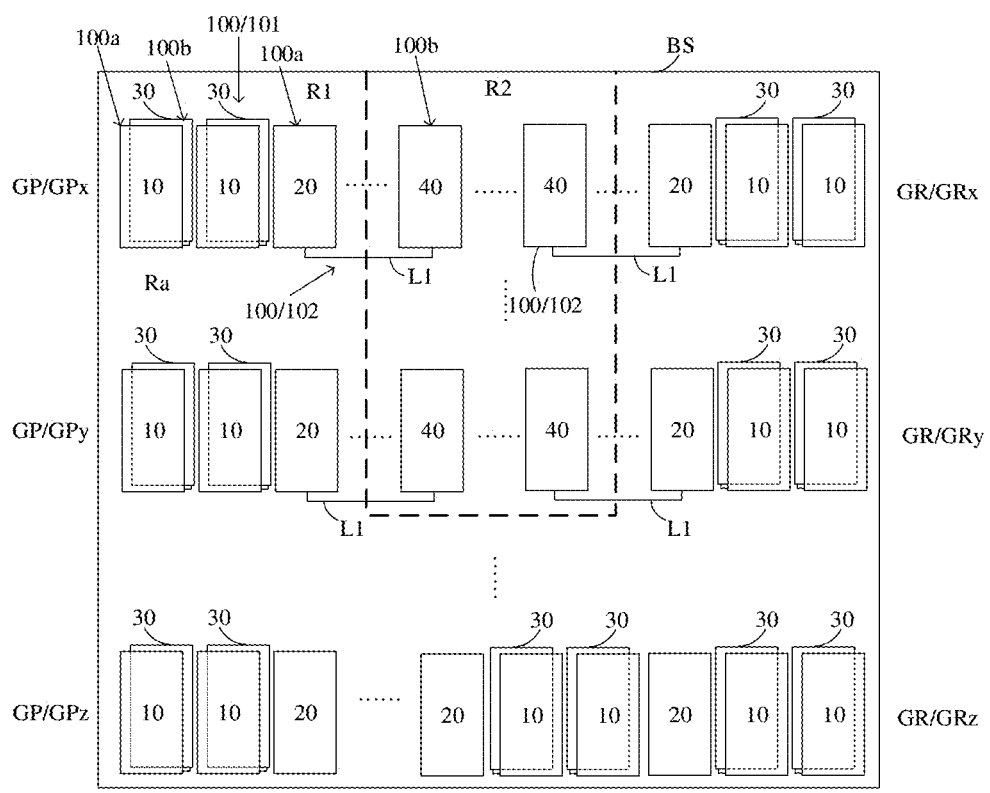
FIG. 3 is a schematic diagram of a display panel provided by an embodiment of the present disclosure.

FIG. 3 is a schematic diagram of a display panel provided by an embodiment of the present disclosure. As illustrated in FIG. 3, the display panel includes: a plurality of first-type pixel circuits 10, a plurality of second-type pixel circuits 20, and a plurality of first-region light-emitting elements 30 that are located in a first display region R1; as well as a plurality of second-region light-emitting elements 40 located in a second display region R2. For example, the plurality of second-type pixel circuits 20 may be distributed at intervals among the plurality of first-type pixel circuits 10.

For example, as illustrated in FIG. 3, at least one first-type pixel circuit 10 among the plurality of first-type pixel circuits 10 may be connected with at least one first-region light-emitting element 30 among the plurality of first-region light-emitting elements 30; and an orthographic projection of the at least one first-type pixel circuit 10 on the base substrate BS may at least partially overlap with an orthographic projection of the at least one first-region light-emitting element 30 on the base substrate BS. The at least one first-type pixel circuit 10 may be used to supply a drive signal to the first-region light-emitting element 30 connected therewith, to drive the first-region light-emitting element 30 to emit light.

For example, as illustrated in FIG. 3, at least one second-type pixel circuit 20 among the plurality of second-type pixel circuits 20 may be connected with at least one second-region light-emitting element 40 among the plurality of second-region light-emitting elements 40 through a conductive line L1; and the at least one second-type pixel circuit 20 may be used to supply a drive signal to the second-region light-emitting element 40 connected therewith, to drive the second-region light-emitting element 40 to emit light. As illustrated in FIG. 3, because the second-region light-emitting element 40 and the second-type pixel circuit 20 are located in different regions, there is no overlapping portion between an orthographic projection of at least one second-type pixel circuit 20 on the base substrate BS and an orthographic projection of at least one second-region light-emitting element 40 on the base substrate BS.

For example, in the embodiment of the present disclosure, the first display region R1 may be set as a non-transmitting display region; and the second display region R2 may be set as a transmitting display region. For example, the first display region R1 cannot transmit light; and the second display region R2 can transmit light. In this way, the display panel provided by the embodiment of the present disclosure may have the required device structure such as the photosensitive sensor directly arranged in a position corresponding to the second display region R2 on a side of the display panel, without performing digging process on the display panel to form a hole, which lays a solid foundation for implementing a true full screen. In addition, because the second display region R2 only includes light-emitting elements and does not include pixel circuits, it is favorable for increasing light transmittance of the second display region R2, so that the display panel has a better display effect.

As illustrated in FIG. 3, the pixel unit 100 includes a first pixel unit 101 and a second pixel unit 102; the pixel circuit 100*a* and the light-emitting element 100*b* of the first pixel unit 101 are both located in the first display region R1; the pixel circuit 100*a* of the second pixel unit 101 is located in the first display region R1; and the light-emitting element 100*b* of the second pixel unit 102 is located in the second display region R2. In the embodiment of the present disclosure, the pixel circuit 100*a* of the first pixel unit 101 is the first-type pixel circuit 10; the light-emitting element 100*b* of the first pixel unit 101 is the first-region light-emitting element 30; the pixel circuit 100*a* of the second pixel unit 101 is the second-type pixel circuit 20; and the light-emitting element 100*b* of the second pixel unit 102 is the second-region light-emitting element 40. For example, the first-region light-emitting element 30 may be referred to as an in-situ light-emitting element. For example, the first-type pixel circuit 10 may be referred to as an in-situ pixel circuit; and the second-type pixel circuit 20 may be referred to as an ex-situ pixel circuit.

For example, as illustrated in FIG. 3, the second-region light-emitting element 40 and the second-type pixel circuit 20 connected with the second-region light-emitting element 40 are located in a same row. That is, light-emitting signals of the second-region light-emitting elements 40 come from second-type pixel circuit in a same row. For example, pixel circuits of pixel units in a same row are connected with a same gate line.

As illustrated in FIG. 3, the pixel circuit (the second-type pixel circuit 20) of the second pixel unit 102 is connected with the light-emitting element (the second-region light-emitting element 40) of the second pixel unit 102 through a conductive line L1. For example, the conductive line L1 is made of a transparent conductive material. For example, the conductive line L1 is made of a conductive oxide material. For example, the conductive oxide material includes, but is not limited to, Indium Tin Oxide (ITO).

As illustrated in FIG. 3, one end of the conductive line L1 is connected with the second-type pixel circuit 20; and the other end of the conductive line L1 is connected with the second-region light-emitting element 40. As illustrated in FIG. 3, the conductive line L1 extends from the first display region R1 to the second display region R2.

As illustrated in FIG. 1B and FIG. 3, in some embodiments, the first display region R1 may include an auxiliary region Ra; and the auxiliary region Ra may be provided with the second-type pixel circuit 20 connected with the second-region light-emitting element 40. For example, in a region of the first display region R1 excluding the auxiliary region Ra, a plurality of dummy pixel circuits may be provided. The dummy pixel circuit is not connected with any light-emitting element. Providing the dummy pixel circuit is favorable for improving uniformity of components of respective film layers in an etching process. For example, the dummy pixel circuit has a same structure as the second-type pixel circuit 20 in a row or a column where it is located, except that it is not connected with any light-emitting element. For example, in the first display region R1, the auxiliary region Ra and the region of the first display region R1 excluding the auxiliary region Ra (non-auxiliary region) have same pixel density, or same resolution, but it is not limited thereto.

FIG. 3 illustrates three rows of light-emitting elements 100*b*. A first row of light-emitting elements 100*b* illustrated in FIG. 3 passes through the first display region R1 and the second display region R2, and is a row of light-emitting elements 100*b* passing through two regions. A second row of light-emitting elements 100*b* illustrated in FIG. 3 passes through the first display region R1 and the second display region R2, and is a row of light-emitting elements 100*b* passing through two regions. A third row of light-emitting elements 100*b* illustrated in FIG. 3 only passes through the first display region R1 but does not pass through the second display region R2, and is a row of light-emitting elements 100*b* passing through one region. For example, in some embodiments, the light-emitting elements 100*b* are divided into two types of row light-emitting elements, that is, a row of light-emitting elements passing through two regions and a row of light-emitting elements passing through one region.

Figure 4:
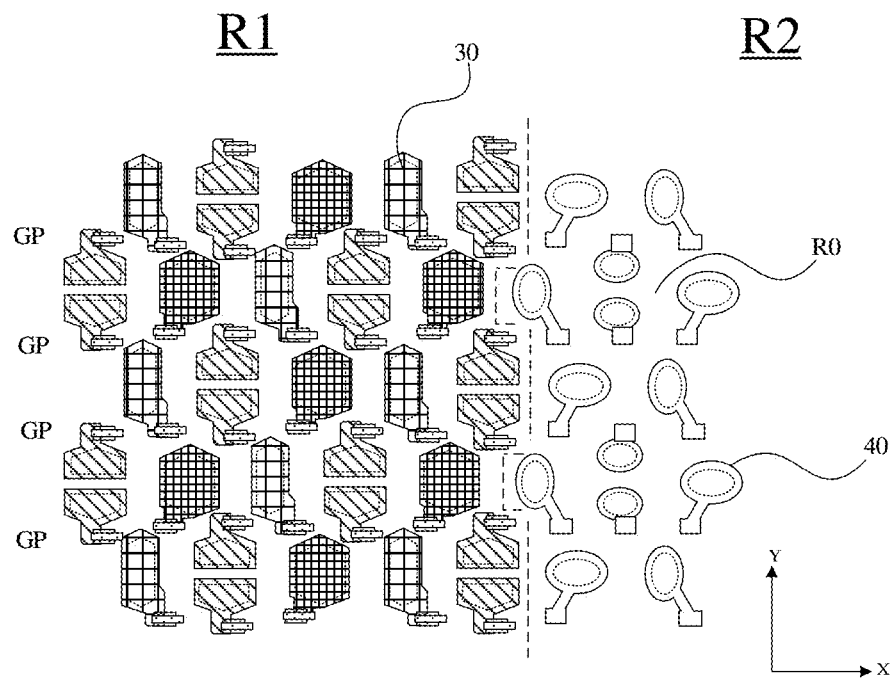
FIG. 4 is a schematic diagram of a first display region and a second display region in a display panel provided by an embodiment of the present disclosure.

FIG. 4 is a schematic diagram of a first display region and a second display region in a display panel provided by an embodiment of the present disclosure. As illustrated in FIG. 4, in the second display region R2, a light-transmitting region R0 is provided between adjacent second-region light-emitting elements 40. For example, as illustrated in FIG. 4, a plurality of light-transmitting regions R0 are connected with each other, to form a continuous light-transmitting region separated by a plurality of second-region light-emitting elements 40. The conductive line L1 is made of a transparent conductive material to increase light transmittance of the light-transmitting region R0 as much as possible. As illustrated in FIG. 4, a region of the second display region R2 except that provided with the second-region light-emitting element 40 may be a light-transmitting region.

Figure 5A:
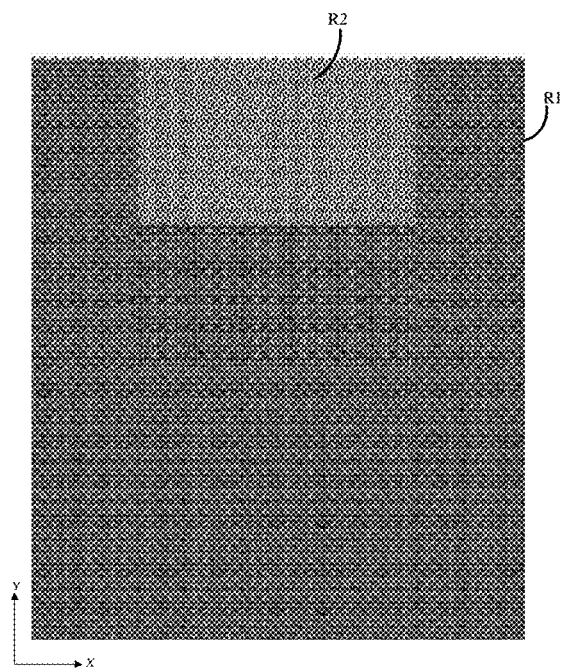
FIG. 5A to FIG. 5C are partial plan views of display panels provided by embodiments of the present disclosure.
Figure 5B:
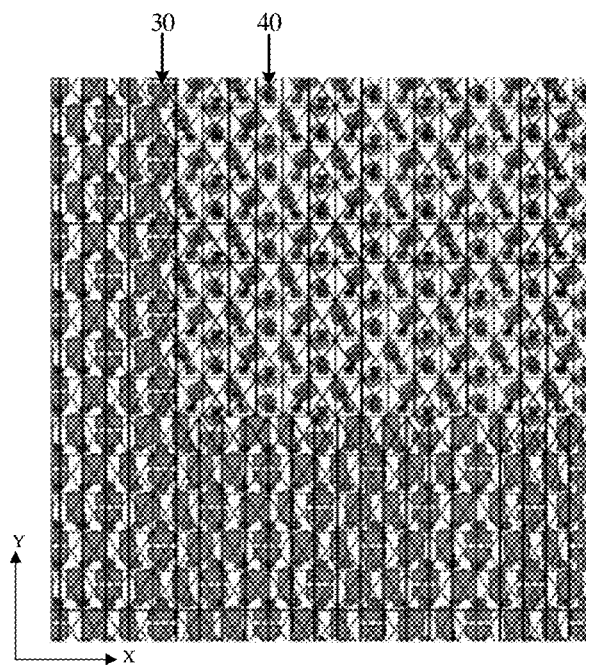
Figure 5C:
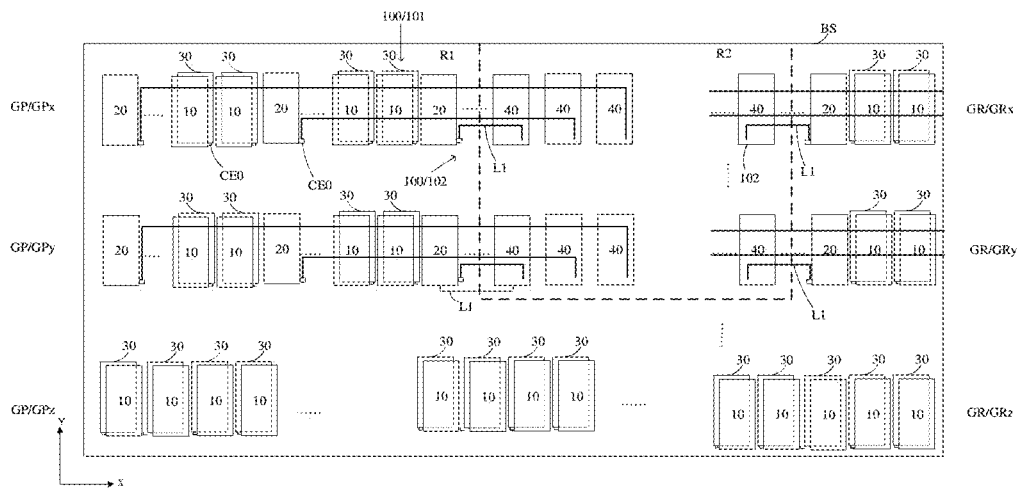

FIG. 5A to FIG. 5C are partial plan views of a display panel provided by an embodiment of the present disclosure. FIG. 5A to FIG. 5C are described below.

FIG. 5A is a schematic diagram of a first display region and a second display region of a display panel provided by an embodiment of the present disclosure. As illustrated in FIG. 5A, the second display region R2 is a light-transmitting display region; and the first display region R1 is a display region.

FIG. 5B is a schematic diagram of a first-region light-emitting element in a first display region and a second-region light-emitting element in a second display region of a display panel provided by an embodiment of the present disclosure. FIG. 5B illustrates the first-region light-emitting element 30 and the second-region light-emitting element 40.

Referring to FIG. 5A, FIG. 5B, and FIG. 3, in order to improve display effect, a density of the second-region light-emitting elements 40 may be equal to a density of the first-region light-emitting elements 30. That is, a resolution of the second display region R2 is the same as a resolution of the first display region RE Of course, in other embodiments, the density of the second-region light-emitting elements 40 may be greater or less than the density of the first-region light-emitting elements 30. That is, the resolution of the second display region R2 may be greater or less than the resolution of the first display region RE For example, as illustrated in FIG. 5B and FIG. 4, a light emission area of the second-region light-emitting element 40 is less than a light emission area of the first-region light-emitting element 30. That is, the light emission area of the first-region light-emitting element 30 is greater than the light emission area of the second-region light-emitting element 40. FIG. 4 illustrates the light emission area of the second-region light-emitting element 40 and the light emission area of the first-region light-emitting element 30 with dotted lines. For example, the light emission area of the light-emitting element may correspond to an area of an opening of a pixel definition layer.

FIG. 5C illustrates the first-region light-emitting element 30, the second-region light-emitting element 40, the first-type pixel circuit 10, the second-type pixel circuit 20, the connecting element CE0, and the conductive line L1. Each pixel circuit is connected with a light-emitting element through a connecting element CE0. That is, each pixel unit has one connecting element CE0. That is, the first-type pixel circuit 10 is connected with the first-region light-emitting element 30 through a connecting element CE0; and the second-type pixel circuit 20 is connected with the second-region light-emitting element 40 through a connecting element CE0.

For example, as illustrated in FIG. 5C, one end of the conductive line L1 is connected with the second-region light-emitting element 40; and the other end of the conductive line L1 is connected with the second-type pixel circuit 20 through the connecting element CE0. For example, the connecting element CE0 is connected with the pixel circuit 100a and the light-emitting element 100b, respectively. For example, the connecting element CE0 is connected with a light-emitting control transistor in the pixel circuit 100a and a first electrode of the light-emitting element 100b, respectively. For example, the connecting element CE0 may be formed by a single conductive member, or may include two different conductive members located in different layers. For example, the connecting element CE0 may include one conductive member located in one conductive layer and another conductive member located in another conductive layer.

As illustrated in FIG. 5C, a conductive line L1 passes through a region where the pixel circuit of the pixel unit is located to respectively connect the second-type pixel circuit 20 and the second-region light-emitting element 40 on both sides of the pixel unit. For example, the region where the pixel circuit of the pixel unit is located overlaps with a plurality of conductive lines L1 passing through the region. A region in the first display region R1 where the second-type pixel circuit 20 is arranged may be referred to as an auxiliary region Ra (as illustrated in FIG. 1B and FIG. 3); and the auxiliary region Ra may also be referred to as a transition region. FIG. 5C is described by taking that one first-type pixel circuit 10 overlaps with two conductive lines L1 at most as an example; in other embodiments, one first-type pixel circuit 10 may also overlap with more conductive lines L1. For example, in some embodiments, one first-type pixel circuit 10 may overlap with 10 to 15 conductive lines L1. The number of conductive lines L1 overlapping with one first-type pixel circuit 10 may be determined as needed. As illustrated in FIG. 5C, the second-type pixel circuit 20 may also overlap with the conductive line L1 that is not connected with it.

In some embodiments, a pitch of the first-type pixel circuit 10 may be compressed in a first direction X to obtain a region where the second-type pixel circuit 20 is provided. For example, as illustrated in FIG. 5C, in the auxiliary region, a column of second-type pixel circuits 20 is arranged every other predetermined column of first-type pixel circuits 10. For example, the number of columns of first-type pixel circuits 10 between two adjacent columns of second-type pixel circuits 20 may be determined as needed.

For example, in some embodiments, a pitch of the first-type pixel circuit 10 may be compressed in a first direction X to obtain a region where the second-type pixel circuit 20 is provided. For example, the pitch of the first-type pixel circuit 10 in the first direction X is less than a pitch of the first-region light-emitting element 30 in the first direction X. The first direction X is, for example, but is not limited to, a row direction. In other embodiments, the first direction X may also be a column direction. The embodiment of the present disclosure is described by taking the first direction X as a row direction.

Figure 5D:
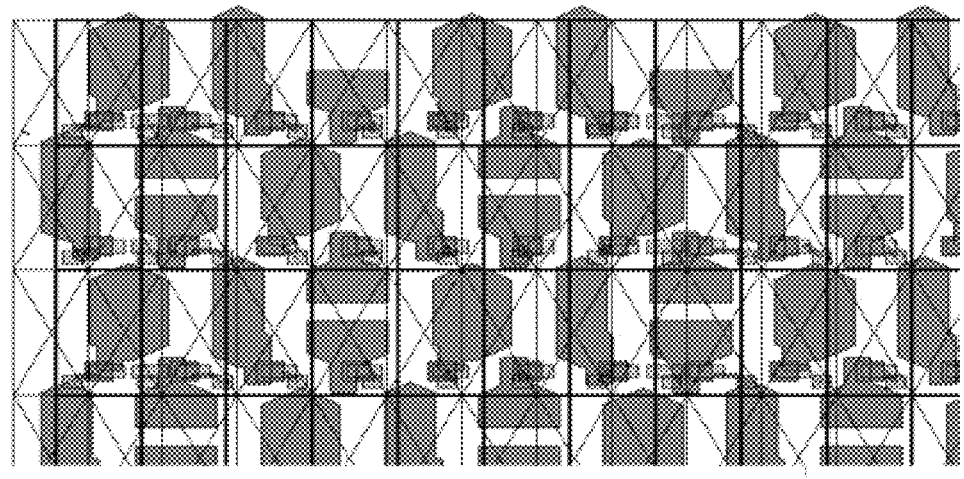
FIG. 5D to FIG. 5F are schematic structural diagrams of display panels provided by some embodiments of the present disclosure.
Figure 5E:
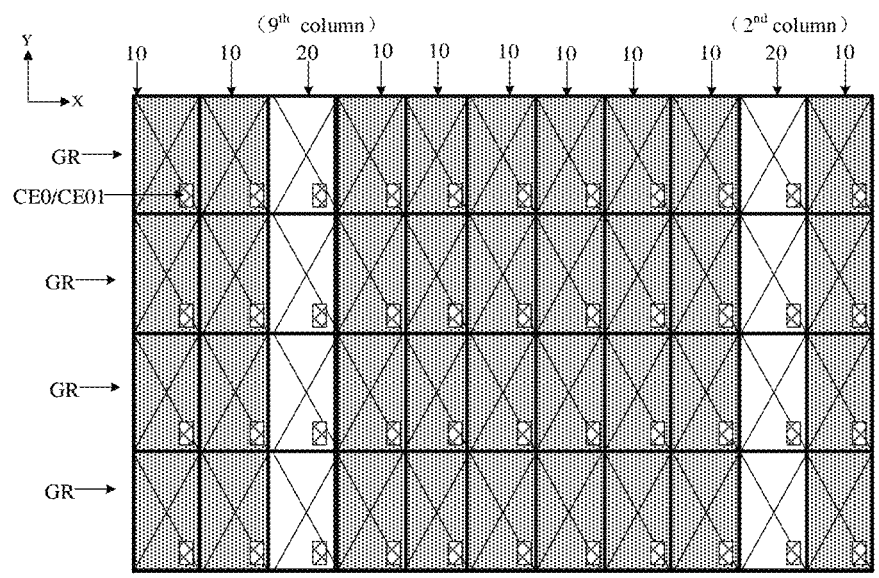
Figure 5F:
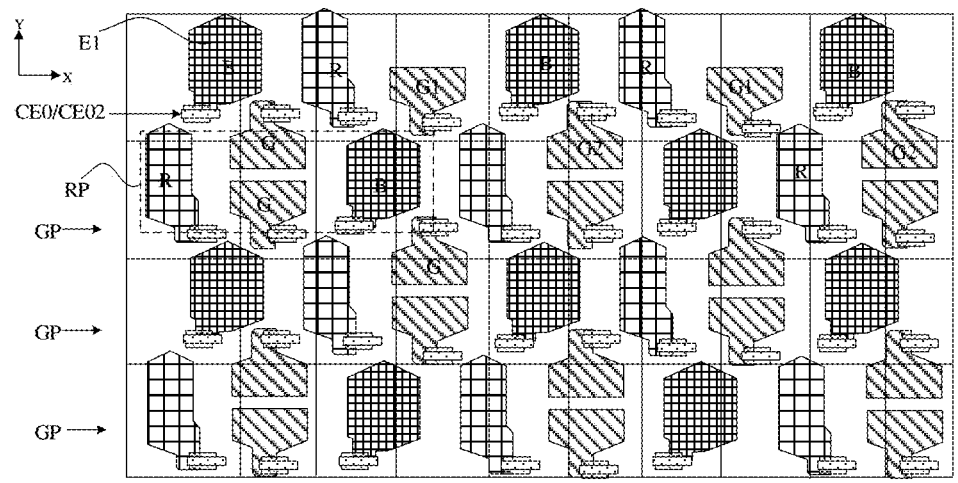

FIG. 5D to FIG. 5F are schematic structural diagrams of display panels provided by some embodiments of the present disclosure. In order to further show that there are a plurality of extra columns of pixel circuits after the pixel circuit is compressed, FIG. 5D illustrates a schematic structural diagram of a first-region light-emitting element of a first display region RE FIG. 5E illustrates a schematic diagram of a portion of the structure (including only the pixel circuit) in FIG. 5A; and FIG. 5F illustrates a schematic diagram of a portion of the structure (including only the light-emitting element) in FIG. 5A.

Referring to FIG. 5D to FIG. 5F, it may be seen that a width of the pixel circuit is less than a width of the light-emitting element. In this way, pixel circuits in the 2nd column and the 9th column from right to left are not connected with any first-region light-emitting element, which belong to the extra columns of pixel circuits, and may be used as the second-type pixel circuits 20 for connecting the second-region light-emitting elements 40 in the second display region R2. For example, as illustrated in FIG. 5F, the first-region light-emitting elements 30 may include first electrodes E1 of 4 types of light-emitting elements RG1BG2; and the first electrodes E1 of the light-emitting elements are connected with the first-type pixel circuits 10 through a connecting element CE0. R refers to a light-emitting element emitting red light, G1 refers to a light-emitting element emitting green light, B refers to a light-emitting element emitting blue light, and G2 refers to a light-emitting element emitting green light. For example, the connecting element CE0 includes two connecting electrodes, which may be respectively a connecting electrode CE01 (as illustrated in FIG. 5E or FIG. 12B) and a connecting electrode CE02 (as illustrated in FIG. 5F or FIG. 12B) mentioned later, but it is not limited thereto. For example, in order to provide sufficient space for arranging the conductive line L1, axes of the connecting electrodes CE01 in a same row of pixel units may be located in a straight line.

FIG. 5F illustrates four rows of connecting elements CE0/connecting electrodes CE02, that is, FIG. 5F illustrates four rows of light-emitting elements. For example, light-emitting elements in each row are sequentially arranged in the first direction X in a manner of RGBG or BGRG. Of course, light-emitting colors of the light-emitting elements are not limited to RGB; arrangement mode of the light-emitting elements is not limited to that illustrated in FIG. 5F; and the embodiment of the present disclosure is described by taking that the light-emitting element includes RGBG as an example. For example, as illustrated in FIG. 5F, G includes G1 or G2. For example, in the pixel arrangement illustrated in FIG. 5F, one repeating unit RP includes two Gs arranged in a second direction Y and R and B respectively arranged on both sides of the two Gs in the first direction X, R and G constitute a pixel, and borrow B from another repeating unit adjacent thereto to constitute a virtual pixel for display; B and G constitute a pixel, and borrow R from another repeating unit adjacent thereto to constitute a virtual pixel for display, but it is not limited thereto.

Referring to FIG. 3, FIG. 4, and FIG. 5A to FIG. 5C, the display panel provided by some embodiments of the present disclosure includes: a base substrate BS, a plurality of light-emitting elements 100b, and a plurality of pixel circuits 100a. The base substrate BS has a first display region R1 and a second display region R2; and the first display region R1 is located on at least one side of the second display region R2. The plurality of light-emitting elements 100b are arranged in a plurality of rows and a plurality of columns.

Referring to FIG. 3, FIG. 4, FIG. 5C and FIG. 5F, the plurality of light-emitting elements 100b includes a plurality of groups of light-emitting elements; light-emitting elements in each of the plurality of groups of light-emitting elements are arranged in the first direction X; and the plurality of groups of light-emitting elements are arranged in the second direction Y. FIG. 3 and FIG. 5C both show three groups of light-emitting elements GP; the three groups of light-emitting elements GP are respectively one group of light-emitting elements GPx, one group of light-emitting elements GPy, and one group of light-emitting elements GPz; one group of light-emitting elements GPx and one group of light-emitting elements GPy pass through the first display region R1 and the second display region R2; and one group of light-emitting elements GPz only passes through the first display region R1. FIG. 4 illustrates at least four groups of light-emitting elements GP arranged in the second direction Y. FIG. 5F illustrates at least four groups of light-emitting elements GP arranged in the second direction Y. In the display panel, the number of groups of light-emitting elements passing through the first display region R1 and the second display region R2 and the number of groups of light-emitting elements passing only through the first display region R1 may be determined as needed.

For example, in some embodiments, one group of light-emitting elements may be one row of light-emitting elements. Of course, one group of light-emitting elements may not completely correspond to one column of light-emitting elements. In other embodiments, one group of light-emitting elements may be one column of light-emitting elements. Of course, one group of light-emitting elements may not completely correspond to one column of light-emitting elements. The embodiments of the present disclosure are described by taking one group of light-emitting elements as one row of light-emitting elements.

For example, referring to FIG. 3 and FIG. 5C, at least one of the plurality of groups of light-emitting elements includes a plurality of first-region light-emitting elements 30 and a plurality of second-region light-emitting elements 40. That is, at least one group of the plurality of groups of light-emitting elements passes through the first display region R1 and the second display region R2.

For example, referring to FIG. 3, FIG. 4 and FIG. 5C, the plurality of light-emitting elements 100b include at least one row of light-emitting elements 100b passing through two regions that passes through the first display region R1 and the second display region R; and any row of light-emitting elements 100b passing through two regions in the at least one row of light-emitting elements 100b passing through two regions includes a plurality of first-region light-emitting elements 30 and a plurality of second-region light-emitting elements 40.

For example, referring to FIG. 3, FIG. 4 and FIG. 5C, a plurality of first-region light-emitting elements 30 are located in the first display region R1; and a plurality of second-region light-emitting elements 40 are located in the second display region R2.

For example, referring to FIG. 3, FIG. 5C and FIG. 5E, the plurality of pixel circuits include a plurality of groups of pixel circuits GR; pixel circuits in each group of the plurality of pixel circuits are arranged in the first direction X; and the plurality of groups of pixel circuits are arranged in the second direction Y. For example, at least one group in the plurality of groups of pixel circuits 100a includes a plurality of first-type pixel circuits 10 and a plurality of second-type pixel circuits 20. FIG. 3 and FIG. 5C respectively show three groups of pixel circuits GR. FIG. 5E illustrates four groups of pixel circuits GR. As illustrated in FIG. 3 and FIG. 5C, the pixel circuit is only located in the first display region R1; and no pixel circuit is provided in the second display region R2.

For example, referring to FIG. 3 and FIG. 5C, a plurality of pixel circuits 100a are arranged in a plurality of rows and a plurality of columns; and the plurality of pixel circuits 100a include a plurality of first-type pixel circuits 10 and a plurality of second-type pixel circuits 20 located in a same row. In other words, at least one group of the plurality of groups of pixel circuits includes a plurality of first-type pixel circuits 10 and a plurality of second-type pixel circuits 20.

For example, referring to FIG. 3 and FIG. 5C, a plurality of first-type pixel circuits 10 and a plurality of second-type pixel circuits 20 are all located in the first display region R1; and the plurality of second-type pixel circuits 20 are distributed at intervals between the plurality of first-type pixel circuits 10. At least one first-type pixel circuit 10 among the plurality of first-type pixel circuits 10 is connected with at least one first-region light-emitting element 30 among the plurality of first-region light-emitting elements 30; an orthographic projection of the at least one first-type pixel circuit 10 on the base substrate BS at least partially overlaps with an orthographic projection of the at least one first-region light-emitting element 30 on the base substrate BS; and at least one second-type pixel circuit 20 among the plurality of second-type pixel circuits 20 is connected with at least one second-region light-emitting element 40 among the plurality of second-region light-emitting elements 40 through a conductive line.

Figure 6A:
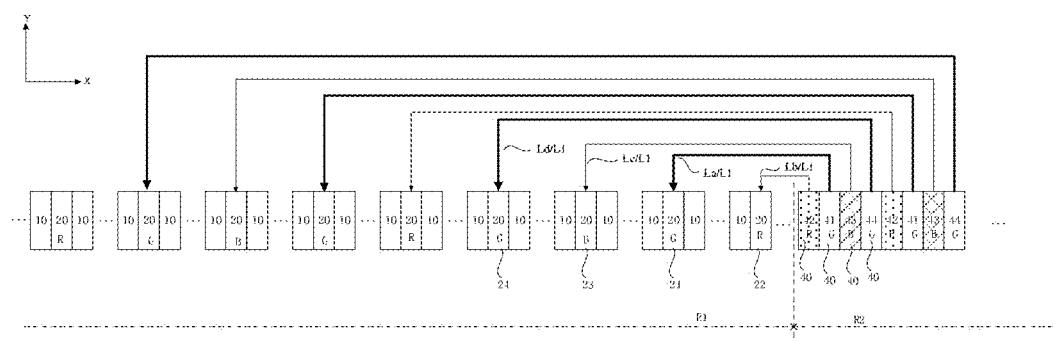
FIG. 6A is a schematic diagram of a row of light-emitting elements located in a second display region and second-type pixel circuits connected therewith in a display panel.
Figure 6B:
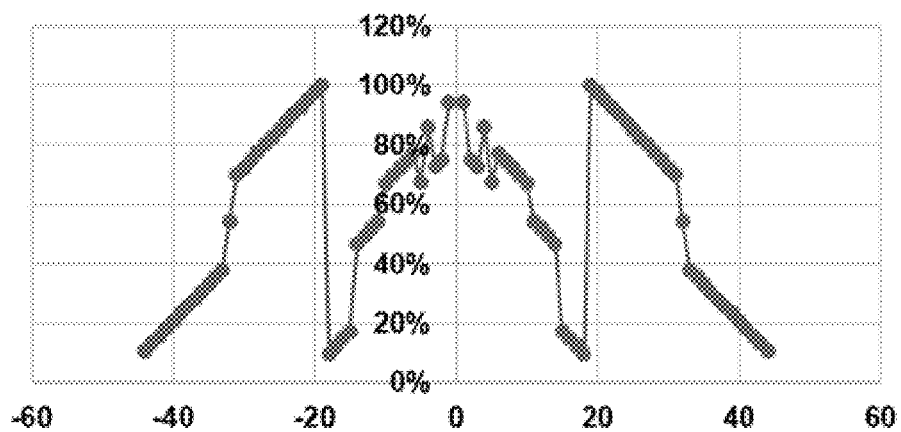
FIG. 6B is a schematic diagram of capacitance of conductive lines in a display panel.
Figure 6C:
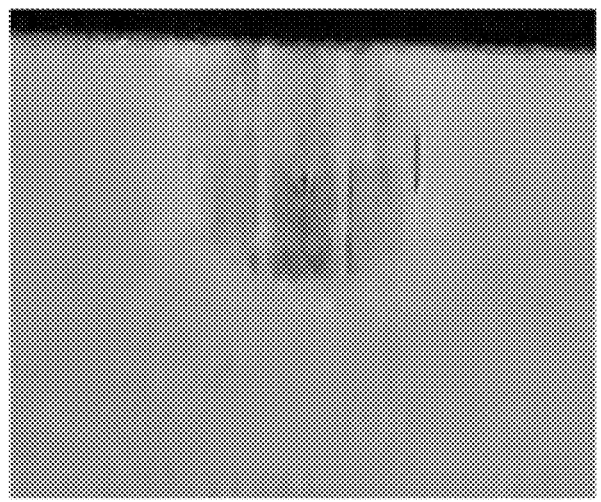
FIG. 6C is a schematic diagram of display defect of a display panel.
Figure 6D:
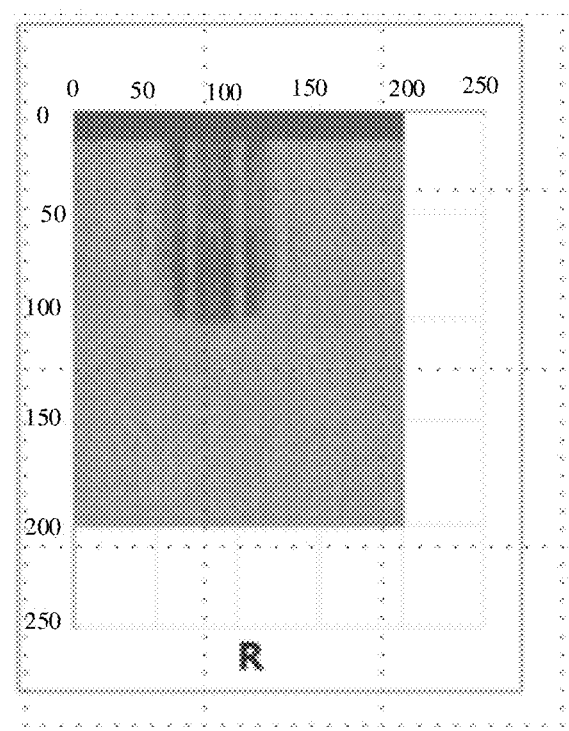
FIG. 6D to FIG. 6F are respectively schematic diagrams illustrating display defect in low gray scales.
Figure 6E:
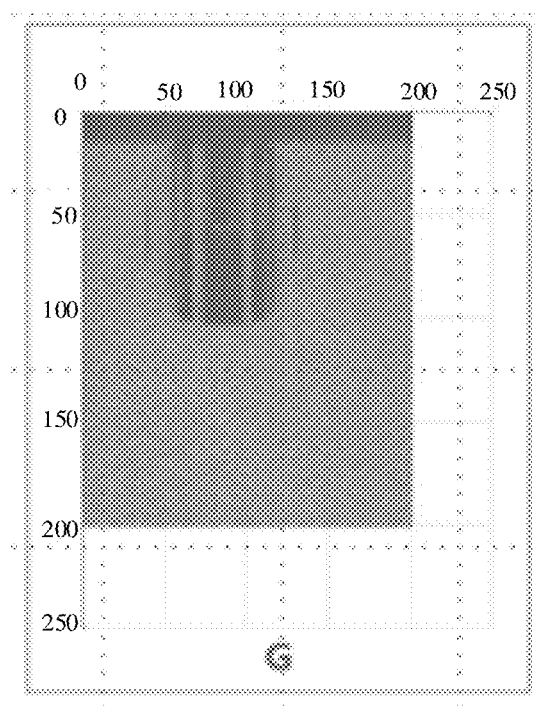
Figure 6F:
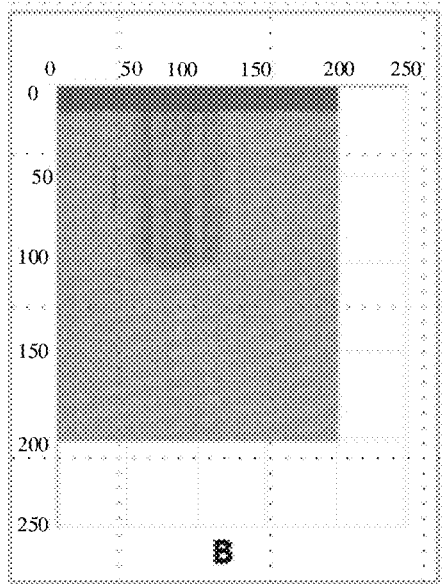
Figure 7A:
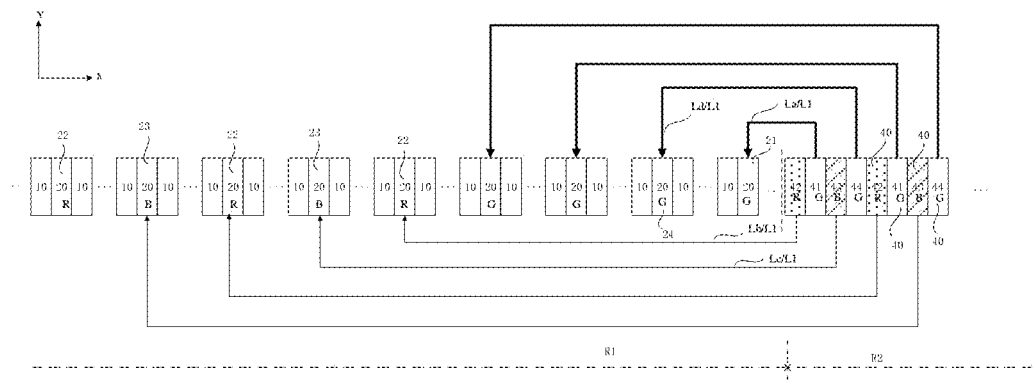
FIG. 7A is a schematic diagram of a row of light-emitting elements located in a second display region and second-type pixel circuits connected therewith in a display panel provided by an embodiment of the present disclosure.
Figure 7B:
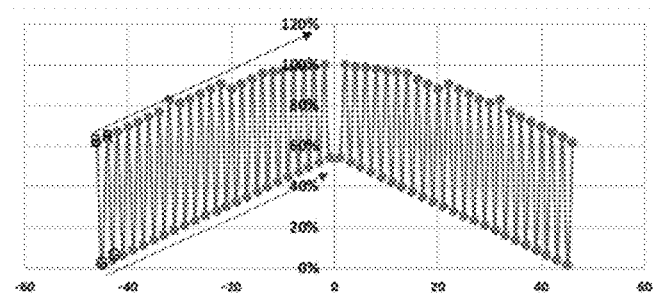
FIG. 7B is a schematic diagram of capacitance of light-emitting elements emitting different colors of light in a same row of light-emitting elements located in the second display region of a display panel provided by an embodiment of the present disclosure.

FIG. 6A is a schematic diagram of a row of light-emitting elements located in a second display region and a second-type pixel circuit connected therewith in a display panel. FIG. 6B is a schematic diagram of capacitance of a conductive line in a display panel. FIG. 6C is a schematic diagram of display defect of a display panel. FIG. 6D to FIG. 6F are respectively schematic diagrams illustrating display defect in low gray scales. FIG. 7A is a schematic diagram of a row of light-emitting elements located in a second display region and a second-type pixel circuit connected therewith in a display panel provided by an embodiment of the present disclosure. FIG. 7B is a schematic diagram of capacitance of light-emitting elements emitting different colors of light in a same row of light-emitting elements located in a second display region of a display panel provided by an embodiment of the present disclosure.

For example, in the embodiment of the present disclosure, a row of light-emitting elements may refer to that pixel circuits connected with the row of light-emitting elements are all connected with the same gate line, but it is not limited thereto. For example, in the embodiment of the present disclosure, a row of pixel circuits may refer to that the row of pixel circuits are all connected with the same gate line, but it is not limited thereto. For example, in the embodiment of the present disclosure, a row of pixel units may refer to that the pixel circuits connected with the row of pixel units are all connected with the same gate line, but it is not limited thereto.

For example, as illustrated in FIG. 6A and FIG. 7A, in at least one group of light-emitting elements 100b, the plurality of second-region light-emitting elements 40 include a plurality of first light-emitting elements 41 and a plurality of second light-emitting elements 42; the first light-emitting element 41 is configured to emit light of a first color; and the second light-emitting element 42 is configured to emit light of a second color. The plurality of second-type pixel circuits 20 include a plurality of first pixel circuits 21 and a plurality of second pixel circuits 22; the conductive lines L1 include a plurality of first conductive lines La and a plurality of second conductive lines Lb; the plurality of light-emitting elements 41 are connected with the plurality of first pixel circuits 21 through a plurality of first conductive lines La; and the plurality of second light-emitting elements 42 are connected with the plurality of second pixel circuits 22 through a plurality of second conductive lines Lb. For example, one first light-emitting element 41 is connected with one first pixel circuit 21 through one first conductive line La; and one second light-emitting element 42 is connected with one second pixel circuit 22 through one second conductive line Lb.

For example, as illustrated in FIG. 6A and FIG. 7A, the plurality of second-region light-emitting elements 40 further include a plurality of third light-emitting elements 43; the third light-emitting elements 43 are configured to emit light of a third color; the plurality of second-type pixel circuits 20 further include a plurality of third pixel circuits 23; the conductive lines L1 further include a plurality of third conductive lines Lc; and the plurality of third light-emitting elements 43 are connected with the plurality of third pixel circuits 23 through the plurality of third conductive lines Lc. For example, one third light-emitting element 43 is connected with one third pixel circuit 23 through one third conductive line Lc.

For example, as illustrated in FIG. 6A and FIG. 7A, the plurality of second-region light-emitting elements 40 further include a plurality of fourth light-emitting elements 44; the fourth light-emitting elements 44 are configured to emit light of a fourth color; the plurality of second-type pixel circuits 20 further include a plurality of fourth pixel circuits 24; the conductive lines L1 further include a plurality of fourth conductive lines Ld; and the plurality of fourth light-emitting elements 44 are connected with the plurality of fourth pixel circuits 24 through the plurality of fourth conductive lines Ld. For example, one fourth light-emitting element 44 is connected with one fourth pixel circuit 24 through one fourth conductive line Ld.

For example, the light of a first color and the light of a fourth-color are both green light; one of the light of a second color and the light of a third color is red light; and the other of the light of a second color and the light of a third color is blue light.

For example, the fourth light-emitting element 44 and the first light-emitting element 41 are configured to emit light of the same color. For example, the fourth light-emitting element 44 and the first light-emitting element 41 are configured to emit green light; one of the second light-emitting element 42 and the third light-emitting element 43 is configured to emit red light; and the other of the second light-emitting element 42 and the third light-emitting element 43 is configured to emit blue light. The embodiment of the present disclosure is described by taking that the fourth light-emitting element 44 and the first light-emitting element 41 emit green light, the second light-emitting element 42 emits red light, and the third light-emitting element 43 emits blue light as an example; in other embodiments, the first light-emitting element 41, the second light-emitting element 42, the third light-emitting element 43, and the fourth light-emitting element 44 may also emit light of other colors, which is not limited to the three colors of red, green and blue; and the color of light emitted by the first light-emitting element 41, the second light-emitting element 42, the third light-emitting element 43, and the fourth light-emitting element 44 may be determined as needed.

As illustrated in FIG. 6B, an abscissa refers to a position of the second display region of the display panel in the first direction; and an ordinate refers to a ratio of capacitance of the conductive line connected with the light-emitting element in the position to total capacitance. In the display panel, capacitance difference of the conductive line varies greatly. Due to different lengths of the conductive lines connected with the respective light-emitting elements located in the second display region, capacitance difference of the light-emitting elements emitting light of different colors varies. As compared with capacitance difference of the conductive lines connected with light-emitting elements emitting red light and capacitance difference of the conductive lines connected with light-emitting elements emitting blue light, capacitance difference of the conductive lines connected with light-emitting elements emitting green light is greater. Because the capacitance difference of the conductive lines connected with light-emitting elements emitting green light is greater, light emission duration of the light-emitting elements emitting green light is reduced, so that brightness difference of the display panel occurs, resulting in display defect. For example, as illustrated in FIG. 6C, stripes appear when the display panel displays. For example, as illustrated in FIG. 6C, purple stripes appear when the display panel displays (FIG. 6C is a gray-scale image, not marked with colors). For example, vertical purple stripes appear when the display panel displays. For example, as illustrated in FIG. 6D to FIG. 6F, at low gray scales, a defectiveness degree of the light-emitting element emitting green light is greater than a defectiveness degree of the light-emitting element emitting red light; a defectiveness degree of the light-emitting element emitting red light is greater than a defectiveness degree of the light-emitting element emitting blue light. For example, under the same gray scale, a driving current that drives the light-emitting element to emit blue light is greater than a driving current that drives the light-emitting element to emit red light; and a driving current that drives the light-emitting element to emit red light is greater than a driving current that drives the light-emitting element to emit green light.

FIG. 7B is a schematic diagram of capacitance distribution of conductive lines connected with light-emitting elements emitting light of different colors in a row of light-emitting elements located in the second display region corresponding to FIG. 7A. As illustrated in FIG. 7B, capacitance of the conductive line connected with the light-emitting element emitting green light is the smallest; and as illustrated in a left half of FIG. 7B, capacitance of the conductive line connected with the light-emitting element emitting green light presents a gradually increasing trend; so, capacitance difference of the two conductive lines connected with adjacent light-emitting elements emitting green light is smaller. Due to a symmetrical structure of the second display region of the display panel, a right half illustrated in FIG. 7B will not be described in details. As illustrated in FIG. 7B, the capacitance of the conductive line connected with the light-emitting element emitting green light is smaller than the capacitance of the conductive line connected with the light-emitting element emitting red light; and the capacitance of the conductive line connected with the light-emitting element emitting green light is smaller than the capacitance of the conductive line connected with the light-emitting element emitting blue light. As illustrated in FIG. 7B, the capacitance of the conductive line connected with the light-emitting element emitting red light presents a gradually increasing trend; and the capacitance of the conductive line connected with the light-emitting element emitting blue light presents a gradually increasing trend; and the capacitance of the conductive line connected with the light-emitting element emitting red light is not much different from the capacitance of the conductive line connected with the light-emitting element emitting blue light.

In the display panel provided by the embodiment of the present disclosure, in order to alleviate display defect, the arrangement order of the second-type pixel circuits connected with light-emitting elements emitting light of different colors is adjusted, to reduce or eliminate display defect caused by large differences in the lengths of the conductive lines. That is, when designing the second-type pixel circuits connected with the first light-emitting element, the lengths of the conductive lines and differences in the lengths of the conductive lines are considered, for example, a G-priority order is adopted. For example, G priority refers to that the second-type pixel circuits connected with the light-emitting element emitting green light is preferentially arranged close to the second display region.

As illustrated in FIG. 7A, in at least one group of light-emitting elements and at least one group of pixel circuits, the plurality of first pixel circuits 21 connected with the plurality of first light-emitting elements 41 are all closer to the second display region R2 than each of the plurality of second pixel circuits 22 connected with the plurality of second light-emitting elements 42. That is, as compared with the display panel illustrated in FIG. 6A, the display panel illustrated in FIG. 7A has the position of the first pixel circuit 21 connected with the first light-emitting element 41 adjusted, making the first pixel circuit 21 connected with the first light-emitting element 41 closer to the second display region R2 than other second-type pixel circuits, so that the length difference of the first conductive line La connected with the first light-emitting element 41 is reduced, thereby reducing or avoiding display defect.

For example, in the embodiment of the present disclosure, being in at least one group of light-emitting elements and at least one group of pixel circuits, may refer to being in a row of light-emitting elements 100b passing through two regions, or, may refer to being in a row of pixel units passing through two regions, but it is not limited thereto.

For example, as illustrated in FIG. 7A, in at least one group of light-emitting elements and at least one group of pixel circuits, no other second-type pixel circuit 20 is provided between two first pixel circuits 21 connected with two adjacent first conductive lines La. Such arrangement is favorable for reducing the lengths of the first conductive lines La, and is also favorable for reducing length difference between the first conductive lines La.

It should be noted that, in the display panel provided by the embodiment of the present disclosure, element A and element B being adjacent to each other, or adjacent element A and element B refers to that between element A and element B, there is no more element A or element B, but there may be other element besides element A and element B. Element A and element B may be the same element or different elements.

For example, as illustrated in FIG. 5C, FIG. 5E and FIG. 7A, in at least one group of light-emitting elements and at least one group of pixel circuits, at least one of the plurality of first-type pixel circuits 10 is arranged between two adjacent second-type pixel circuits 20.

For example, as illustrated in FIG. 7A, in at least one group of light-emitting elements and at least one group of pixel circuits, the plurality of first pixel circuits 21 connected with the plurality of first conductive lines La are arranged at intervals among the plurality of first-type pixel circuits 10; and the plurality of second pixel circuits 22 connected with the plurality of second conductive lines Lb are arranged at intervals among the plurality of first-type pixel circuits 10.

FIG. 7A only illustrates a row of light-emitting elements passing through two regions; it may be understood that an upper side, a lower side, or the upper side and the lower side of a row of light-emitting elements illustrated in FIG. 7A further include a plurality of rows of light-emitting elements the same as the row of light-emitting elements illustrated in the diagram. Thus, each light-emitting element illustrated in FIG. 7A is one of one column of light-emitting elements; and each pixel circuit illustrated in FIG. 7A is one of one column of pixel circuits.

For example, as illustrated in FIG. 7A, in at least one group of light-emitting elements and at least one group of pixel circuits, the plurality of first pixel circuits 21 connected with the plurality of first conductive lines La are all closer to the second display region R2 than each of the plurality of third pixel circuits 23 connected with the plurality of third conductive lines Lc.

For example, as illustrated in FIG. 7A, in order to make the second conductive line Lb have a smaller capacitance difference, and to make the third conductive line Lc have a smaller capacitance difference, in at least one group of light-emitting elements and at least one group of pixel circuits, the plurality of second pixel circuits 22 connected with the plurality of second conductive lines Lb and the plurality of third pixel circuits 23 connected with the plurality of third conductive lines Lc are alternately arranged.

For example, as illustrated in FIG. 7A, in at least one group of light-emitting elements and at least one group of pixel circuits, the plurality of fourth pixel circuits 24 connected with the plurality of fourth conductive lines Ld are all closer to the second display region R2 than each of the plurality of second pixel circuits 22 connected with the plurality of second conductive lines Lb. In the embodiment of the present disclosure, the fourth light-emitting element 44 and the first light-emitting element 41 emit light of the same color, so the plurality of fourth pixel circuits 24 are also preferentially arranged, that is, the plurality of fourth pixel circuits 24 are arranged closer to the second display region. Of course, in other embodiments, the fourth light-emitting element 44 may not be provided, and thus the fourth pixel circuit 24 does not need to be provided. For example, in this case, the pixels may be in a form of real RGB, but it is not limited thereto.

For example, as illustrated in FIG. 7A, in order to make the first conductive line La have a smaller capacitance difference and to make the fourth conductive line Ld have a smaller capacitance difference, in at least one group of light-emitting elements and at least one group of pixel circuits, the plurality of fourth pixel circuits 24 connected with the plurality of fourth conductive lines Ld and the plurality of first pixel circuits 21 connected with the plurality of first conductive lines La are alternately arranged.

For example, at least one selected from the group consisting of the first conductive line La, the second conductive line Lb, the third conductive line Lc, and the fourth conductive line Ld is made of a transparent conductive material.

Figure 7C:
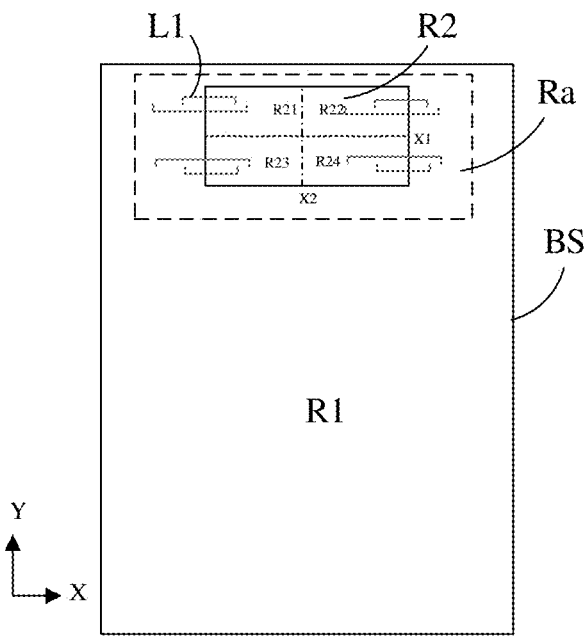
FIG. 7C is a schematic diagram of a display panel provided by an embodiment of the present disclosure.

FIG. 7C is a schematic diagram of a display panel provided by an embodiment of the present disclosure. As illustrated in FIG. 7C, the second display region R2 of the display panel has an symmetrical shape, and has a first symmetry axis X1 extending in the first direction X and a second symmetry axis X2 extending in the second direction Y. For example, as illustrated in FIG. 7C, a plurality of conductive lines L1 are arranged; and the plurality of conductive lines L1 are symmetrical with respect to the first symmetry axis X1 and are symmetrical with respect to the second symmetry axis X2. FIG. 7C only schematically illustrates four conductive lines L1. FIG. 7C illustrates that the second display region R2 includes a first sub-region R21, a second sub-region R22, a third sub-region R23, and a fourth sub-region R24. The first sub-region R21 and the second sub-region R22 are symmetrical with respect to the second symmetry axis X2; the third sub-region R23 and the fourth sub-region R24 are symmetrical with respect to the second symmetry axis X2; the first sub-region R21 and the third sub-region R23 are symmetrical with respect to the first symmetry axis X1; and the second sub-region R22 and the fourth sub-region R24 are symmetrical with respect to the first symmetry axis X1. For example, the plurality of second-region light-emitting elements are symmetrical with respect to the first symmetry axis X1 and are symmetrical with respect to the second symmetry axis X2. The one row of light-emitting elements illustrated in FIG. 7A may be located in the first sub-region R21 or the third sub-region R23.

Figure 8A:
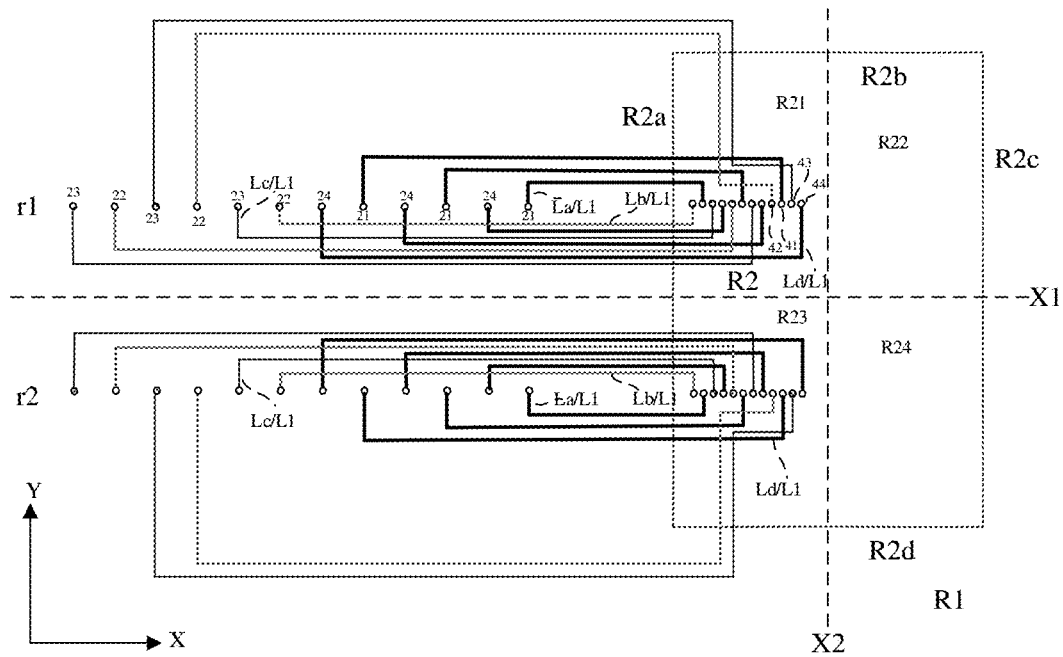
FIG. 8A is a schematic diagram of a light-emitting element located in a second display region and a second-type pixel circuit connected therewith in a display panel provided by an embodiment of the present disclosure.

FIG. 8A is a schematic diagram of a light-emitting element located in a second display region and a second-type pixel circuit connected therewith in a display panel provided by an embodiment of the present disclosure. FIG. 8A illustrates part of the light-emitting elements located in the second display region; for clarity of illustration, the light-emitting elements located in the first display region are omitted, and the first-type pixel circuits are omitted. Referring to FIG. 7A and FIG. 8A, it may be understood that one or more first-type pixel circuits and first-region light-emitting elements connected with the first-type pixel circuits are arranged between two adjacent second-type pixel circuits.

FIG. 8A illustrates two rows of light-emitting elements located in a left half of the second display region R2; a structure in the second display region R2 is symmetrical up and down with respect to an axis X1, and is symmetrical left and right with respect to the second symmetry axis X2. FIG. 8A illustrates two rows of light-emitting elements r1 and r2; and one row of light-emitting elements r1 in FIG. 8A is used as a main object for description. For example, the two rows of light-emitting elements r1 and r2 are symmetrical with respect to the first symmetry axis X1. For example, the two rows of light-emitting elements r1 and r2 illustrated in FIG. 8A are respectively located in the first sub-region R21 and the third sub-region R23 illustrated in FIG. 7C.

Figure 8B:
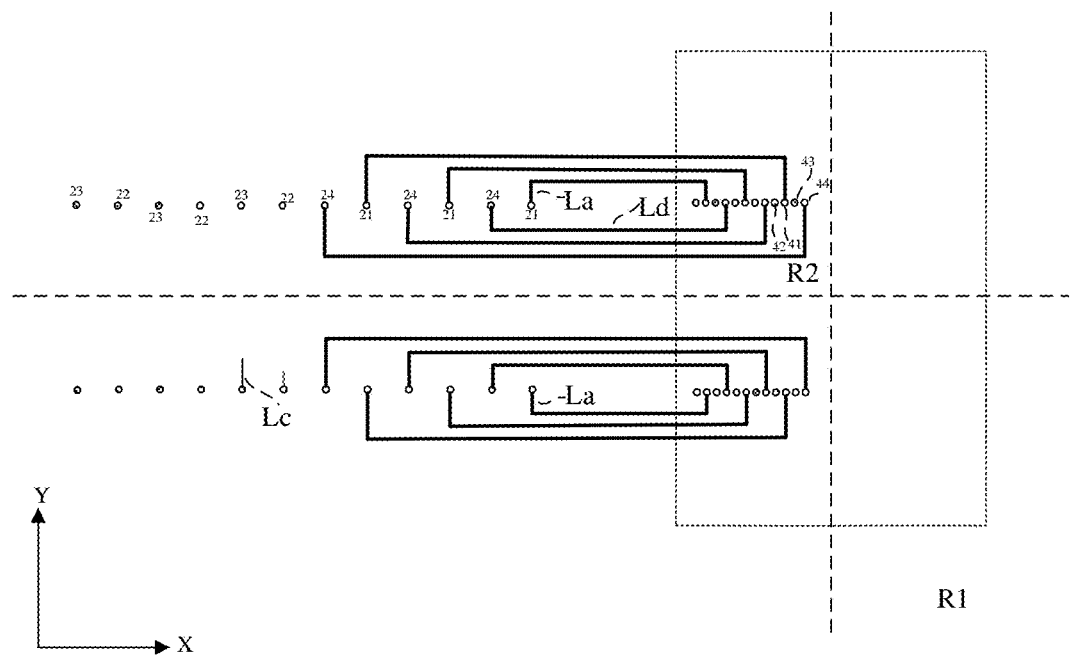
FIG. 8B is a schematic diagram of a first conductive line and a fourth conductive line in FIG. 8A.
Figure 8C:
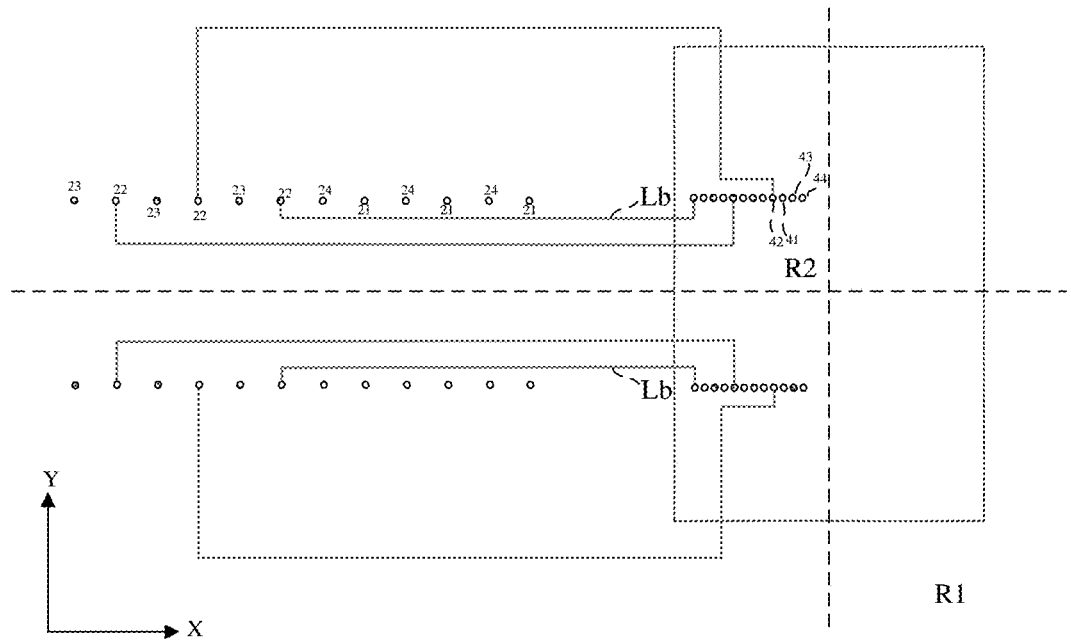
FIG. 8C is a schematic diagram of a second conductive line in FIG. 8A.
Figure 8D:
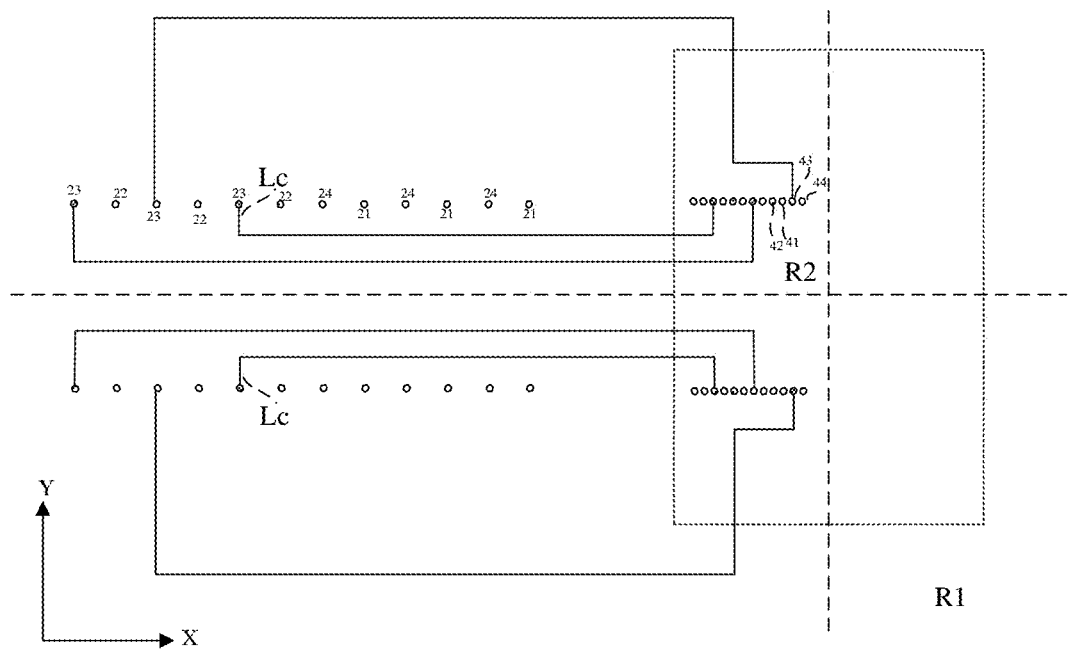
FIG. 8D is a schematic diagram of a third conductive line in FIG. 8A.

FIG. 8B is a schematic diagram of the first conductive line La and the fourth conductive line Ld in FIG. 8A. FIG. 8C is a schematic diagram of the second conductive line Lb in FIG. 8A. FIG. 8D is a schematic diagram of the third conductive line Lc in FIG. 8A.

For example, in some embodiments, the first conductive line La and the fourth conductive line Ld are located in the same pattern layer; the second conductive line Lb is located in one pattern layer; and the third conductive line Ld is located in another pattern layer, thereby forming three pattern layers. For example, in some embodiments, the first conductive line La and the fourth conductive line Ld are located in the third pattern layer; the second conductive line Lb is located in the second pattern layer; and the third conductive line Ld is located in the first pattern layer. For example, the third pattern layer, the second pattern layer, and the first pattern layer are sequentially arranged in a direction perpendicular to the base substrate; the first pattern layer is closer to the base substrate than the second pattern layer; and the second pattern layer is closer to the base substrate than the third pattern layer. In the case where the number of conductive lines that need to be provided for each group of light-emitting elements is small, the conductive lines that need to be provided for the group of light-emitting elements may be arranged in one layer; and in the case where the number of conductive lines that need to be provided for each group of light-emitting elements is large, the conductive lines may be respectively arranged in several different layers; and according to needs, part of the conductive lines may be formed by segmentation, that is, formed by conductive portions located in different layers. In the case where there are more conductive lines to be provided, a mode of arranging by segmentation is adopted.

For example, as illustrated in FIG. 8A, FIG. 8B to FIG. 8D, the conductive lines connected with two adjacent rows of light-emitting elements 100*b* passing through the two regions are axially symmetrical.

For example, as illustrated in FIG. 8A and FIG. 8B to FIG. 8D, the structure in the second display region R2 is axially symmetrical.

Figure 8E:
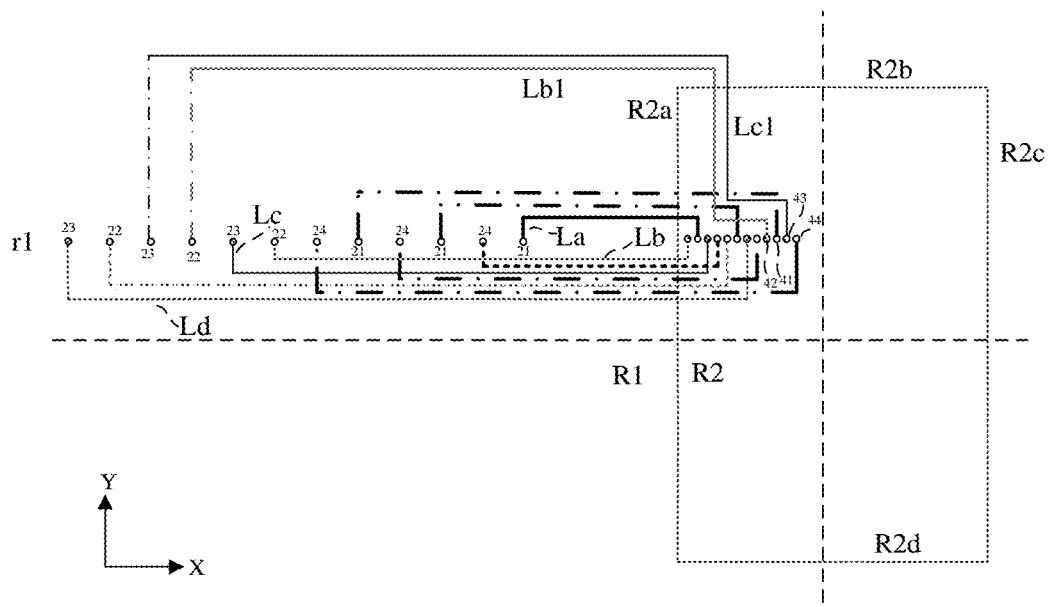
FIG. 8E is a schematic diagram of a row of light-emitting elements of a display panel provided by another embodiment of the present disclosure.

FIG. 8E is a schematic diagram of a row of light-emitting elements r1 of a display panel provided by another embodiment of the present disclosure. As illustrated in FIG. 8E, a solid line in the diagram indicates location in the second pattern layer; a single-dot dash indicates location in the first pattern layer; and a dashed line indicates location in the third pattern layer. Conductive portions of the same conductive line that are located in different layers are connected through via holes. As illustrated in FIG. 8E, in a densely wired region, in the second direction Y, adjacent conductive lines are located in different pattern layers; and such arrangement is favorable for reducing interference between the conductive lines.

For example, at least one selected from the group consisting of one of the plurality of first conductive lines La, one of the plurality of second conductive lines Lb, one of the plurality of third conductive lines Lc, and one of the plurality of fourth conductive lines Ld is formed integrally by one conductive line, or is formed by conductive portions located in different layers.

As illustrated in FIG. 8E, the conductive line Lb1 is formed by conductive portions located in different layers; the conductive line Lc1 is formed by conductive portions located in different layers; and other conductive lines in FIG. 8E are all formed integrally by one conductive line, and distributed in three different pattern layers.

For example, as illustrated in FIG. 1B, the first display region R1 includes an auxiliary region Ra; a plurality of second-type pixel circuits 20 are located in the auxiliary region Ra; an area of the auxiliary region Ra is less than an area of the region of the first display region R1 excluding the auxiliary region Ra.

For example, in order to facilitate arranging the second-type pixel circuit 20 in the first display region R1, a pitch of the first-type pixel circuit 10 in the first direction is less than a pitch of the first-region light-emitting element 30 in the first direction. For example, a pitch of the second-type pixel circuit 20 in the first direction is less than a pitch of the first-region light-emitting element 30 in the first direction. For example, the pitch of the first-type pixel circuit 10 in the first direction is equal to or substantially equal to the pitch of the second-type pixel circuit 20 in the first direction.

The display panel illustrated in FIG. 8A includes a fourth light-emitting element; in other embodiments, the display panel may not include a fourth light-emitting element. In a case where the display panel does not include the fourth light-emitting element, the fourth light-emitting element illustrated in FIG. 8A and the pixel circuit connected with the fourth light-emitting element may be removed, and positions of other components may be adjusted accordingly.

Figure 9A:
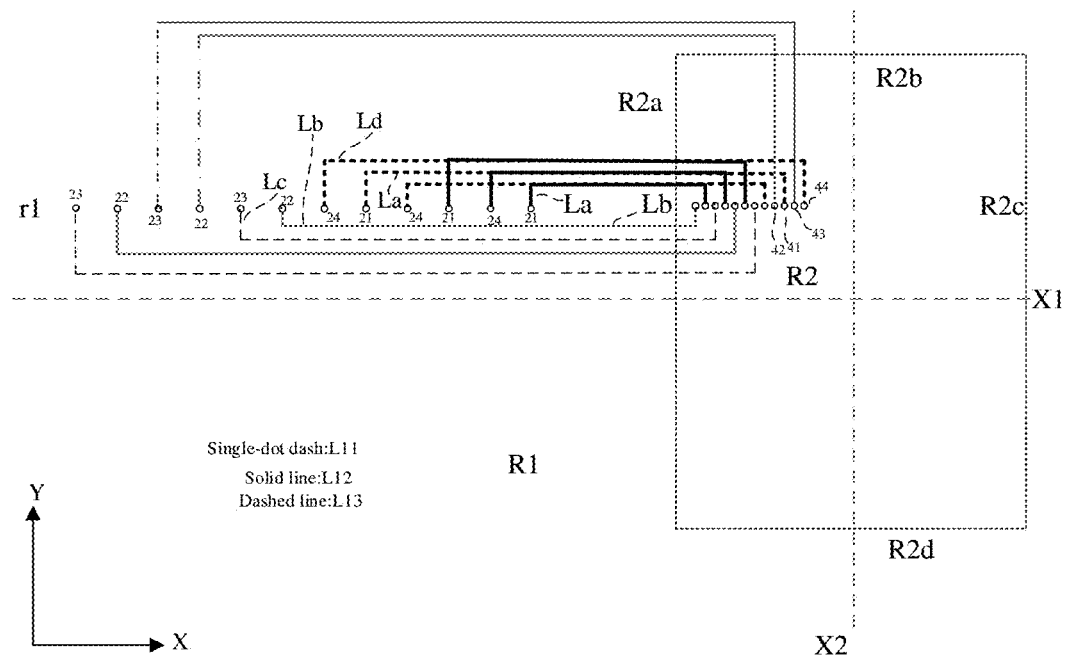
FIG. 9A is a schematic diagram of another display panel provided by an embodiment of the present disclosure.
Figure 9B:
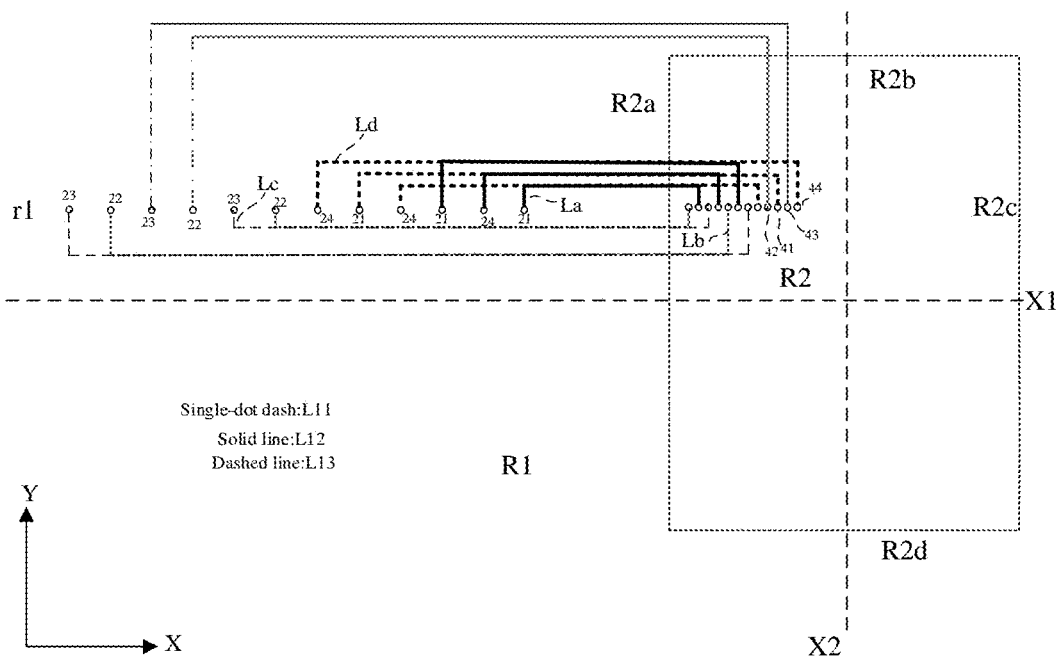
FIG. 9B is a schematic diagram of a display panel provided by another embodiment of the present disclosure.

FIG. 9A is a schematic diagram of another display panel provided by an embodiment of the present disclosure. FIG. 9B is a schematic diagram of a display panel provided by another embodiment of the present disclosure. As illustrated in FIG. 9A, the fourth conductive line Ld and the first conductive line La are located on the same side of the row of light-emitting elements; and FIG. 9A is described by taking that the fourth conductive line Ld and the first conductive line La are located on an upper side of the row of light-emitting elements as an example. As illustrated in FIG. 9A, the fourth conductive line Ld partially overlaps with the first conductive line La. That is, an orthographic projection of the fourth conductive line Ld on the base substrate partially overlaps with an orthographic projection of the first conductive line La on the base substrate. As illustrated in FIG. 9B, the second conductive line Lb partially overlaps with the third conductive line Lc. That is, an orthographic projection of the second conductive line Lb on the base substrate partially overlaps with an orthographic projection of the third conductive line Lc on the base substrate. The overlapping arrangement of the conductive lines may help reduce space in the second display region that is occupied by the conductive lines connected with the row of light-emitting elements in the second direction Y, and facilitate arrangement of more conductive lines. As illustrated in FIG. 9A and FIG. 9B, the same line type indicates location in the same layer. For example, a portion illustrated by the single-dot dash indicates location in the first pattern layer L11; a portion illustrated by the solid line indicates location in the second pattern layer L12; and a portion illustrated by the dashed line indicates location in the third pattern layer L13. For example, the first pattern layer L11 is closer to the base substrate than the second pattern layer L12; and the second pattern layer L12 is closer to the base substrate than the third pattern layer L13, but it is not limited thereto; a fabrication order of the respective pattern layers may also be adjusted as needed such that distances between the respective pattern layers and the base substrate are different from those in the previous description.

Figure 10A:
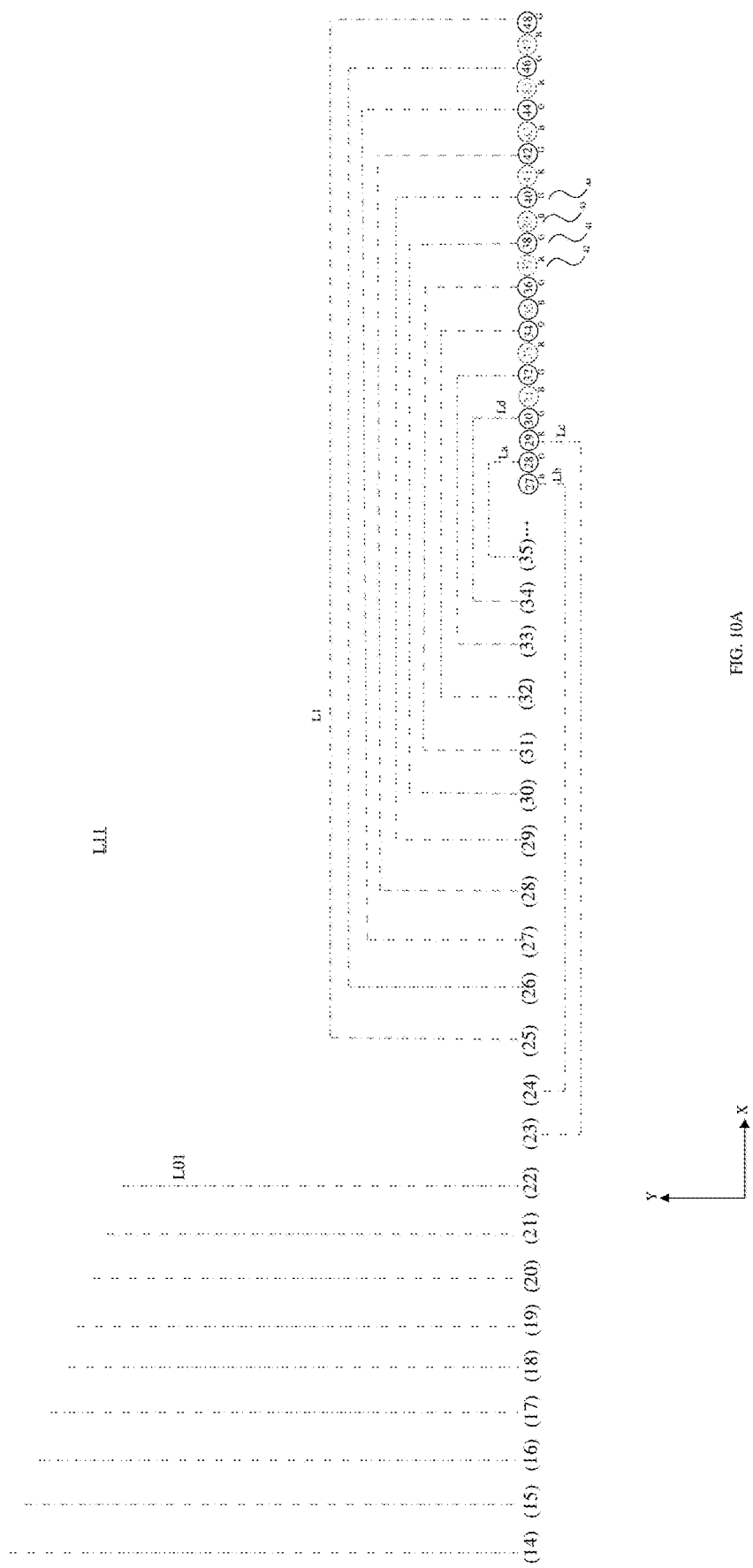
FIG. 10A to FIG. 10E are schematic diagrams of display panels provided by an embodiment of the present disclosure.
Figure 10B:
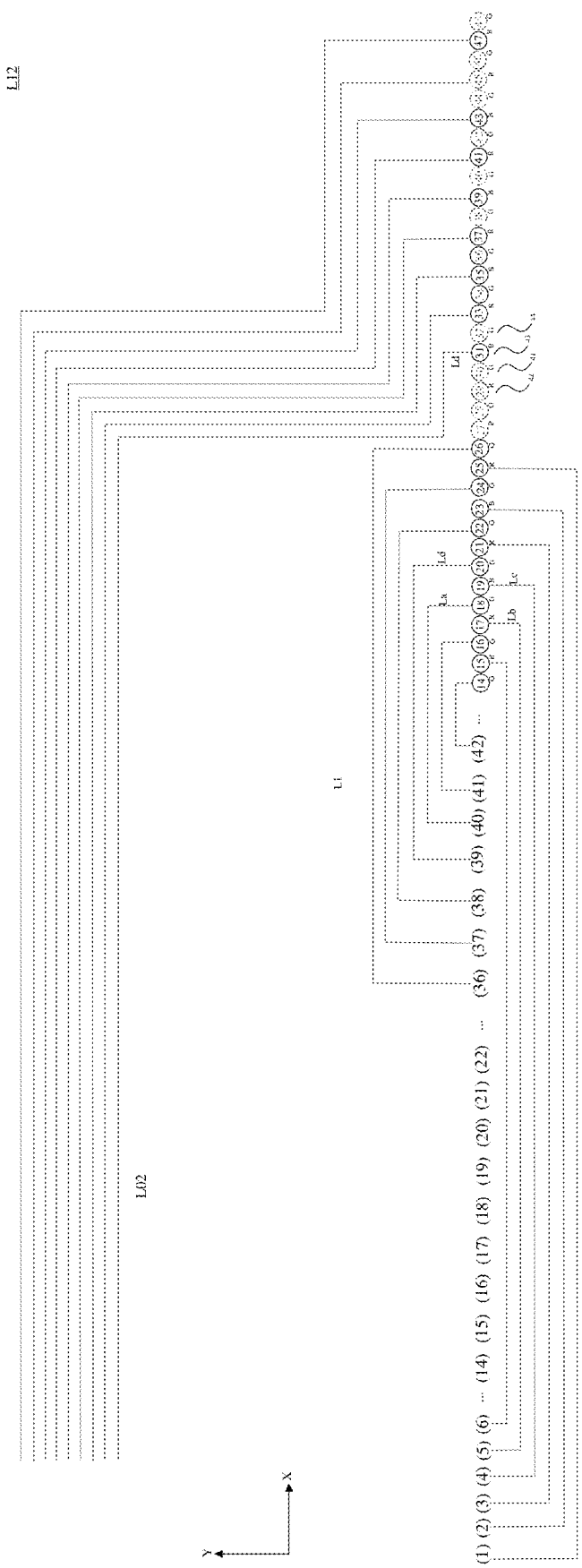
Figure 10C:
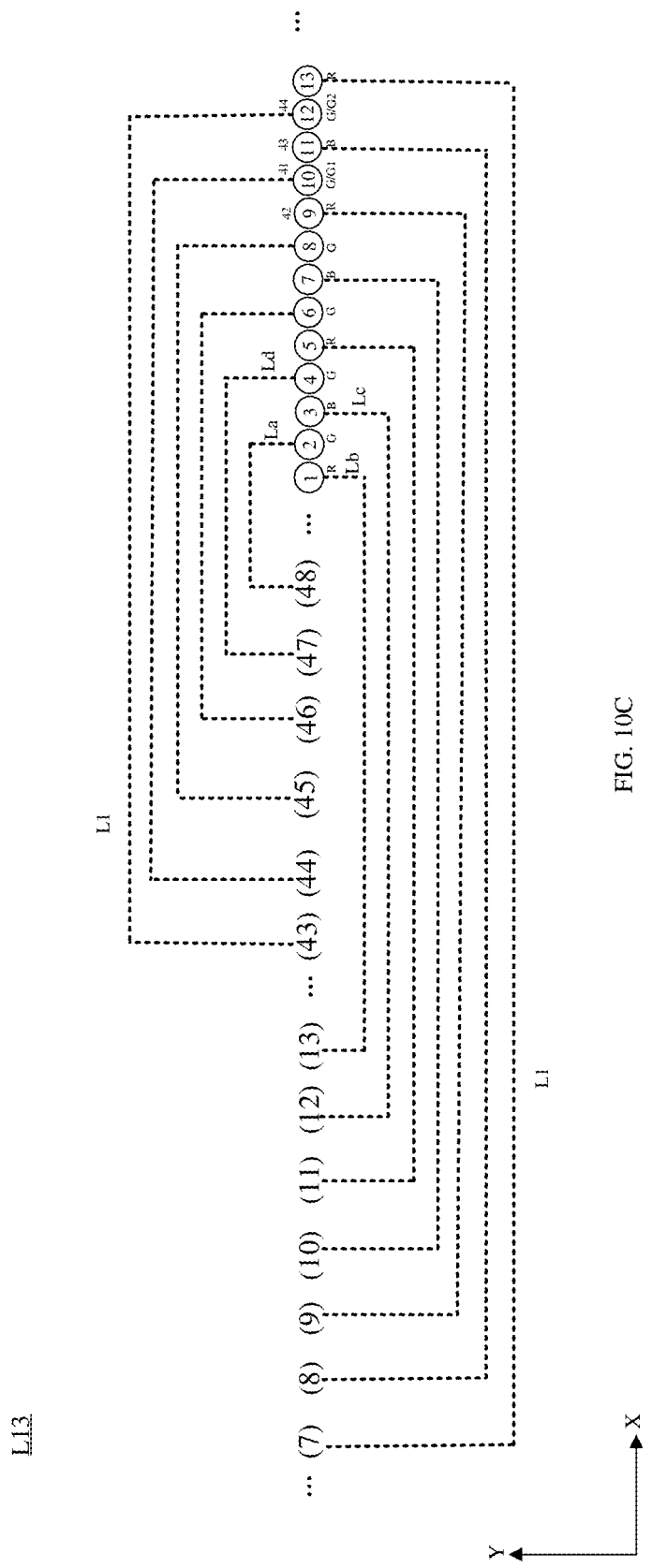
Figure 10D:
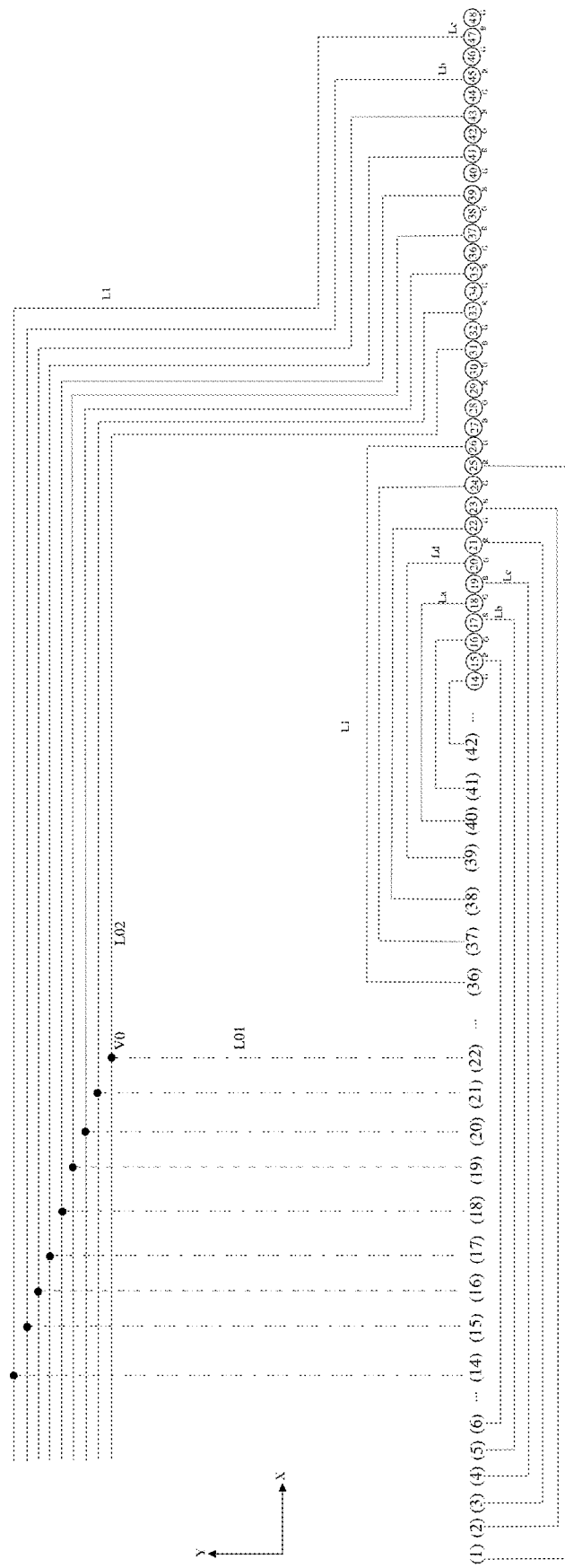
Figure 10E:
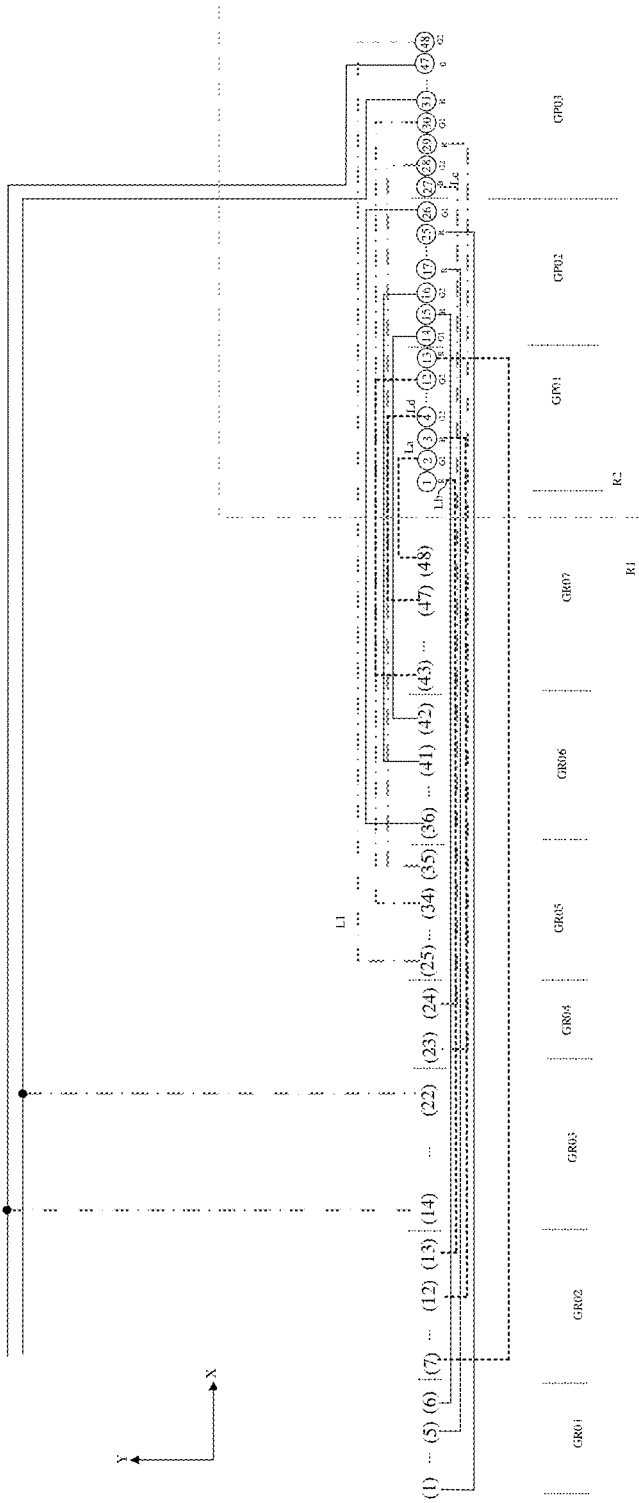

FIG. 10A to FIG. 10E are schematic diagrams of a display panel provided by an embodiment of the present disclosure. As illustrated in FIG. 10A to FIG. 10E, a row of light-emitting elements includes 48 second-region light-emitting elements; for clarity of illustration, not all of the second-region light-emitting elements are illustrated in a single diagram. A circle and a sign with a number in the circle indicate the second-region light-emitting element, and the number in the circle indicates a serial number of the second-region light-emitting element. Brackets and a sign with a number in the brackets indicate the second-type pixel circuit, and the number in the brackets indicate a serial number of the second-type pixel circuit. As illustrated in FIG. 10A, the second-region light-emitting element in the 48th column is connected with the second-type pixel circuit in the 25th column through a conductive line; for connection of remaining respective second-region light-emitting elements and second-type pixel circuits, the above description may be referred to. FIG. 10A to FIG. 10E are described by taking that the fourth light-emitting element 44 and the first light-emitting element 41 emit green light, the second light-emitting element 42 emits red light, and the third light-emitting element 43 emits blue light as an example; and the diagram illustrates that the second-region light-emitting elements are arranged in an order of RGBG. FIG. 10E illustrates G1 (which may refer to the first light-emitting element 41) and G2 (which may refer to the fourth light-emitting element 44), and thus, a form of RG1BG2 is formed. In FIG. 10A to FIG. 10E, the conductive line connected with the first light-emitting element 41 (G1 or G adjacent to B and located on the left side of B) is the first conductive line La; the conductive line connected with the second light-emitting element 42 (R) is the second conductive line Lb; the conductive line connected with the third light-emitting element 43 (B) is the third conductive line Lc; and the conductive line connected with the fourth light-emitting element 44 (G2 or G adjacent to B and located on the right side of B) is the fourth conductive line Ld.

FIG. 10A illustrates the conductive line located in the first pattern layer L11; FIG. 10A illustrates an entire conductive line and a first conductive portion L01 for forming a conductive line; the first conductive portions L01 are connected with the second-type pixel circuits in the 14th column to the 22nd column, respectively; and FIG. 10A illustrates 13 entire conductive lines and 9 first conductive portions L01.

FIG. 10B illustrates a conductive line located in the second pattern layer L12; FIG. 10B illustrates an entire conductive line and a second conductive portion L02 for forming a conductive line; the second conductive portions L02 are respectively connected with 9 second-region light-emitting elements (odd-numbered light-emitting elements in the 31st column to the 47th column) illustrated in FIG. 10A;

and FIG. 10B illustrates 13 entire conductive lines and 9 second conductive portions L02.

FIG. 10C illustrates the conductive lines located in the third pattern layer L13; FIG. 10C illustrates 13 entire conductive lines; and the 13 conductive lines are respectively connected with the second-region light-emitting elements from the 1st column to the 13th column.

FIG. 10D illustrates that the first conductive portion L01 in FIG. 10A and the second conductive portion L02 in FIG. 10B are connected through a via hole VO running through an insulating layer to form one conductive line. As illustrated in FIG. 10D, the third conductive line Lc may include a first conductive portion L01 and a second conductive portion L02 connected with each other; and the fourth conductive line Ld may include a first conductive portion L01 and a second conductive portion L02 connected with each other. As illustrated in FIG. 10D, the first conductive portion L01 extends in the second direction Y; and the second conductive portion L02 extends in the first direction X; in order to make adjacent conductive lines have a small capacitance difference, ends of a plurality of second conductive portions L02 that are away from the second-region light-emitting element are flush with each other. For example, as illustrated in FIG. 10D, lengths of the plurality of first conductive portions L01 in the second direction Y are different from each other.

Referring to FIG. 10E, a group of light-emitting elements includes a plurality of sub-groups of light-emitting elements sequentially arranged in the first direction X; and the plurality of sub-groups of light-emitting elements are located on the same side of a symmetry axis extending in the second direction Y of the second display region. For example, referring to FIG. 10E, a group of light-emitting elements includes a first sub-group of light-emitting elements GP01, a second sub-group of light-emitting elements GP02, and a third sub-group of light-emitting elements GP03. Of course, for other groups of light-emitting elements, the above-described mode of dividing light-emitting elements into a plurality of sub-groups may also be referred to.

For example, as illustrated in FIG. 10E, the first sub-group of light-emitting elements GP01 includes the first to the thirteenth light-emitting elements located in the same group of light-emitting elements (the same group of second-region light-emitting elements); and the second sub-group of light-emitting elements GP02 includes the fourteenth to the twenty-sixth light-emitting elements located in the same group of light-emitting elements (the same group of second-region light-emitting elements); the third sub-group of light-emitting elements GP03 includes the twenty-seventh to the forty-eighth light-emitting elements located in the same group of light-emitting elements (the same group of second-region light-emitting elements). Of course, in other embodiments, the same group of light-emitting elements (the same group of second-region light-emitting elements) may also be provided with other number of light-emitting elements, which may be set as needed. Referring to FIG. 7C and FIG. 10E, the embodiment of the present disclosure is described by taking that the same group of light-emitting elements (the same group of second-region light-emitting elements) includes forty-eight light-emitting elements located on the left side of the second symmetry axis X2 as an example.

For example, referring to FIG. 10C and FIG. 10E, the respective light-emitting elements in the first sub-group of light-emitting elements GP01 are connected with the conductive lines L1 located in the third pattern layer L13; referring to FIG. 10B and FIG. 10E, the light-emitting elements in the second sub-group of light-emitting elements GP02 are connected with the conductive lines L1 located in the second pattern layer L12; referring to FIG. 10A, FIG. 10B and FIG. 10E, part of light-emitting elements of the third sub-group of light-emitting elements GP03 are connected through the conductive lines L1 located in the first pattern layer L11; another part of light-emitting elements of the third sub-group of light-emitting elements GP03 are connected through conductive lines each of which is formed by a segment constituted by a first conductive portion L01 located in the first pattern layer L11 and a second conductive portion L02 located in the second conductive layer L12.

Referring to FIG. 10E, a group of pixel circuits includes a plurality of sub-groups of pixel circuits sequentially arranged in the first direction X; and the plurality of sub-groups of pixel circuits are located on the same side of a symmetry axis extending in the second direction Y of the second display region. For example, referring to FIG. 10E, a group of pixel circuits includes a first sub-group of pixel circuits GR01 to a seventh sub-group of pixel circuits GR07; and the seventh sub-group of pixel circuits GR07 is closer to the second display region than the first sub-group of pixel circuits GR01. Of course, for other groups of pixel circuits, the above-described mode of dividing pixel circuits into a plurality of sub-groups may also be referred to.

Referring to FIG. 10E, the conductive lines connected with the first sub-group of light-emitting elements GP01 are located in the same layer; the conductive lines connected with the second sub-group of light-emitting elements GP02 are located in the same layer; the conductive lines connected with the third sub-group of light-emitting elements GP03 include a conductive line located in the same layer, and also include a conductive line formed in segments; and the conductive line formed in segments includes portions located in different layers.

Referring to FIG. 10E, the conductive lines connected with the first sub-group of light-emitting elements GP01 are located in the third pattern layer L13; the conductive lines connected with the second sub-group of light-emitting elements GP02 are located in the second pattern layer L12; the conductive lines connected with the third sub-group of light-emitting elements GP03 include a conductive line located in the first pattern layer L11, and also include a conductive line formed in segments; and the conductive line formed in segments includes a first conductive portion L01 located in the first pattern layer L11 and a second conductive portion L02 located in the second pattern layer L12.

Referring to FIG. 10E, the second light-emitting element 42 and the third light-emitting element 43 in the first sub-group of light-emitting elements GP01 are connected with the second sub-group of pixel circuits GR02; the second light-emitting element 42 and the third light-emitting element 43 in the second sub-group of light-emitting elements GP02 are connected with the first sub-group of pixel circuits GR01; the second light-emitting element 42 and the third light-emitting element 43 in the third sub-group of light-emitting elements GP03 that are close to the second sub-group of light-emitting elements GP02 are connected with the fourth sub-group of pixel circuits GR04; the second light-emitting element 42 and the third light-emitting element 43 in the third sub-group of light-emitting elements GP03 that are away from the second sub-group of light-emitting elements GP02 are connected with the third sub-group of pixel circuits GR03; the first light-emitting element 41 and the fourth light-emitting element 44 in the first sub-group of light-emitting elements GP01 are connected with the seventh sub-group of pixel circuits GR07; the first light-emitting element 41 and the fourth light-emitting element 44 in the second sub-group of light-emitting elements GP02 are connected with the sixth sub-group of pixel circuits GR06; and the first light-emitting element 41 and the fourth light-emitting element 44 in the third sub-group of light-emitting elements GP03 are connected with the fifth sub-group of pixel circuits GR05.

As illustrated in FIG. 10E, in order to reduce an occupied area of the conductive lines, portions extending in the first direction X of two fourth conductive lines Ld located in different layers may at least partially overlap with each other. That is, orthographic projections of the portions extending in the first direction X of the two fourth conductive lines Ld located in different layers on the base substrate at least partially overlap with each other.

For example, in order to reduce the occupied area of the conductive lines, portions extending in the first direction X of two first conductive lines La located in different layers may at least partially overlap with each other. That is, orthographic projections of the portions extending in the first direction X of the two first conductive lines La located in different layers on the base substrate at least partially overlap with each other.

As illustrated in FIG. 10E, in order to reduce the occupied area of the conductive line, the portion extending in the first direction X of the fourth conductive line Ld may at least partially overlap with the portion extending in the first direction X of the first conductive line La that is located in a different layer from the portion extending in the first direction X of the fourth conductive line Ld. That is, an orthographic projection of the portion extending in the first direction X of the fourth conductive line Ld on the base substrate may at least partially overlap with an orthographic projection of the portion extending in the first direction X of the first conductive line La that is located in a different layer from the portion extending in the first direction X of the fourth conductive line Ld on the base substrate.

As illustrated in FIG. 10E, in order to reduce the occupied area of the conductive lines, the second conductive line Lb and the third conductive line Lc that are located in different layers partially overlap with each other. That is, an orthographic projection of the second conductive line Lb on the base substrate partially overlaps with an orthographic projection of the third conductive line Lc located in a different layer from the second conductive line Lb on the base substrate.

As illustrated in FIG. 10E, the third conductive lines Lc connected with the third sub-group of light-emitting elements GP03 partially overlap with the second conductive lines Lb connected with the first sub-group of light-emitting elements GP01, that is, an orthographic projection of the third conductive lines Lc connected with the third sub-group of light-emitting elements GP03 on the base substrate partially overlaps with an orthographic projection of the second conductive lines Lb connected with the first sub-group of light-emitting elements GP01 on the base substrate.

As illustrated in FIG. 10E, the first conductive line La and the fourth conductive line Ld are located on the same side of the group of light-emitting elements. For example, as illustrated in FIG. 10E, an orthographic projection of a portion extending in the first direction X of one first conductive line La of the plurality of first conductive lines La on the base substrate at least partially overlaps with an orthographic projection of a portion extending in the first direction X of another first conductive line La located in a different layer from the first conductive line La on the base substrate; or an orthographic projection of a portion extending in the first direction X of one first conductive line La of the plurality of first conductive lines La on the base substrate at least partially overlaps with an orthographic projection of a portion extending in the first direction X of one fourth conductive line Ld of the plurality of fourth conductive lines Ld located in a different layer from the first conductive line La on the base substrate.

As illustrated in FIG. 10E, an orthographic projection of a portion extending in the first direction X of one second conductive line Lb of the plurality of second conductive lines Lb on the base substrate at least partially overlaps with an orthographic projection of a portion extending in the first direction X of one third conductive line Lc of the plurality of third conductive lines Lc located in a different layer from the second conductive line Lb on the base substrate.

As illustrated in FIG. 10E, a portion extending in the first direction of the conductive line L1 connected with the second sub-group of light-emitting elements GP02 does not overlap with a portion extending in the first direction of other conductive lines. Of course, the portion extending in the first direction of the conductive line L1 connected with the second sub-group of light-emitting elements GP02 may overlap with a portion extending in the second direction of other conductive lines. For example, the conductive lines L1 connected with the second sub-group of light-emitting elements GP02 are located in the second pattern layer L12; the conductive lines L1 connected with the first sub-group of light-emitting elements GP01 are located in the third pattern layer L13; and the conductive lines L1 connected with the second light-emitting element 42 and the third light-emitting element 43 of the third sub-group of light-emitting elements GP03 that are closer to the second sub-group of light-emitting elements GP02 are located in the first pattern layer L11. As illustrated in FIG. 10E, the portion extending in the first direction of the conductive lines L1 connected with the second sub-group of light-emitting elements GP02 and the overlapping portions of two conductive lines overlapping with the portion extending in the first direction are alternately arranged. For example, the portion extending in the first direction of the conductive lines L1 connected with the second sub-group of pixel circuits GR02 overlaps with a portion extending in the first direction of the conductive lines L1 connected with the fourth sub-group of pixel circuits GR04; a portion extending in the first direction of the conductive lines L1 connected with the first sub-group of pixel circuits GR01 does not overlap with a portion extending in the first direction of the conductive lines L1 connected with the second sub-group of pixel circuits GR02, and does not overlap with a portion extending in the first direction of the conductive line L1 connected with the fourth sub-group of pixel circuits GR04. The conductive line in FIG. 10E includes a portion extending in the first direction X and portions extending in the second direction Y that are located on both sides of the portion extending in the first direction.

Referring to FIG. 10C and FIG. 10E, the conductive line connected with the second sub-group of pixel circuits GR02 is located in the third pattern layer L13; and the conductive line connected with the seventh sub-group of pixel circuits GR07 is located in the second pattern layer L12.

Referring to FIG. 10B, FIG. 10D and FIG. 10E, the conductive lines connected with the first sub-group of pixel circuits GR01 are located in the second pattern layer L12; and the conductive lines connected with the sixth sub-group of pixel circuits GR06 are located in the second pattern layer L12. The second conductive portions L02 of the conductive lines connected with the third sub-group of pixel circuits GR03 are located in the second pattern layer L12.

Referring to FIG. 10A and FIG. 10E, the conductive lines connected with the fifth sub-group of pixel circuits GR05 are located in the first pattern layer L11; and the conductive lines connected with the fourth sub-group of pixel circuits GR04 are located in the first pattern layer L11. The first conductive portions L01 of the conductive lines connected with the third sub-group of pixel circuits GR03 are located in the first pattern layer L11.

Referring to FIG. 10A to FIG. 10E, the number of pixel circuits included in each sub-group of pixel circuits is as illustrated by the pixel circuits between two vertical dotted lines in the diagrams. It should be noted that, those skilled in the art may set the number of pixel circuits included by each sub-group of pixel circuits as needed. FIG. 10A to FIG. 10E are described by taking that the second display region includes 48 second-region light-emitting elements as an example, but it may also be set as needed.

Referring to FIG. 10A to FIG. 10E, for clarity of illustration, a first-type pixel circuit located between two second-type pixel circuits is omitted in the diagram, and the first-region light-emitting element connected with the first-type pixel circuit is omitted.

Referring to FIG. 8A, FIG. 9A, FIG. 9B, and FIG. 10A to FIG. 10E, in a group of pixel units, or in a row of pixel units, a distance between two adjacent second-type pixel circuits is greater than a distance between two adjacent second-region light-emitting elements.

For an arrangement mode of the second-type pixel circuits in the display panel illustrated in FIG. 10A to FIG. 10E, the arrangement mode of the second-type pixel circuits illustrated in FIG. 7A, FIG. 8A, FIG. 9A and FIG. 9B and related description may be referred to, and no details will be repeated here. The mode of arranging the pixel circuit connected with the first light-emitting element in the display panel illustrated in FIG. 10A to FIG. 10E closer to the second display region than other second-type pixel circuits is favorable for reducing capacitance of the conductive line of the first light-emitting element, and is favorable for reducing capacitance difference of conductive lines connected with adjacent first light-emitting elements, to alleviate display defect, and achieve a better display effect. The mode of arranging the pixel circuits connected with the second light-emitting elements in the display panel illustrated in FIG. 10A to FIG. 10E is also favorable for reducing capacitance of the conductive line of the second light-emitting element and reducing capacitance difference of conductive lines connected with adjacent second light-emitting elements, to alleviate display defect. The mode of arranging the conductive line connected with the third light-emitting element in the display panel illustrated in FIG. 10A to FIG. 10E is also favorable for reducing capacitance of the conductive line connected with the third light-emitting element and reducing capacitance difference of conductive lines connected with adjacent third light-emitting elements, to alleviate display defect. In a case where there are more conductive lines to be provided, the mode of arranging portions extending in the first direction of the conductive lines illustrated in FIG. 10A to FIG. 10E to overlap with each other may be adopted to reduce the occupied area of the conductive lines.

Figure 10F:
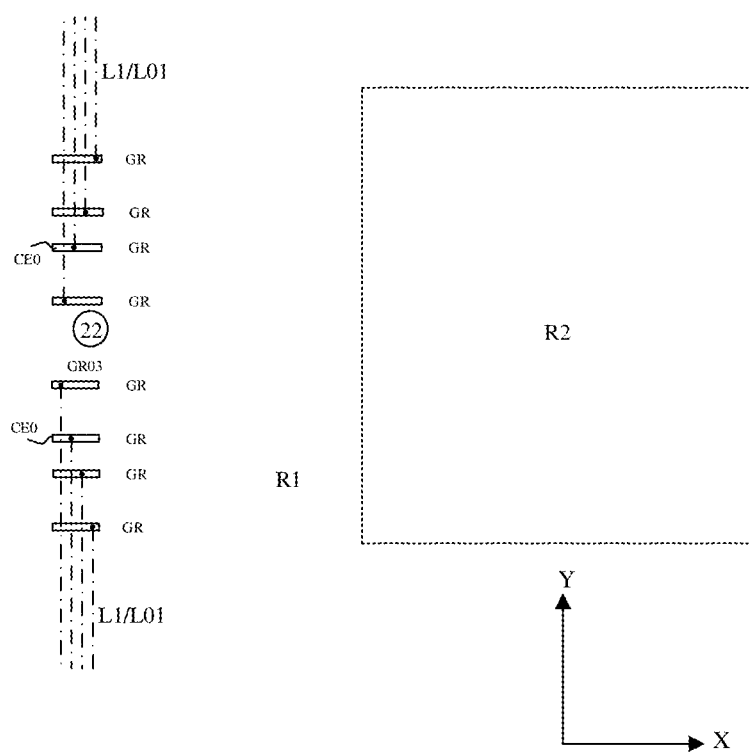
FIG. 10F is a schematic diagram of connecting elements in a column of second-type pixel circuits in a display panel provided by an embodiment of the present disclosure.

FIG. 10F is a schematic diagram of connecting elements in a column of second-type pixel circuits in a display panel provided by an embodiment of the present disclosure. As illustrated in FIG. 10F, the column of second-type pixel circuits may be a column of second-type pixel circuits in the third sub-group of pixel circuits GR03 illustrated in FIG. 10E. As illustrated in FIG. 10F, the plurality of connecting elements CE0 located in different groups of pixel circuits have the same pitch in the first direction X, to facilitate fabrication. FIG. 10F illustrates pixel circuits located in one column in the eight groups of pixel circuits GR arranged in the second direction Y, corresponding to eight connecting elements CE0. FIG. 10F is described by taking the second-type pixel circuit in the twenty-second column as an example.

Figure 10G:
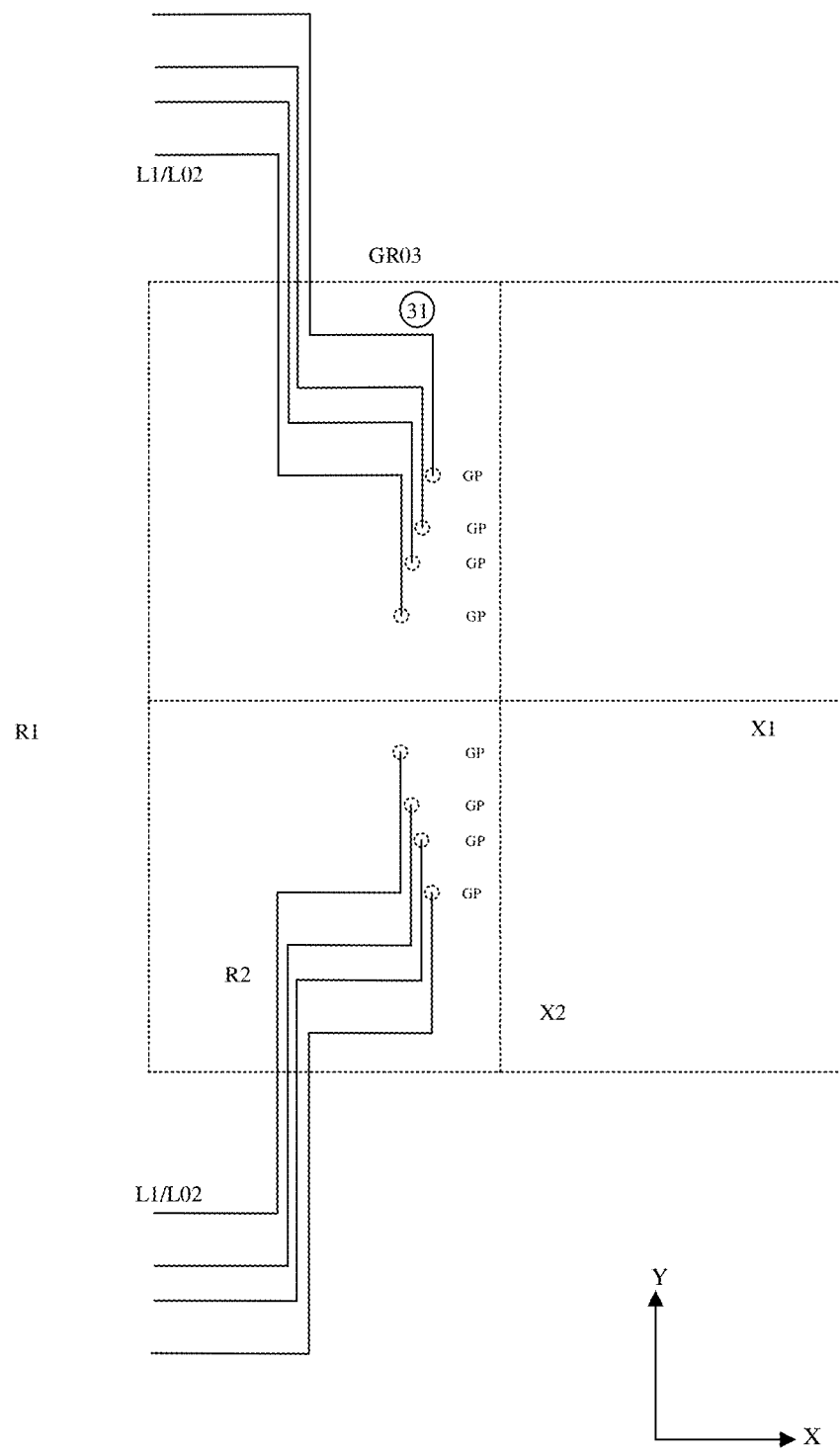
FIG. 10G is a schematic diagram of conductive lines connected with a column of second-region light-emitting elements in a display panel provided by an embodiment of the present disclosure.

FIG. 10G is a schematic diagram of a conductive line connected with a column of second-region light-emitting elements in a display panel provided by an embodiment of the present disclosure. As illustrated in FIG. 10G, the column of second-region light-emitting elements may be a column of light-emitting elements in the third sub-group of light-emitting elements GP03 illustrated in FIG. 10E. FIG. 10F is described by taking the second-region light-emitting elements in the thirty-first column as an example. As illustrated in FIG. 10F, in the same column of light-emitting elements, a connection position between the first electrode of the light-emitting element and the conductive line L1 is gradually away from the second symmetry axis X2 and then gradually close to the second symmetry axis X2.

Figure 10H:
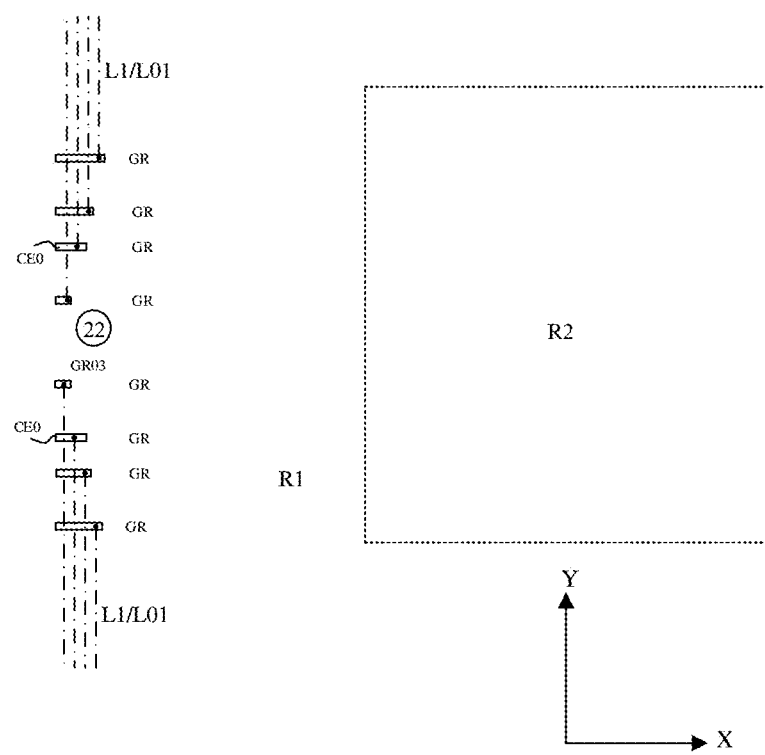
FIG. 10H is a schematic diagram of connecting elements in a column of second-type pixel circuits in a display panel provided by an embodiment of the present disclosure.

FIG. 10H is a schematic diagram of connecting elements in a column of second-type pixel circuits in a display panel provided by an embodiment of the present disclosure. As illustrated in FIG. 10H, the column of second-type pixel circuits may be a column of second-type pixel circuits in the third sub-group of pixel circuits GR03 illustrated in FIG. 10E. As illustrated in FIG. 10H, pitches of the plurality of connecting elements CE0 located in different groups of pixel circuits in the first direction X gradually change, for example, gradually decrease and then gradually increase, so as to facilitate arrangement of the conductive lines L1/first conductive portions of the conductive lines L1. FIG. 10H illustrates the pixel circuits located in one column in the eight groups of pixel circuits GR arranged in the second direction Y, corresponding to eight connecting elements CE0. FIG. 10H is described by taking the second-type pixel circuit in the twenty-second column as an example.

In the arrangement modes illustrated in FIG. 10F and FIG. 10G, or FIG. 10H and FIG. 10G, the conductive lines corresponding to different groups of light-emitting elements may be located in the same layer. Through the arrangement modes of conductive lines in the display panel illustrated in FIG. 10A to FIG. 10G, or FIG. 10H and FIG. 10G, those skilled in the art may know an arrangement mode of each group of light-emitting elements passing through the first display region and the second display region, and may know a mode of arranging the conductive lines. For example, overlapping of the conductive lines as described above refers to overlapping of the portions extending in the first direction X of the conductive lines, i.e., having a greater overlapping area or a greater overlapping length.

As illustrated in FIG. 10E, an entire conductive line located in the second pattern layer L12 does not overlap with other conductive line in a large area. For example, a portion extending in the first direction of the entire conductive line located in the second pattern layer L12 does not overlap with other conductive lines.

Referring to FIG. 8A, FIG. 8E, FIG. 9A, FIG. 9B and FIG. 10E, the second display region includes a first edge R2a, a second edge R2b, a third edge R2c, and a fourth edge R2d. For example, the first edge R2a, the second edge R2b, the third edge R2c, and the fourth edge R2d are edges of a quadrangle, respectively. A row of light-emitting elements overlap with the first edge R2a. Part of the conductive lines of the plurality of conductive lines pass through the second edge R2b intersecting with the first edge R2a from the second display region to the first display region. For example, the conductive line formed in segments passes through the second edge R2b intersecting with the first edge R2a from the second display region to the first display region.

For example, in the embodiment of the present disclosure, the conductive lines are not electrically connected with each other; and the two overlapping conductive lines are located in different layers. An insulating layer is arranged between the first pattern layer L11 and the second pattern layer L12; an insulating layer is arranged between the third pattern layer L13 and the second pattern layer L12; and an insulating layer is arranged between the first pattern layer L11 and the pixel circuit.

In the embodiment of the present disclosure, the row of light-emitting elements or a row of light-emitting elements may also be replaced by a group of light-emitting elements or a group of pixel units. The row of pixel circuits or a row of pixel circuits may also be replaced by a group of pixel circuits or a group of pixel units.

Figure 11:
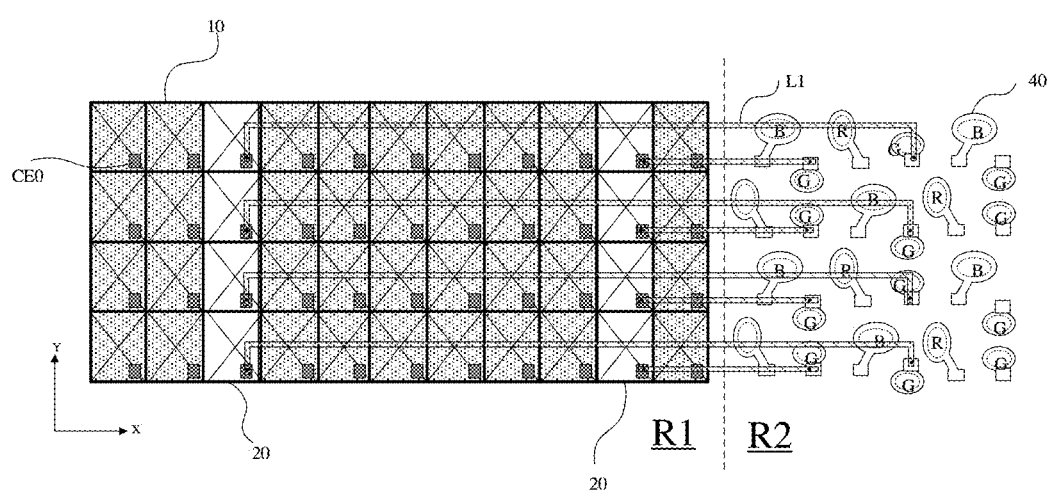
FIG. 11 is a schematic diagram of a display panel provided by an embodiment of the present disclosure.

FIG. 11 is a schematic diagram of a display panel provided by an embodiment of the present disclosure. For example, as illustrated in FIG. 11, in the auxiliary region Ra, an orthographic projection of the conductive line L1 on the base substrate BS overlaps with an orthographic projection of the first-type pixel circuit 10 on the base substrate BS. FIG. 11 illustrates an arrangement mode of G priority. The auxiliary region Ra may also be regarded as a region where the conductive line L1 is provided.

In the embodiment of the present disclosure, the first direction X and the second direction Y are both directions parallel with a main surface of the base substrate; and the third direction Z refers to a direction perpendicular to the main surface of the base substrate. For example, the main surface of the base substrate refers to the surface used to fabricate various components.

The display panel provided by the embodiments illustrated in the respective accompanying drawings of the present disclosure is described by taking that one conductive line L1 is connected with one second-type pixel circuit and connected with one second-region light-emitting element as an example; in other embodiments, one conductive line may also be connected with a plurality of second-region light-emitting elements.

Figure 12A:
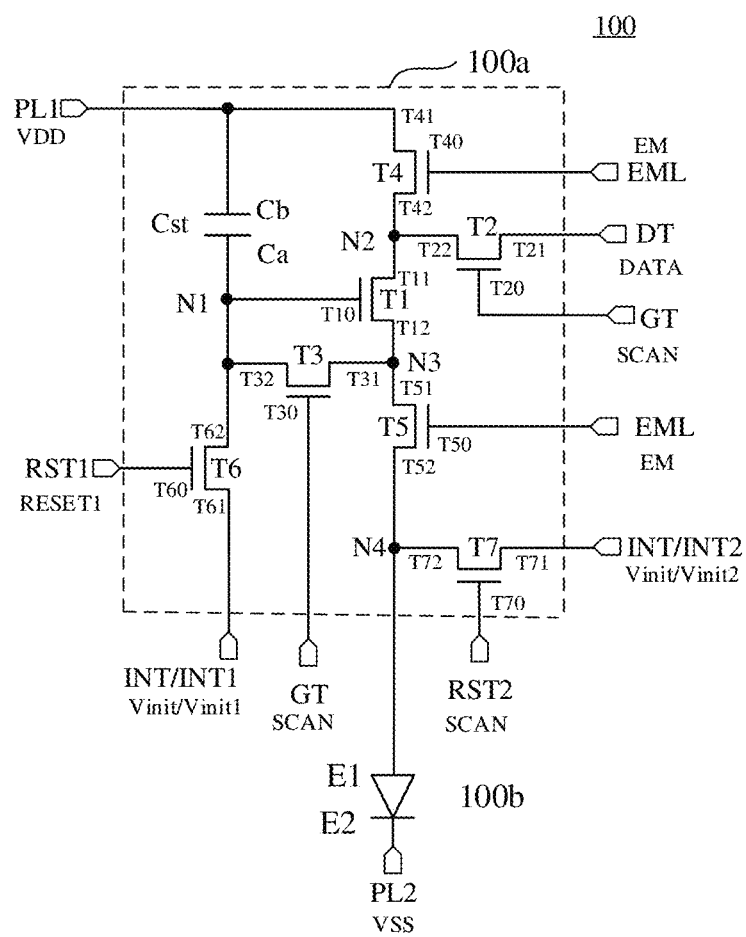
FIG. 12A is a schematic diagram of a pixel circuit in a display panel provided by an embodiment of the present disclosure.
Figure 12B:
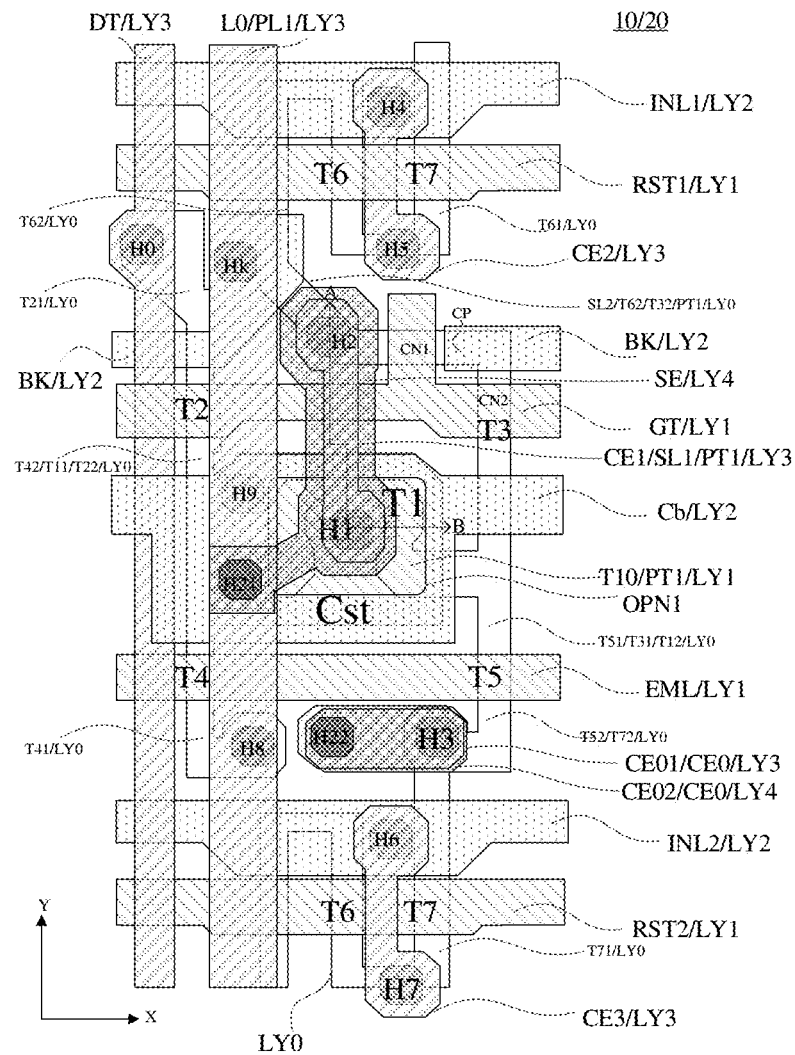
FIG. 12B is a layout diagram of a pixel circuit in a display panel provided by an embodiment of the present disclosure.
Figure 12C:
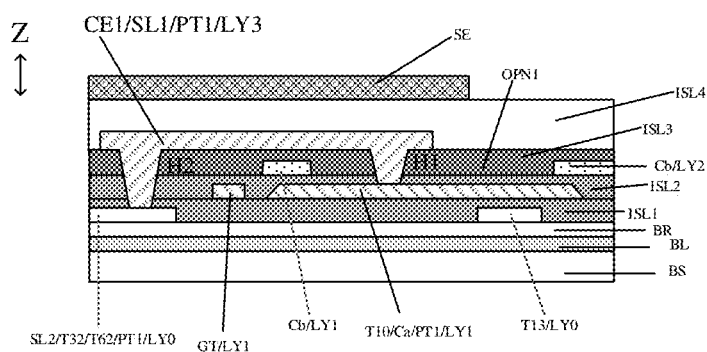
FIG. 12C is a cross-sectional view taken along line A-B of FIG. 12B.
Figure 12D:
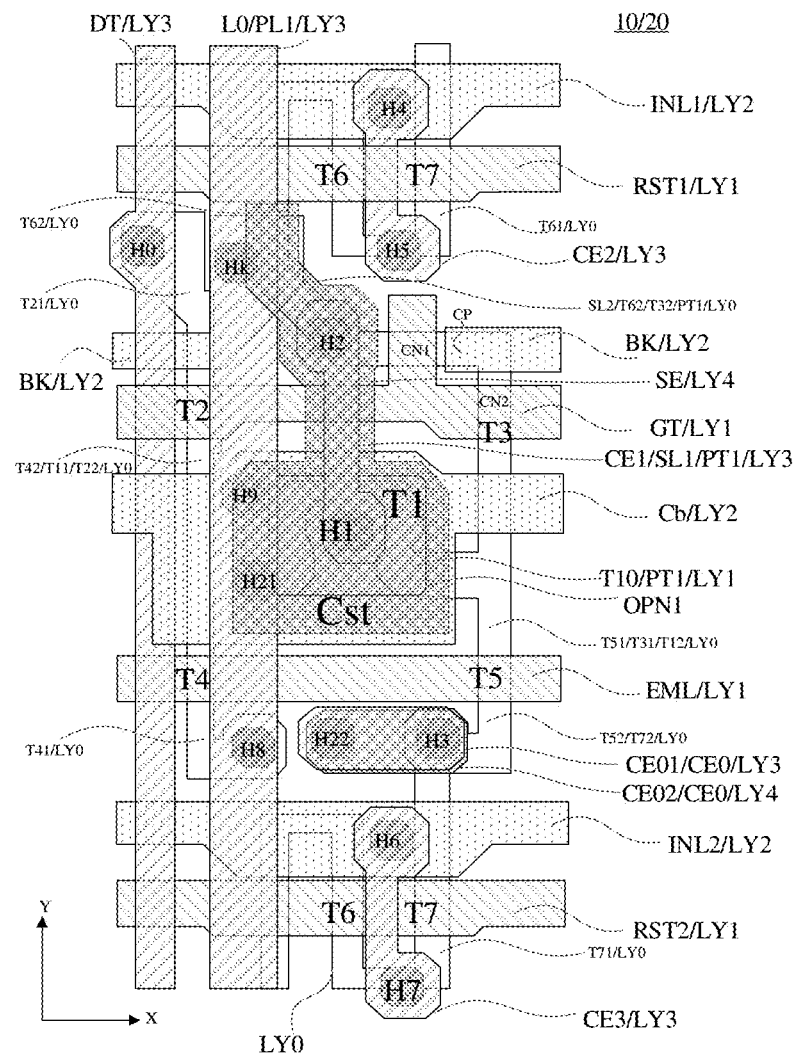
FIG. 12D is a layout diagram of a pixel circuit in a display panel provided by another embodiment of the present disclosure.
Figure 12E:
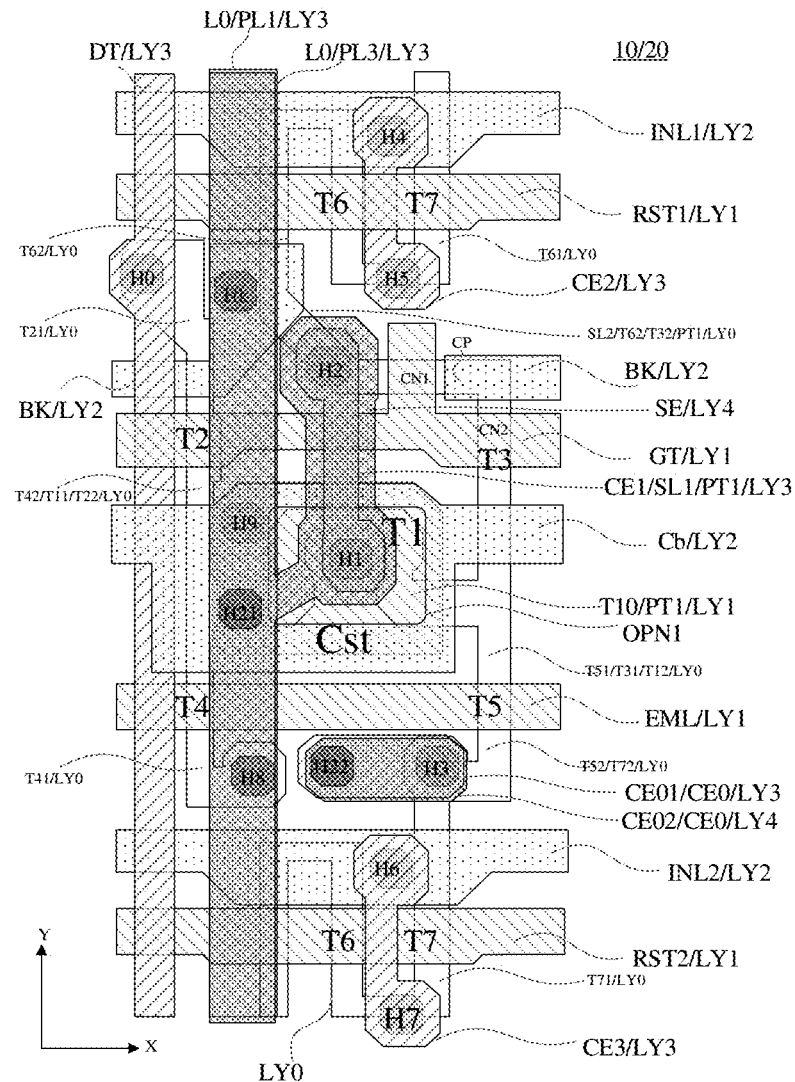
FIG. 12E is a layout diagram of a pixel circuit in a display panel provided by another embodiment of the present disclosure.

FIG. 12A is a schematic diagram of a pixel circuit in a display panel provided by an embodiment of the present disclosure. FIG. 12B is a layout diagram of a pixel circuit in a display panel provided by an embodiment of the present disclosure. FIG. 12C is a cross-sectional view taken along the line A-B of FIG. 12B. FIG. 12D is a layout diagram of a pixel circuit in a display panel provided by another embodiment of the present disclosure. FIG. 12E is a layout diagram of a pixel circuit in a display panel provided by another embodiment of the present disclosure.

The pixel circuit illustrated in FIG. 12A may be a low temperature polysilicon (LTPS) AMOLED pixel circuit commonly used in the related art.

FIG. 12A illustrates a pixel circuit of one pixel unit of the display panel. As illustrated in FIG. 12A, the pixel unit 100 includes the pixel circuit 100a and the light-emitting element 100b. The pixel circuit 100a includes six switching transistors (T2-T7), one driving transistor T1, and one storage capacitor Cst. The six switching transistors are respectively a data writing transistor T2, a threshold compensation transistor T3, a first light-emitting control transistor T4, a second light-emitting control transistor T5, a first reset transistor T6, and a second reset transistor T7. The light-emitting element 100b includes a first electrode E1 and a second electrode E2, and a light-emitting functional layer located between the first electrode E1 and the second electrode E2. For example, the first electrode E1 is an anode, and the second electrode E2 is a cathode. Generally, the threshold compensation transistor T3 and the first reset transistor T6 reduce leakage current by adopting double-gate thin film transistors (TFT).

As illustrated in FIG. 12A, the display panel includes a gate line GT, a data line DT, a first power supply line PL1, a second power supply line PL2, a light-emitting control signal line EML, an initialization signal line INT, a reset control signal line RST, and the like. For example, the reset control signal line RST includes a first reset control signal line RST1 and a second reset control signal line RST2. The first power supply line PL1 is configured to provide a constant first voltage signal VDD to the pixel unit 100, the second power supply line PL2 is configured to provide a constant second voltage signal VSS to the pixel unit 100, and the first voltage signal VDD is greater than the second voltage signal VSS. The gate line GT is configured to provide a scan signal SCAN to the pixel unit 100, the data line DT is configured to provide a data signal DATA (data voltage VDATA) to the pixel unit 100, the light-emitting control signal line EML is configured to provide a light-emitting control signal EM to the pixel unit 100, the first reset control signal line RST1 is configured to provide a first reset control signal RESET1 to the pixel unit 100, and the second reset control signal line RST2 is configured to provide the scan signal SCAN to the pixel unit 100. For example, in a row of pixel units, the second reset control signal line RST2 can be connected with the gate line GT, so as to be supplied with the scan signal SCAN. Of course, the second reset control signal line RST2 can be supplied with the second reset control signal RESET2. The first initialization signal line INT1 is configured to provide a first initialization signal Vinit1 to the pixel unit 100. The second initialization signal line INT2 is configured to provide a second initialization signal Vinit2 to the pixel unit 100. For example, the first initialization signal Vinit1 and the second initialization signal Vinit2 are constant voltage signals, and their magnitudes may be between the first voltage signal VDD and the second voltage signal VSS, but are not limited thereto. For example, the first initialization signal Vinit1 and the second initialization signal Vinit2 may both be less than or equal to the second voltage signal VSS. For example, in some embodiments, the first initialization signal line INT1 and the second initialization signal line INT1 are connected with each other, and are both configured to provide an initialization signal Vinit to the pixel unit 100, that is, the first initialization signal line INT1 and the second initialization signal line INT2 are both referred to as an initialization signal line INT, and the first initialization signal Vinit1 and the second initialization signal Vinit2 are equal, and both are Vinit.

As illustrated in FIG. 12A, the driving transistor T1 is electrically connected to the light-emitting element 100b, and outputs a driving current to drive the light-emitting element 100b to emit light under the control of the scan signal SCAN, the data signal DATA, the first voltage signal VDD, and the second voltage signal VSS.

For example, the light-emitting element 100b includes an organic light emitting diode (OLED), and the light-emitting element 100b emits red light, green light, blue light, or white light under the driving of its corresponding pixel circuit 100a. For example, one pixel includes a plurality of pixel units. One pixel may include a plurality of pixel units that emit light of different colors. For example, one pixel includes a pixel unit that emits red light, a pixel unit that emits green light, and a pixel unit that emits blue light, but it is not limited to this. The number of pixel units included in a pixel and the light output of each pixel unit can be determined according to needs.

For example, as illustrated in FIG. 12A, a gate electrode T20 of the data writing transistor T2 is connected to the gate line GT, a first electrode T21 of the data writing transistor T2 is connected to the data line DT, and a second electrode T22 of the data writing transistor T2 is connected to a first electrode T11 of the driving transistor T1.

For example, as illustrated in FIG. 12A, the pixel circuit 100*a* further includes the threshold compensation transistor T3, a gate electrode T30 of the threshold compensation transistor T3 is connected to the gate line GT, a first electrode T31 of the threshold compensation transistor T3 is connected to a second electrode T12 of the driving transistor T1, and a second electrode T32 of the threshold compensation transistor T3 is connected to a gate electrode T10 of the driving transistor T1.

For example, as illustrated in FIG. 12A, the display panel further includes the light-emitting control signal line EML, and the pixel circuit 100*a* further includes the first light-emitting control transistor T4 and the second light-emitting control transistor T5. A gate electrode T40 of the first light-emitting control transistor T4 is connected to the light-emitting control signal line EML, a first electrode T41 of the first light-emitting control transistor T4 is connected to the first power supply line PL1, and a second electrode T42 of the first light-emitting control transistor T4 is connected to the first electrode T11 of the driving transistor T1. A gate electrode T50 of the second light-emitting control transistor T5 is connected to the light-emitting control signal line EML, a first electrode T51 of the second light-emitting control transistor T5 is connected to the second electrode T12 of the driving transistor T1, and a second electrode T52 of the second light-emitting control transistors T5 is connected to a first electrode E1 of the light-emitting element 100*b*.

As illustrated in FIG. 12A, the first reset transistor T6 is connected to the gate electrode T10 of the driving transistor T1 and is configured to reset the gate electrode of the driving transistor T1, and the second reset transistor T7 is connected to the first electrode E1 of the light-emitting element 100*b* and is configured to reset the first electrode E1 of the light-emitting element 100*b*. The first initialization signal line INT1 is connected to the gate electrode of the driving transistor T1 through the first reset transistor T6. The second initialization signal line INT2 is connected to the first electrode E1 of the light-emitting element 100*b* through the second reset transistor T7. For example, the first initialization signal line INT1 and the second initialization signal line INT2 are connected to each other and are input with the same initialization signal, but it is not limited to this. In some embodiments, the first initialization signal line INT1 and the second initialization signal line INT2 may also be insulated from each other and configured to input signals respectively.

For example, as illustrated in FIG. 12A, a first electrode T61 of the first reset transistor T6 is connected to the first initialization signal line INT1, a second electrode T62 of the first reset transistor T6 is connected to the gate electrode T10 of the driving transistor T1, a first electrode T71 of the second reset transistor T7 is connected to the second initialization signal line INT2, and a second electrode T72 of the second reset transistor T7 is connected to the first electrode E1 of the light-emitting element 100*b*. For example, as illustrated in FIG. 12A, a gate electrode T60 of the first reset transistor T6 is connected to the first reset control signal line RST1, and a gate electrode T70 of the second reset transistor T7 is connected to the second reset control signal line RST2.

As illustrated in FIG. 12A, the first power supply line PL1 is configured to provide the first voltage signal VDD to the pixel circuit 100*a*. The pixel circuit further includes the storage capacitor Cst, a first electrode Ca of the storage capacitor Cst is connected to the gate electrode T10 of the driving transistor T1, and a second electrode Cb of the storage capacitor Cst is connected to the first power supply line PL1.

For example, as illustrated in FIG. 12A, the display panel further includes the second power supply line PL2, and the second power supply line PL2 is connected to a second electrode E2 of the light-emitting element 100*b*.

FIG. 12A illustrates a first node N1, a second node N2, a third node N3, and a fourth node N4. For example, in some embodiments, referring to FIG. 12A, a capacitor is formed between the first node N1 and the conductive line L1, and a capacitor is formed between the conductive line L1 and the fourth node N4, that is, the conductive line L1 is coupled with the first node N1 and the fourth node N4, respectively, resulting in brightness differences and display defects (for example, forming stripes (Mura)), which affects the display quality.

As illustrated in FIG. 12B, the pixel circuit includes the driving transistor T1, and the driving transistor includes the gate electrode T10. Referring to FIG. 12B and FIG. 12C, the second electrode Cb of the storage capacitor Cst has an opening OPN1, and one end of the connecting electrode CE1 is connected to the gate electrode T10 of the driving transistor T1 through the opening OPN1. The connection electrode CE1 may also be referred to as a first gate signal line SL1. As illustrated in FIG. 12B, the first gate signal line SL1 is connected to the gate electrode T10 of the driving transistor T1.

As illustrated in FIG. 12B, the first gate signal line SL1 is connected to the second gate signal line SL2. The gate electrode T10 of the driving transistor T1, the first gate signal line SL1, and the second gate signal line SL2 constitute a gate signal portion PT1. The potentials on the gate signal portion PT1 are the same. Of course, in other embodiments, the second gate signal line SL2 may not be provided, in this case, the gate electrode T10 of the driving transistor T1 and the first gate signal line SL1 constitute the gate signal portion PT1. For example, the second gate signal line SL2 is the second electrode T62 of the first reset transistor T6.

Referring to FIG. 12B and FIG. 12C, in order to stabilize the potentials on the gate signal portion PT1, the display panel provided by the embodiment of the present disclosure provides a shield electrode SE and a constant voltage line L0, and the constant voltage line L0 is configured to provide a constant voltage to the pixel circuit. The shield electrode SE is connected to the constant voltage line L0, so that the voltage on the shield electrode SE is stable and can play a shielding role to prevent the conductive line L1 from affecting the potentials on the gate signal portion PT1. The orthographic projection of the first gate signal line SL1 on the base substrate BS falls within the orthographic projection of the shield electrode SE on the base substrate BS.

Referring to FIG. 12B, FIG. 12D to FIG. 12E, in order to make the shield electrode play a better shielding effect and increase the shielding amount, the orthographic projection of the first gate signal line SL1 on the base substrate BS completely falls within the orthographic projection of the shield electrode SE on the base substrate BS.

For example, in order to reduce display defects (mura) and improve the display effect, the distance between a boundary of the orthographic projection of the first gate signal line SL1 on the base substrate BS and a boundary of the orthographic projection of the shield electrode SE on the base substrate BS is greater than or equal to 1.75 μm. Because the area occupied by the pixel unit is limited, the distance of the shield electrode SE beyond the first gate signal line SL1 can be defined. For example, in some embodiments, in order to obtain a better shielding effect, the distance between the boundary of the orthographic projection of the first gate signal line SL1 on the base substrate BS and the boundary of the orthographic projection of the shield electrode SE on the base substrate BS is greater than or equal to 2.33 μm.

As illustrated in FIG. 12B, the display panel further includes a block BK, and the block BK is connected to the first power supply line PL1. The threshold compensation transistor T3 includes a first channel CN1 and a second channel CN2, and the first channel CN1 and the second channel CN2 are connected by a conductive connection portion CP. The orthographic projection of the block BK on the base substrate BS at least partially overlaps with the orthographic projection of the conductive connection portion CP of the threshold compensation transistor T3 on the base substrate BS. As illustrated in FIG. 12B, the block BK of the pixel unit of the adjacent column is used to shield the conductive connection portion CP of the threshold compensation transistor T3 of the pixel unit of the current column.

For example, as illustrated in FIG. 12B, in the case where the display panel includes the second gate signal line SL2, the second gate signal line SL2 is connected to the first gate signal line SL1, and the orthographic projection of the second gate signal line SL2 on the base substrate BS falls within the orthographic projection of the block BK on the base substrate BS. For further example, the boundary of the orthographic projection of the block BK on the base substrate BS exceeds the boundary of the orthographic projection of the second gate signal line SL2 on the base substrate BS. For example, the boundary of the orthographic projection of the block BK on the base substrate BS exceeds the boundary of the orthographic projection of the second gate signal line SL2 on the base substrate BS by a distance greater than or equal to 1.75 μm. For example, the boundary of the orthographic projection of the block BK on the base substrate BS exceeds the boundary of the orthographic projection of the second gate signal line SL2 on the base substrate BS by a distance greater than or equal to 2.33 μm. Of course, in other embodiments, the shield electrode SE can also be used to replace the role of the block BK, or the orthographic projection of the second gate signal line SL2 on the base substrate BS not only falls within the orthographic projection of the block BK on the base substrate BS, but also falls within the orthographic projection of the shield electrode SE on the base substrate BS.

For example, the material of the first gate signal line SL1 is different from the material of the second gate signal line SL2. For example, the material of the first gate signal line SL1 includes a metal, and the material of the second gate signal line SL2 includes a conductive material formed by conducting a semiconductor material.

For example, as illustrated in FIG. 12B, in order to save wiring, the first power supply line PL1 serves as the constant voltage line L0. In other embodiments, in order to save wiring, the first initialization signal line INL1 can also be used as the constant voltage line or the second initialization signal line INL2 can also be used as the constant voltage line. Examples of the constant voltage line L0 are not limited to the first power supply line PL1, the first initialization signal line INL1, and the second initialization signal line INL2, and any signal line that provides a constant voltage in the pixel circuit can be used as the constant voltage line L0. The embodiment of the present disclosure takes the first power supply line PL1 as the constant voltage line L0 as an example for description, and in the case where a signal line that provides a constant voltage other than the first power supply line PL1 is used as the constant voltage line L0, the shape of the shield electrode SE may be adjusted so that it is connected to the signal line supplying a constant voltage.

For example, the orthographic projection of the conductive line L1 on the base substrate BS partially overlaps with the orthographic projection of the pixel circuit (the first pixel circuit 10) of the first pixel unit 101 on the base substrate BS. For example, the shield electrode SE is located between the conductive line L1 and the first gate signal line SL1. In the embodiment of the present disclosure, after the pixel circuit is formed, the shield electrode SE is formed, then the conductive line L1 is formed, and then the light-emitting element is formed, so that the shield electrode SE is located between the conductive line L1 and the first gate signal line SL1, and the shield electrode SE is located between the conductive line L1 and the gate electrode T10 of the driving transistor.

For example, the conductive line L1 is disposed in the auxiliary region, and the conductive line L1 is not disposed in the region other than the auxiliary region of the first display region, so that the orthographic projection of the pixel circuit (the first-type pixel circuit), which is in the region of the first display region except the auxiliary region, on the base substrate BS does not overlap with the orthographic projection of the conductive line L1 on the base substrate BS.

For example, the orthographic projection of the conductive line L1 on the base substrate BS partially overlaps with the orthographic projection of the first gate signal line SL1 in the pixel circuit of the first pixel unit 101 on the base substrate BS.

Referring to FIG. 12C and FIG. 12B a buffer layer BL is disposed on the base substrate BS, an isolation layer BR is disposed on the buffer layer BL, an active layer LY0 is disposed on the isolation layer BR, a first insulating layer ISL1 is disposed on the active layer LY0, a first conductive layer LY1 is disposed on the first insulating layer ISL1, a second insulating layer ISL2 is disposed on the first conductive layer LY1, a second conductive layer LY2 is disposed on the second insulating layer ISL2, a third insulating layer ISL3 is disposed on the second conductive layer LY2, and a third conductive layer LY3 is disposed on the third insulating layer ISL3. The third conductive layer LY3 includes a connecting electrode CE01, and the connecting electrode CE01 is connected to the second electrode T52 of the second light-emitting control transistor T5 through a via hole H3 penetrating the first insulating layer ISL1, the second insulating layer ISL2, and the third insulating layer ISL3. A fourth insulating layer and a fifth insulating layer are disposed on the third conductive layer LY3, and a fourth conductive layer LY4 is disposed on the fourth insulating layer and the fifth insulating layer. The fourth conductive layer LY4 includes a connecting electrode CE02, and the connecting electrode CE02 is connected to the connecting electrode CE01 through a via hole H22 that penetrates the fourth insulating layer and the fifth insulating layer. A sixth insulating layer is disposed on the fourth conductive layer LY4, and the light-emitting element 100*b* (the second-region light-emitting element 30) is connected to the connection electrode CE02 through a via hole penetrating the sixth insulating layer. The light-emitting element 100*b* includes a first electrode E1, a second electrode E2, and a light-emitting functional layer located between the first electrode E1 and the second electrode E2. For example, the connecting element CE0 includes the connecting electrode CE01 and the connecting electrode CE02.

As illustrated in FIG. 12B, one end of the connecting electrode CE1 is connected to the gate electrode T10 of the driving transistor T1 through a via hole H1, and the other end of the connecting electrode CE1 is connected to the second electrode T62 of the first reset transistor T6 through a via hole H2. One end of the connecting electrode CE2 is connected to the first initialization signal line INL1 through a via hole H4, and the other end of the connecting electrode CE2 is connected to the first electrode T61 of the first reset transistor T6 through a via hole H5. One end of the connecting electrode CE3 is connected to the second initialization signal line INL2 through a via hole H6, and the other end of the connecting electrode CE3 is connected to the first electrode T71 of the second reset transistor T7 through a via hole H7. The first power supply line PL1 is connected to the first electrode T41 of the first light-emitting control transistor T4 through a via hole H8. The first power supply line PL1 is connected to the second electrode Cb of the storage capacitor Cst through a via hole H9. The first power supply line PL1 is connected to the block BK through a via hole Hk. The data line DT is connected to the first electrode T21 of the data writing transistor T2 through a via hole H0.

For example, in the manufacturing process of the display panel, a self-aligned process is adopted, and a semiconductor patterned layer is subject to a conductor process by using the first conductive layer LY1 as a mask. The semiconductor pattern layer can be formed by patterning a semiconductor film. For example, the semiconductor pattern layer is heavily doped by ion implantation, so that the portion of the semiconductor pattern layer that is not covered by the first conductive layer LY1 is conducted, and a source electrode region (the first electrode T11) and a drain electrode region (the second electrode T12) of the driving transistor T1, a source electrode region (the first electrode T21) and a drain electrode region (the second electrode T22) of the data writing transistor T2, a source electrode region (the first electrode T31) and a drain electrode region (the second electrode T32) of the threshold compensation transistor T3, a source electrode region (the first electrode T41) and a drain electrode region (the second electrode T42) of the first light-emitting control transistor T4, a source electrode region (the first electrode T51) and a drain electrode region (the second electrode T52) of the second light-emitting control transistor T5, a source electrode region (the first electrode T61) and a drain electrode region (the second electrode T62) of the first reset transistor T6, and a source electrode region (the first electrode T71) and a drain electrode region (the second electrode T72) of the second reset transistor T7 are formed. The portion of the semiconductor pattern layer covered by the first conductive layer LY1 retains semiconductor characteristics, and can form a channel region of the driving transistor T1, a channel region of the data writing transistor T2, a channel region of the threshold compensation transistor T3, a channel region of the first light-emitting control transistor T4, a channel region of the second light-emitting control transistor T5, a channel region of the first reset transistor T6, and a channel region of the second reset transistor T7. For example, as illustrated in FIG. 12B, the second electrode T72 of the second reset transistor T7 and the second electrode T52 of the second light-emitting control transistor T5 are formed as an integrated structure; the first electrode T51 of the second light-emitting control transistor T5, the second electrode T12 of the driving transistor T1, and the first electrode T31 of the threshold compensation transistor T3 are formed as an integrated structure; the first electrode T11 of the driving transistor T1, the second electrode T22 of the data writing transistor T2, and the second electrode T42 of the first light-emitting control transistor T4 are formed as an integrated structure; and the second electrode T32 of the threshold compensation transistor T3 and the second electrode T62 of the first reset transistor T6 are formed as an integrated structure. In some embodiments, as illustrated in FIG. 12B, the first electrode T71 of the second reset transistor T7 and the first electrode T61 of the first reset transistor T6 may be formed as an integrated structure.

For example, the channel regions of the transistors used in the embodiment of the present disclosure may adopt monocrystalline silicon, polycrystalline silicon (such as low temperature polysilicon), or metal oxide semiconductor materials (such as IGZO, AZO, etc.). In one embodiment, the transistors are all P-type low temperature polysilicon (LTPS) thin film transistors. In another embodiment, the threshold compensation transistor T3 and the first reset transistor T6, that are directly connected to the gate electrode of the driving transistor T1, are metal oxide semiconductor thin film transistors, that is, the channel material of the transistor is a metal oxide semiconductor material (such as IGZO, AZO, etc.). The metal oxide semiconductor thin film transistor has a lower leakage current, which can help reduce the leakage current of the gate electrode of the driving transistor T1.

For example, the transistors adopted in the embodiments of the present disclosure may include various structures, such as a top gate type, a bottom gate type, or a dual-gate structure. In one embodiment, the threshold compensation transistor T3 and the first reset transistor T6, which are directly connected to the gate electrode of the driving transistor T1, are dual-gate thin film transistors, which can help reduce the leakage current of the gate electrode of the driving transistor T1.

For example, the display panel further includes a pixel definition layer and a spacer. The pixel definition layer has an opening, and the opening of the pixel definition layer is configured to define the light-emitting area (light exit region, effective light-emitting area) of the pixel unit. The spacer is configured to support a fine metal mask when forming the light-emitting functional layer.

For example, the opening is the light exit region of the pixel unit. The light-emitting functional layer is located on the first electrode E1 of the light-emitting element 100*b*, and the second electrode E2 of the light-emitting element 100*b* is located on the light-emitting functional layer. For example, an encapsulation layer is disposed on the light-emitting element 100*b*. The encapsulation layer includes a first encapsulation layer, a second encapsulation layer, and a third encapsulation layer. For example, the first encapsulation layer and the third encapsulation layer are inorganic material layers, and the second encapsulation layer is an organic material layer. For example, the first electrode E1 is the anode of the light-emitting element 100*b*, and the second electrode E2 is the cathode of the light-emitting element 100*b*, but it is not limited thereto.

FIG. 12D is a layout diagram of a first-type pixel circuit or a second-type pixel circuit in a display panel provided by an embodiment of the present disclosure. For example, as illustrated in FIG. 12D, the orthographic projection of the gate electrode T10 of the driving transistor T1 on the base substrate BS falls within the orthographic projection of the shield electrode SE on the base substrate BS.

For example, as illustrated in FIG. 12D, in the case where the display panel includes the second gate signal line SL2, the second gate signal line SL2 is connected to the first gate signal line SL1, and the orthographic projection of the second gate signal line SL2 on the base substrate BS also falls within the orthographic projection of the shield electrode SE on the base substrate BS. For further example, the boundary of the orthographic projection of the shield electrode SE on the base substrate BS exceeds the boundary of the orthographic projection of the second gate signal line SL2 on the base substrate BS. For example, the boundary of the orthographic projection of the shield electrode SE on the base substrate BS exceeds the boundary of the orthographic projection of the second gate signal line SL2 on the base substrate BS by a distance greater than or equal to 1.75 μm. For example, the boundary of the orthographic projection of the shield electrode SE on the base substrate BS exceeds the boundary of the orthographic projection of the second gate signal line SL2 on the base substrate BS by a distance greater than or equal to 2.33 μm.

For example, as illustrated in FIG. 12D, the orthographic projections of the gate electrode T10 of the driving transistor T1, the first gate signal line SL1, and the second gate signal line SL2 on the base substrate BS all fall into the orthographic projection of the shield electrode SE on the base substrate BS.

For example, as illustrated in FIG. 12D, the orthographic projection of the shield electrode SE on the base substrate BS partially overlaps with the orthographic projection of the second gate signal line SL2 on the base substrate BS, and the orthographic projection of the block BK on the base substrate BS partially overlaps with the orthographic projection of the second gate signal line SL2 on the base substrate BS. Thus, in the display panel illustrated in FIG. 12D, the shield electrode SE and the block BK form a double-layer shield for the second gate signal line SL2.

For example, as illustrated in FIG. 12D, the orthographic projection of the shield electrode SE on the base substrate BS partially overlaps with the orthographic projection of the block BK on the base substrate BS.

Of course, in other embodiments, the block BK may not be provided, or the orthographic projection of the block BK on the base substrate BS does not overlap with the orthographic projection of the second gate signal line SL2 on the base substrate BS.

FIG. 12E is a layout diagram of a first-type pixel circuit or a second-type pixel circuit in a display panel provided by an embodiment of the present disclosure. As illustrated in FIG. 12E, the fourth conductive layer LY4 further includes a third power supply line PL3. The third power supply line PL3 is formed integrally with the shield electrode SE. The third power supply line PL3 is connected to the first power supply line PL1 through a via hole H21 to form a parallel structure to reduce resistance. The third power supply line PL3 extends in the second direction Y. As illustrated in FIG. 12E, the size of the third power supply line PL3 in the second direction Y is larger than the size of the shield electrode SE in the second direction Y.

For example, as illustrated in FIG. 12B, and FIG. 12E, the orthographic projection of the block BK on the base substrate BS partially overlaps with the orthographic projection of the second gate signal line SL2 on the base substrate BS, and the orthographic projection of the shield electrode SE on the base substrate BS partially overlaps with the orthographic projection of the first gate signal line SL1 on the base substrate BS, so that the block BK and the shield electrode SE jointly function as a shield for the gate signal portion PT1. Of course, in other embodiments, the block BK may not be provided, or the orthographic projection of the block BK on the base substrate BS dose not overlap with the orthographic projection of the second gate signal line SL2 on the base substrate BS.

For example, as illustrated in FIG. 12B, and FIG. 12E, the block BK on the left extends to a pixel unit on the left side of the pixel unit illustrated in the figure, in order to shield the conductive connection portion CP of the threshold compensation transistor T3, while the block BK on the right is extended from the block BK connected to a pixel unit on the right side of the pixel unit illustrated in the figure.

As illustrated in FIG. 12B, FIG. 12D, and FIG. 12E, the channel of each transistor as well as the first electrode and the second electrode on both sides of the channel are located in the active layer LY0; the first reset control signal line RST1, the gate line GT, the gate electrode T10 of the driving transistor (the first electrode Ca of the storage capacitor Cst), the light-emitting control signal line EML and the second reset control signal line RST2 are located in the first conductive layer LY1; the first initialization signal line INL1, the second electrode Cb of the storage capacitor Cst, and the second initialization signal line INL2 are located in the second conductive layer LY2; the data line DT, the first power supply line PL1, the connecting electrode CE1, the connecting electrode CE2, the connecting electrode CE3, and the connecting electrode CE01 are located in the third conductive layer LY3; and the shield electrode SE is located in the fourth conductive layer LY4. As illustrated in FIG. 12E, the shield electrode SE and the third power supply line PL3 are located in the fourth conductive layer LY4.

As illustrated in FIG. 12B, FIG. 12D, and FIG. 12E, the first initialization signal line INL1, the first reset control signal line RST1, the gate line GT, the light-emitting control signal line EML, the second initialization signal line INL2, and the second reset control signal lines RST2 all extend in the first direction X. As illustrated in FIG. 12B, FIG. 12D, and FIG. 12E, the data line DT and the first power supply line PL1 both extend in the second direction Y.

In the embodiments of the present disclosure, an orthographic projection of an element A on the base substrate BS falls within an orthographic projection of an element B on the base substrate BS means that the orthographic projection of the element A on the base substrate BS completely falls into the orthographic projection of the element B on the base substrate BS, that is, the orthographic projection of the element B on the base substrate BS covers the orthographic projection of the element A on the base substrate BS, and the area of the orthographic projection of the element A on the base substrate BS is less than or equal to the area of the orthographic projection of the element B on the base substrate BS.

For example, in some embodiments of the present disclosure, each pixel circuit 100a is provided with any one of the shield electrodes SE described above. That is, both the first-type pixel circuit 10 of the first pixel unit 101 and the second-type pixel circuit 20 of the second pixel unit 102 are provided with any one of the shield electrodes SE described above, but it is not limited thereto. For example, in some embodiments, the shield electrodes SE is not provided in each pixel circuit 100a.

For example, the transistors in the pixel circuit of the embodiment of the present disclosure are all thin film transistors. For example, the first conductive layer LY1, the second conductive layer LY2, the third conductive layer LY3, and the fourth conductive layer LY4 are all made of metal materials. For example, the first conductive layer LY1 and the second conductive layer LY2 are formed of metal materials such as nickel and aluminum, etc., but are not limited thereto. For example, the third conductive layer LY3 and the fourth conductive layer LY4 are formed of materials such as titanium, aluminum, etc., but are not limited thereto. For example, the third conductive layer LY3 and the fourth conductive layer LY4 are respectively a structure formed by three sub-layers of Ti/AL/Ti, but are not limited thereto. For example, the base substrate may be a glass substrate or a polyimide substrate, but it is not limited to this, and can be selected as required. For example, the buffer layer BL, the isolation layer BR, the first insulating layer ISL1, the second insulating layer ISL2, the third insulating layer ISL3, the fourth insulating layer IS4, the fifth insulating layer, and the sixth insulating layer are all made of insulating materials. The materials of the first electrode E1 and the second electrode E2 of the light-emitting element can be selected as required. In some embodiments, the first electrode E1 may adopt at least one of transparent conductive metal oxide and silver, but it is not limited thereto. For example, the transparent conductive metal oxide includes indium tin oxide (ITO), but is not limited thereto. For example, the first electrode E1 may adopt a structure in which three sub-layers of ITO-Ag-ITO are arranged. In some embodiments, the second electrode E2 may adopt a metal of low work function, for example at least one of magnesium and silver, but is not limited thereto.

For example, referring to the layout diagrams and the cross-sectional views of the embodiment of the present disclosure, the display panel provided by at least one embodiment of the present disclosure can be manufactured by the following method.

(1) Forming a buffer layer BL and an isolation layer BR on the base substrate BS.
(2) Forming a semiconductor film on the isolation layer BR.
(3) Patterning the semiconductor film to form a semiconductor pattern layer.
(4) Forming a first insulating film on the semiconductor pattern layer.
(5) Forming a first conductive film on the first insulating film, and patterning the first conductive film to form the first conductive layer LY1.
(6) Dopping the semiconductor pattern layer by using the first conductive layer LY1 as a mask, so as to form the active layer LY0.
(7) Forming a second insulating film on the first conductive layer LY1.
(8) Forming a second conductive film on the second insulating layer ISL2, and patterning the second conductive film to form the second conductive layer LY2.
(9) Forming a third insulating film on the second conductive layer LY2.
(10) Patterning at least one of the first insulating film, the second insulating film, and the third insulating film to simultaneously form via holes, the first insulating layer ISL1, the second insulating layer ISL2, and the third insulating layer ISL3.
(11) Forming a third conductive film, and patterning the third conductive film to form the third conductive layer LY3; the components in the third conductive layer LY3 being connected to the components located under the third conductive layer LY3 through the via holes.
(12) Forming a fourth insulating film and a fifth insulating film, and patterning the fourth insulating film and the fifth insulating film to simultaneously form via holes, the fourth insulating layer and the fifth insulating layer.
(13) Forming a fourth conductive film, and patterning the fourth conductive film to form the fourth conductive layer LY4.
(14) Forming at least one insulating layer and at least one transparent conductive layer, and the transparent conductive layer including the conductive lines L1.
(15) Forming a first electrode E1 of the light-emitting element.
(16) Forming a pixel definition layer and a spacer.
(17) Forming a light-emitting functional layer.
(18) Forming a second electrode E2 of the light-emitting element.
(19) Forming an encapsulation layer CPS.

Of course, in the display panel provided by the embodiment of the present disclosure, the shield electrode SE may not be provided.

At least one embodiment of the present disclosure provides a display device, including any one of the above-described display panels.

Figure 13A:
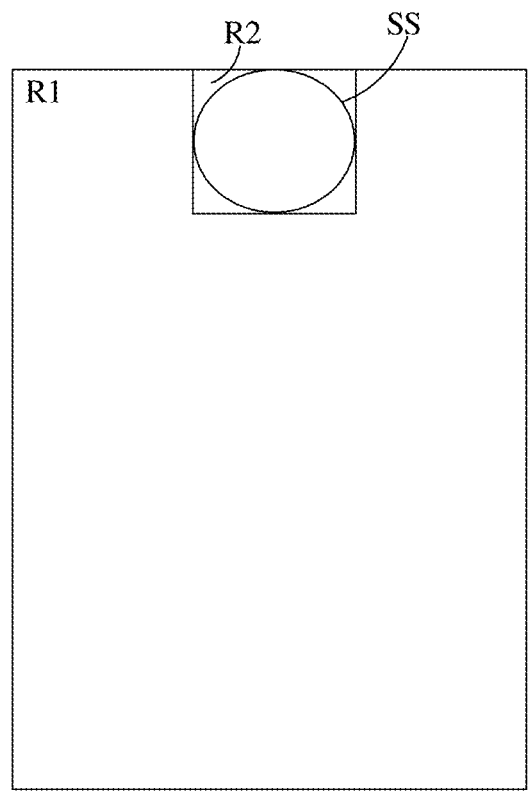
FIG. 13A and FIG. 13B are schematic diagrams of a display device provided by an embodiment of the present disclosure.
Figure 13B:
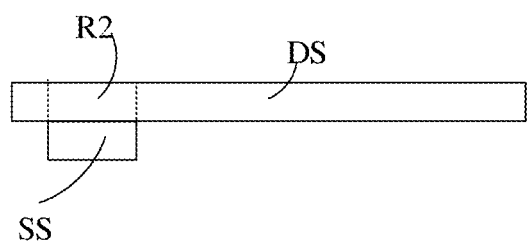

FIG. 13A and FIG. 13B are schematic diagrams of a display device provided by an embodiment of the present disclosure. As illustrated in FIG. 13A and FIG. 13B, a sensor SS is located on a side of the display panel DS and located in a second display region R2. Ambient light may be transmitted through the second display region R2 and sensed by the sensor SS. As illustrated in FIG. 13B, a side of the display panel where the sensor SS is not provided is a display side, which may display images. For example, the sensor includes a photosensitive sensor; and the photosensitive sensor is located on a side of the display panel.

For example, the second display region R2 may be rectangular, and an area of an orthographic projection of the sensor SS on the base substrate BS may be less than or equal to an area of an inscribed circle of the second display region R2. That is, a pitch of a region where the sensor SS is located may be less than or equal to a pitch of the inscribed circle of the second display region R2. For example, the pitch of the region where the sensor SS is located is equal to the pitch of the inscribed circle of the second display region R2, that is, a shape of the region where the sensor SS is located may be circular, and correspondingly, the region where the sensor SS is located may also be referred to as a light-transmitting hole. Of course, in some embodiments, the second display region R2 may also have a shape other than a rectangle, for example, a circle or an ellipse.

For example, the display device is a full-screen display device with an under-screen camera. For example, the display device includes products or components with display function that including the above-mentioned display panel, such as a TV, a digital camera, a mobile phone, a watch, a tablet computer, a laptop computer, a navigator, and the like.

Figure 14:
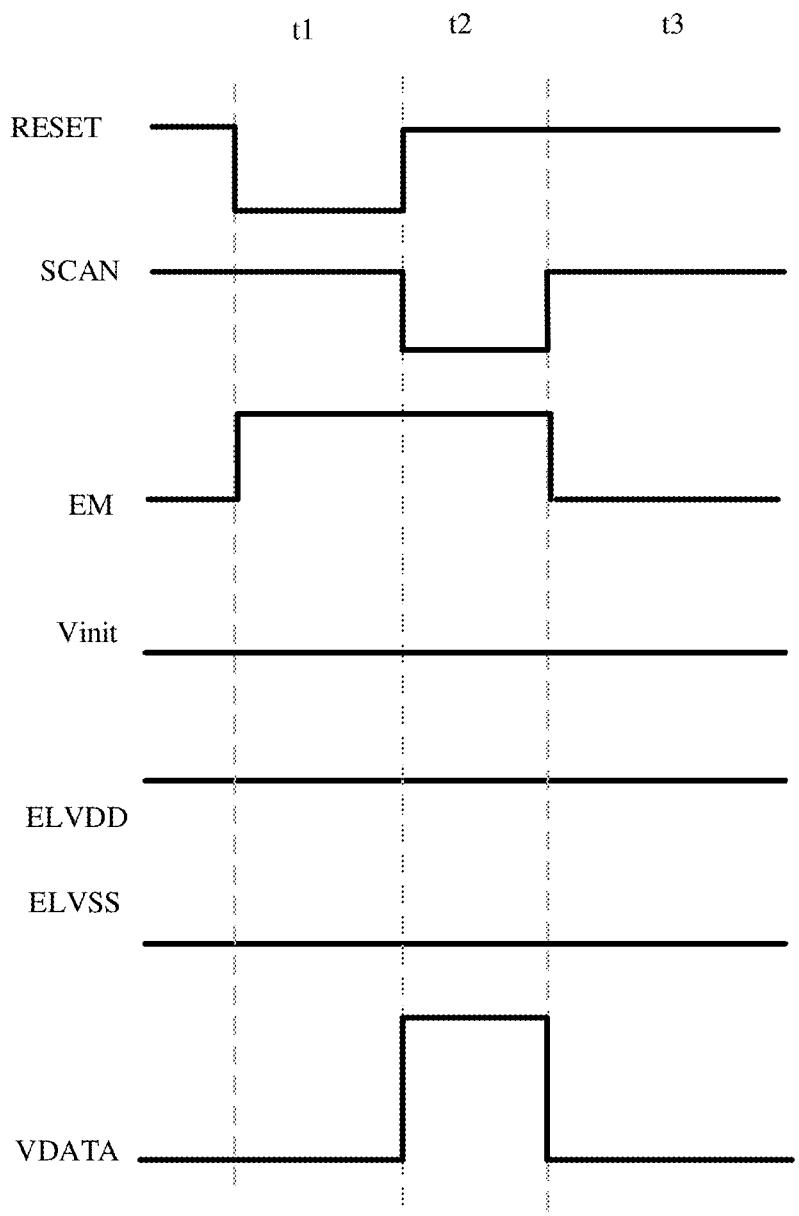
FIG. 14 is a working timing diagram of the pixel circuit illustrated in FIG. 12A.

FIG. 14 is a working timing diagram of the pixel circuit illustrated in FIG. 12A. As illustrated in FIG. 14, during one frame of display period, the driving method of the pixel unit includes a first reset stage t1, a data writing, threshold compensation and second reset stage t2, and a light-emitting stage t3. When the reset control signal RESET is at a low level, the gate electrode of the driving transistor T1 is reset, and when the scan signal SCAN is at a low level, the first electrode E1 (for example, the anode) of the light-emitting element 100b is reset. For example, as illustrated in FIG. 12A, when the scan signal SCAN is at a low level, the data voltage VDATA is written, and the threshold voltage Vth of the driving transistor T1 is obtained at the same time, and the data voltage VDADA containing the data information on the data line is stored in the capacitor Cst. When the light-emitting control signal line EML is at a low level, the light-emitting element 100b emits light, and the voltage of the first node N1 (node of the gate electrode) is maintained by the storage capacitor Cst (the light-emitting stability of the light-emitting element 100b). In the driving process of the pixel circuit 10, in the light-emitting stage, the storage capacitor is used to maintain the voltage signal, so that the potential of the signal holding terminal can be kept constant, and a voltage is formed between the gate electrode and the source electrode of the driving transistor, thereby controlling the driving transistor to form a driving current, and then driving the light-emitting element 100b to emit light.

As illustrated in FIG. 14, in the reset stage t1, the light-emitting control signal EM is set to a turn-off voltage, the reset control signal RESET is set to a turn-on voltage, and the scan signal SCAN is set to the turn-off voltage.

As illustrated in FIG. 14, in the data writing, threshold compensation and second reset stage t2, the light-emitting control signal EM is set to the turn-off voltage, the reset control signal RESET is set to the turn-off voltage, and the scan signal SCAN is set to the turn-on voltage.

As illustrated in FIG. 14, in the light-emitting stage t3, the light-emitting control signal EM is set to the turn-on voltage, the reset control signal RESET is set to the turn-off voltage, and the scan signal SCAN is set to the turn-off voltage.

As illustrated in FIG. 14, the first voltage signal ELVDD and the second voltage signal ELVSS are both constant voltage signals. For example, the level of the initialization signal Vinit is between the level of the first voltage signal ELVDD and the level of the second voltage signal ELVSS.

For example, the turn-on voltage in the embodiment of the present disclosure refers to a voltage that can electrically connect the first electrode and the second electrode of the corresponding transistor (the transistor is in ON state), and the turn-off voltage refers to a voltage that can electrically disconnect the first electrode and the second electrode of the corresponding transistor (the transistor is in OFF state). In the case where the transistor is a P-type transistor, the turn-on voltage is a low voltage (for example, 0V), and the turn-off voltage is a high voltage (for example, 5V); and in the case where the transistor is an N-type transistor, the turn-on voltage is a high voltage (for example, 5V) and the turn-off voltage is a low voltage (for example, 0V). The driving waveforms illustrated in FIG. 14 are all explained by taking the P-type transistor as an example. For example, the turn-on voltage is a low voltage (for example, 0V), and the turn-off voltage is a high voltage (for example, 5V), but it is not limited to this.

Please refer to FIG. 12A and FIG. 14 together. In the first reset stage t1, the light-emitting control signal EM is of the turn-off voltage, the reset control signal RESET is of the turn-on voltage, and the scan signal SCAN is of the turn-off voltage. At this time, the first reset transistor T6 is in an ON state, and the second reset transistor T7, the data writing transistor T2, the threshold compensation transistor T3, the first light-emitting control transistor T4, and the second light-emitting control transistor T5 are in an OFF state. The first reset transistor T6 transmits the first initialization signal (initialization voltage Vinit) Vinit1 to the gate electrode of the driving transistor T1, and the first initialization signal Vinit1 is stored by the storage capacitor Cst. The driving transistor T1 is reset, and the data stored during the last (previous frame) light-emitting is erased.

In the data writing, threshold compensation, and second reset stage t2, the light-emitting control signal EM is of the turn-off voltage, the reset control signal RESET is of the turn-off voltage, and the scan signal SCAN is of the turn-on voltage. At this time, the data writing transistor T2 and the threshold compensation transistor T3 are in the ON state, the second reset transistor T7 is in the ON state, and the second reset transistor T7 transmits the second initialization signal (initialization voltage Vinit) Vinit2 to the first electrode E1 of the light-emitting element 100b to reset the light-emitting element 100b. The first light-emitting control transistor T4, the second light-emitting control transistor T5, and the first reset transistor T6 are in the OFF state. At this time, the data writing transistor T2 transmits the data voltage VDATA to the first electrode of the driving transistor T1, that is, the data writing transistor T2 receives the scan signal SCAN and the data voltage VDATA and writes the data voltage VDATA to the first electrode of the driving transistor T1 according to the scan signal SCAN. The threshold compensation transistor T3 is turned on to connect the driving transistor T1 into a diode structure, thereby charging the gate electrode of the driving transistor T1. After the charging is completed, the voltage of the gate electrode of the driving transistor T1 is VDATA+Vth, where VDATA is the data voltage and Vth is the threshold voltage of the driving transistor T1, that is, the threshold compensation transistor T3 receives the scan signal SCAN and performs threshold voltage compensation to the gate electrode of the driving transistor T1 according to the scan signal SCAN. During this stage, the voltage difference between both ends of the storage capacitor Cst is ELVDD−VDATA−Vth.

In the light-emitting stage t3, the light-emitting control signal EM is of the turn-on voltage, the reset control signal RESET is of the turn-off voltage, and the scan signal SCAN is of the turn-off voltage. The first light-emitting control transistor T4 and the second light-emitting control transistor T5 are in the ON state, while the data writing transistor T2, the threshold compensation transistor T3, the first reset transistor T6 and the second reset transistor T7 are in the OFF state. The first voltage signal ELVDD is transmitted to the first electrode of the driving transistor T1 through the first light-emitting control transistor T4, the voltage of the gate electrode of the driving transistor T1 is maintained at VDATA+Vth, and the light-emitting current I flows into the light-emitting element 100b through the first light-emitting control transistor T4, the driving transistor T1, and the second light-emitting control transistor T5, and then the light-emitting element 100b emits light. That is, the first light-emitting control transistor T4 and the second light-emitting control transistor T5 receive the light-emitting control signal EM, and control the light-emitting element 100b to emit light according to the light-emitting control signal EM. The light-emitting current I satisfies the following saturation current formula:

$$K(Vgs-Vth)^2 = K(VDATA+Vth-ELVDD-Vth)^2 = K(VDATA-ELVDD)^2$$

Among them, $$K = 0.5\mu_n \text{Cox} \frac{W}{L},$$

μn is the channel mobility of the driving transistor, Cox is the channel capacitance per unit area of the driving transistor T1, W and L are the channel width and channel length of the driving transistor T1, respectively, and Vgs is the voltage difference between the gate electrode and the source electrode (that is, the first electrode of the driving transistor T1 in this embodiment) of the driving transistor T1.

It can be seen from the above formula that the current flowing through the light-emitting element 100b is independent of the threshold voltage of the driving transistor T1. Therefore, the pixel circuit compensates the threshold voltage of the driving transistor T1 very well.

For example, the ratio of the duration of the light-emitting stage t3 to the display period of one frame can be adjusted. In this way, the luminous brightness can be controlled by adjusting the ratio of the duration of the light-emitting stage t3 to the display period of one frame. For example, by controlling a scan driving circuit in the display panel or an additional driving circuit, the ratio of the duration of the light-emitting stage t3 to the display period of one frame can be adjusted.

For example, the embodiments of the present disclosure are not limited to the specific pixel circuit illustrated in FIG. 12A, and other pixel circuits that can realize compensation for the driving transistor may be adopted. Based on the description and teaching of the implementation manner in the present disclosure, other setting manners that a person of ordinary skill in the art can easily think of without creative work fall within the protection scope of the present disclosure.

The above description takes the 7T1C pixel circuit as an example, and the embodiments of the present disclosure include but are not limited to this. It should be noted that the embodiments of the present disclosure do not limit the number of thin film transistors and the number of capacitors included in the pixel circuit. For example, in some other embodiments, the pixel circuit of the display panel may also be a structure including other numbers of transistors, such as a 7T2C structure, a 6T1C structure, a 6T2C structure, or a 9T2C structure, which is not limited in the embodiments of the present disclosure. Of course, the display panel may also include pixel circuits with less than 7 transistors.

Generally, for example, a first initialization signal Vinit1 and a second initialization signal Vinit2 both use a constant voltage of −3 V. In the display panel provided by some embodiments of the present disclosure, the second initialization signal Vinit2 may be a constant voltage greater than or equal to −2 V, that is, the second initialization signal Vinit2 is increased from −3 V to −2 V or above −2 V, thereby increasing light emission duration of the first light-emitting element to alleviate display defect. In a case where the display panel has a fourth light-emitting element, light emission duration of the first light-emitting element and the fourth light-emitting element is increased. For example, the light emission duration of the first light-emitting element and the fourth light-emitting element may be increased by 12%.

In the related art, the pixel circuit (including the first-type pixel circuit 10 and the second-type pixel circuit 20) has the same pitch as that of the first-region light-emitting element 30. For example, generally, a width is about 30 microns (μm) to 32 μm, and a length is about 60 μm to 65 μm. In the embodiment of the present disclosure, in order to provide sufficient space for arrangement of the second-type pixel circuit 20 without reducing the number of pixels in the first display region R1, the respective pixel circuits may be compressed in the first direction X (e.g., a gate line extension direction, which may also be referred to as a lateral direction), so that a width of the pixel circuit in the first direction is less than a width of the first-region light-emitting element 30; or the first-region light-emitting element 30 is stretched in the first direction X, so that a width of the first-region light-emitting element 30 is greater than the width of the first-region light-emitting element 30. In this way, under the premise that the base substrates BS have the same pitch, there may be more extra regions in the first display region R1, and accordingly, the second-type pixel circuit 20 for driving the second light-emitting element 40 located in the second display region R2 may be provided in the extra regions.

Figure 15:
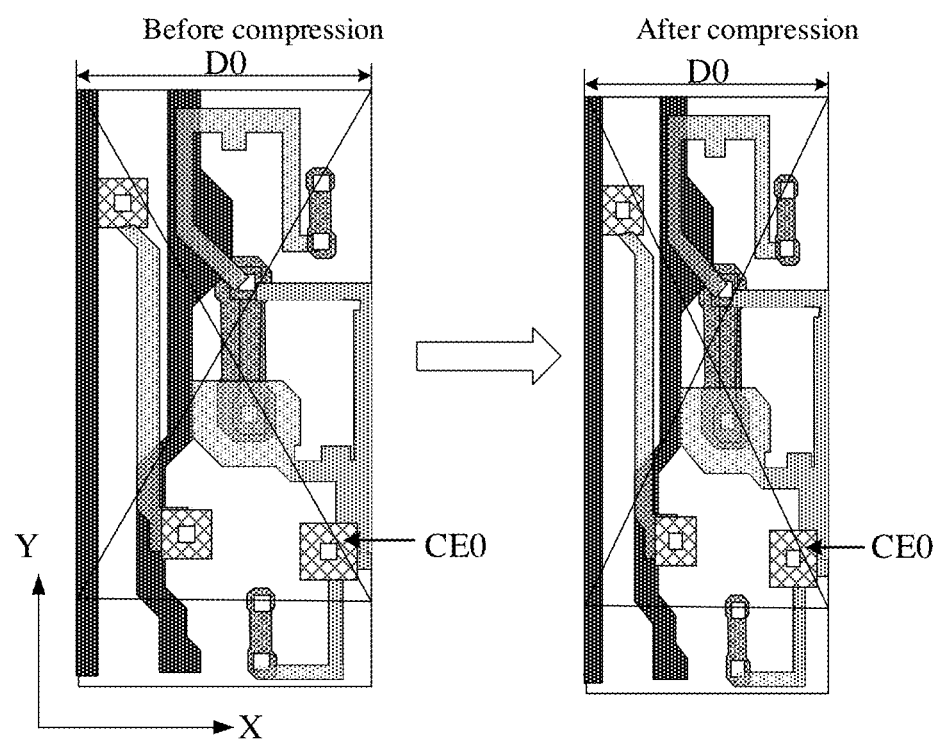
FIG. 15 is a schematic structural diagram of a display panel provided by an embodiment of the present disclosure.

For example, a width of each pixel circuit may be different from the width of the first-region light-emitting element 30 by about 4 μm. Taking compressed pixel circuits with a width difference of 4 μm as an example, FIG. 15 illustrates a structural layout of the pixel circuit before and after compression. Referring to FIG. 15, it may be seen that the pixel circuit may include a driving structure and a connecting element CE0 to be coupled to a first electrode (anode) of the light-emitting element; and a pitch of the connecting element CE0 may represent the pitch of the pixel circuit. The pitches of the pixel circuit and the light-emitting element before compression are both 1 μm to 100 μm in width and 2 μm to 100 μm in height. The pitch of the light-emitting element after compression may remain unchanged as compared with that before compression. For example, the pitch of the second-region light-emitting element 40 may be equal to or less than the pitch of the first-region light-emitting element 20. The compressed pixel circuit has the height unchanged, but the width reduced by 1 μm to 20 μm. In this way, there may be one or more extra columns of compressed pixel circuits every few columns of compressed pixel circuits; and the entire screen adopts such design to achieve full-screen compression. Among them, these extra columns may be selected to be connected with the second-region light-emitting element 40 in the second display region R2 to control the second-region light-emitting element 40 to emit light. In some embodiments, extra columns of pixel circuits close to the periphery of the second display region R2 are selected as the second-type pixel circuit 20 to be connected with the second-region light-emitting element 40. In this way, normal display may be implemented without changing resolution of the display panel. That is, the existing space of the display panel is fully utilized to implement normal display. The effect achieved by compressing the pitch of the pixel circuit is that: the number of light-emitting elements (including the first-region light-emitting elements 30 and the second light-emitting elements 40) remains unchanged, and further, there is no significant difference in display effect as compared with that before compression; and the display panel has a better display effect.

In the embodiments of the present disclosure, the elements located in the same layer can be formed by the same film layer through the same patterning process. For example, the elements located in the same layer may be located on the surface of the same element away from the base substrate.

It should be noted that, for the sake of clarity, in the drawings used to describe the embodiments of the present disclosure, the thickness of a layer or region is exaggerated. It can be understood that when an element such as a layer, film, region, or substrate is referred to as being "on" or "under" another element, the element can be "directly" "on" or "under" the other element, or there may be intermediate elements.

In the embodiments of the present disclosure, the patterning or patterning process may only include a photolithography process, or include a photolithography process and an etching process, or may include other processes for forming predetermined patterns such as printing process and inkjet process. The photolithography process refers to the process including film formation, exposure, development, etc., using photoresist, mask, exposure machine, etc. to form patterns. The corresponding patterning process can be selected according to the structure formed in the embodiment of the present disclosure.

In the case of no conflict, the features in the same embodiment and different embodiments of the present disclosure can be combined with each other.

The above are only specific embodiments of the present disclosure, but the protection scope of the present disclosure is not limited thereto. Any person skilled in the art can easily think of changes or substitutions within the technical scope disclosed in the present disclosure. It should be covered within the protection scope of the present disclosure. Therefore, the protection scope of the present disclosure should be subject to the protection scope of the claims.

What is claimed is:

1. A display panel, comprising:
a base substrate, having a first display region and a second display region, the first display region being located on at least one side of the second display region;
a plurality of light-emitting elements, located in the first display region and the second display region, the plurality of light-emitting elements comprising a plurality of groups of light-emitting elements, light-emitting elements in each group of the plurality of groups of light-emitting elements being arranged in a first direction, the plurality of groups of light-emitting elements being arranged in a second direction, at least one group of the plurality of groups of light-emitting elements comprising a plurality of first-region light-emitting elements and a plurality of second-region light-emitting elements, the plurality of first-region light-emitting elements being located in the first display region, and the plurality of second-region light-emitting elements being located in the second display region;
a plurality of pixel circuits, located in the first display region, the plurality of pixel circuits comprising a plurality of groups of pixel circuits, pixel circuits in each group of the plurality of groups of pixel circuits being arranged in the first direction, the plurality of groups of pixel circuits being arranged in the second direction, at least one group of the plurality of groups of pixel circuits comprising a plurality of first-type pixel circuits and a plurality of second-type pixel circuits, and the plurality of second-type pixel circuits being distributed at intervals among the plurality of first-type pixel circuits;
wherein at least one first-type pixel circuit among the plurality of first-type pixel circuits is connected with at least one first-region light-emitting element among the plurality of first-region light-emitting elements, an orthographic projection of the at least one first-type pixel circuit on the base substrate at least partially overlaps with an orthographic projection of the at least one first-region light-emitting element on the base substrate, and at least one second-type pixel circuit among the plurality of second-type pixel circuits is connected with at least one second-region light-emitting element among the plurality of second-region light-emitting elements through a conductive line, the plurality of second-region light-emitting elements comprise a plurality of first light-emitting elements and a plurality of second light-emitting elements, the first light-emitting element is configured to emit light of a first color, and the second light-emitting element is configured to emit light of a second color,
the plurality of second-type pixel circuits comprise a plurality of first pixel circuits and a plurality of second pixel circuits,
the conductive line comprises a plurality of first conductive lines and a plurality of second conductive lines, the plurality of first light-emitting elements are connected with the plurality of first pixel circuits through the plurality of first conductive lines, and the plurality of second light-emitting elements are connected with the plurality of second pixel circuits through the plurality of second conductive lines,
in the at least one group of light-emitting elements and the at least one group of pixel circuits, the plurality of first pixel circuits connected with the plurality of first light-emitting elements are closer to the second display region than each of the plurality of second pixel circuits connected with the plurality of second light-emitting elements.

2. The display panel according to claim 1, wherein, in the at least one group of light-emitting elements and the at least one group of pixel circuits, no other second-type pixel circuit is provided between two first pixel circuits connected with two adjacent first conductive lines.

3. The display panel according to claim 1, wherein one end of the conductive line is connected with the second-region light-emitting element, and the other end of the conductive line is connected with the second-type pixel circuit through a connecting element.

4. The display panel according to claim 1, wherein, in the at least one group of light-emitting elements and the at least one group of pixel circuits, at least one of the plurality of first-type pixel circuits is arranged between two adjacent second-type pixel circuits.

5. The display panel according to claim 4, wherein, in the at least one group of light-emitting elements and the at least one group of pixel circuits, the plurality of first pixel circuits connected with the plurality of first conductive lines are arranged at intervals among the plurality of first-type pixel circuits, and the plurality of second pixel circuits connected with the plurality of second conductive lines are arranged at intervals among the plurality of first-type pixel circuits.

6. The display panel according to claim 1, wherein an orthographic projection of a portion extending in the first direction of one first conductive line of the plurality of first conductive lines on the base substrate at least partially overlaps with an orthographic projection of a portion extending in the first direction of another first conductive line located in a different layer from the first conductive line on the base substrate, or an orthographic projection of a portion extending in the first direction of one first conductive line of the plurality of first conductive lines on the base substrate at least partially overlaps with an orthographic projection of a portion extending in the first direction of one fourth conductive line located in a different layer from the first conductive line on the base substrate.

7. The display panel according to claim 1, wherein the plurality of second-region light-emitting elements further comprise a plurality of third light-emitting elements, each of the plurality of third light-emitting elements is configured to emit light of a third color, the plurality of second-type pixel circuits further comprise a plurality of third pixel circuits, the conductive line further comprises a plurality of third conductive lines, and the plurality of third light-emitting elements are connected with the plurality of third pixel circuits through the plurality of third conductive lines, in the at least one group of light-emitting elements and the at least one group of pixel circuits, the plurality of first pixel circuits connected with the plurality of first conductive lines are closer to the second display region than each of the plurality of third pixel circuits connected with the plurality of third conductive lines.

8. The display panel according to claim 7, wherein, in the at least one group of light-emitting elements and the at least one group of pixel circuits, the plurality of second pixel circuits connected with the plurality of second conductive lines and the plurality of third pixel circuits connected with the plurality of third conductive lines are alternately arranged.

9. The display panel according to claim 7, wherein the plurality of second-region light-emitting elements further comprise a plurality of fourth light-emitting elements, each of the plurality of fourth light-emitting elements are configured to emit light of a fourth color, the plurality of second-type pixel circuits further comprise a plurality of fourth pixel circuits, the conductive line further comprises a plurality of fourth conductive lines, and the plurality of fourth light-emitting elements are connected with the plurality of fourth pixel circuits through the plurality of fourth conductive lines, in the at least one group of light-emitting elements and the at least one group of pixel circuits, the plurality of fourth pixel circuits connected with the plurality of fourth conductive lines are closer to the second display region than each of the plurality of second pixel circuits connected with the plurality of second conductive lines.

10. The display panel according to claim 9, wherein the plurality of fourth pixel circuits connected with the plurality of fourth conductive lines and the plurality of first pixel circuits connected with the plurality of first conductive lines are alternately arranged.

11. The display panel according to claim 9, wherein an orthographic projection of a portion extending in the first direction of one second conductive line of the plurality of second conductive lines on the base substrate at least partially overlaps with an orthographic projection of a portion extending in the first direction of one third conductive line of the plurality of third conductive lines located in a different layer from the second conductive line on the base substrate.

12. The display panel according to claim 9, wherein at least one group of the plurality of groups of light-emitting elements comprises a first sub-group of light-emitting elements, a second sub-group of light-emitting elements, and a third sub-group of light-emitting elements that are sequentially arranged in the first direction, at least one group of the plurality of groups of pixel circuits comprises a first sub-group of pixel circuits to a seventh sub-group of pixel circuits that are sequentially arranged in the first direction, and the seventh sub-group of pixel circuits is closer to the second display region than the first sub-group of pixel circuits;

the conductive lines connected with the first sub-group of light-emitting elements are located in a third pattern layer, the conductive lines connected with the second sub-group of light-emitting elements are located in a second pattern layer, the conductive lines connected with the third sub-group of light-emitting elements comprise the conductive line located in a first pattern layer and also comprises the conductive line formed in segments, and the conductive line formed in segments comprises a first conductive portion located in the first pattern layer and a second conductive portion located in the second pattern layer, the second light-emitting element and the third light-emitting element that are in the first sub-group of light-emitting elements are connected with the second sub-group of pixel circuits, the second light-emitting element and the third light-emitting element that are in the second sub-group of light-emitting elements are connected with the first sub-group of pixel circuits, the second light-emitting element and the third light-emitting element that are in the third sub-group of light-emitting elements and close to the second sub-group of light-emitting elements are connected with the fourth sub-group of pixel circuits, the second light-emitting element and the third light-emitting element that are in the third sub-group of light-emitting elements and away from the second sub-group of light-emitting elements are connected with the third sub-group of pixel circuits, the first light-emitting element and the fourth light-emitting element that are in the first sub-group of light-emitting elements are connected with the seventh sub-group of pixel circuits, the first light-emitting element and the fourth light-emitting element that are in the second sub-group of light-emitting elements are connected with the sixth sub-group of pixel circuits, and the first light-emitting element and the fourth light-emitting element that are in the third sub-group of light-emitting elements are connected with the fifth sub-group of pixel circuits.

13. The display panel according to claim 12, wherein an orthographic projection of a portion extending in the first direction of the second conductive line on the base substrate at least partially overlaps with an orthographic projection of a portion extending in the first direction of the third conductive line located in a different layer from the second conductive line on the base substrate.

14. The display panel according to claim 12, wherein a portion extending in the first direction of the conductive line connected with the second sub-group of light-emitting elements does not overlap with a portion extending in the first direction of other conductive line.

15. The display panel according to claim 12, wherein a portion extending in the first direction of the conductive line connected with the second sub-group of pixel circuits overlaps with a portion extending in the first direction of the conductive line connected with the fourth sub-group of pixel circuits, a portion extending in the first direction of the conductive line connected with the first sub-group of pixel circuits does not overlap with a portion extending in the first direction of the conductive line connected with the second sub-group of pixel circuits, and does not overlap with a portion extending in the first direction of the conductive line connected with the fourth sub-group of pixel circuits.

16. The display panel according to claim 1, wherein the plurality of second-region light-emitting elements are symmetrical with respect to the first symmetry axis and are symmetrical with respect to the second symmetry axis.

17. The display panel according to claim 1, wherein a size of the first-type pixel circuit in the first direction is less than a size of the first-region light-emitting element in the first direction.

18. The display panel according to claim 1, wherein the pixel circuit comprises a driving transistor and a reset transistor, the display panel further comprises a reset control signal line, a gate electrode of the reset transistor is connected with the reset control signal line, a first electrode of the reset transistor is connected with an initialization signal line, a second electrode of the reset transistor is connected with a first electrode of the light-emitting element, the initialization signal line is configured to supply a constant voltage, and the constant voltage is greater than or equal to −2 V.

19. A display device, comprising the display panel according to claim 1.

20. The display device according to claim 19, further comprising a photosensitive sensor, wherein the photosensitive sensor is located on a side of the display panel.

* * * * *

UNITED STATES PATENT AND TRADEMARK OFFICE
CERTIFICATE OF CORRECTION

PATENT NO. : 11,847,964 B2  
APPLICATION NO. : 17/789007  
DATED : December 19, 2023  
INVENTOR(S) : Yao Huang et al.

Page 1 of 1

It is certified that error appears in the above-identified patent and that said Letters Patent is hereby corrected as shown below:

On the Title Page

Item (73), Assignee, Line 1:  
Delete "CHENGDU 03;BOE OPTOELECTRONICS TECHNOLOGY CO.,LTD.," and insert  
-- CHENGDU BOE OPTOELECTRONICS TECHNOLOGY CO., LTD., --, therefor.

Signed and Sealed this  
Fifth Day of March, 2024

Katherine Kelly Vidal  
*Director of the United States Patent and Trademark Office*